United States Patent
Yamazaki et al.

(10) Patent No.: US 9,831,326 B2
(45) Date of Patent: *Nov. 28, 2017

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Tetsuhiro Tanaka, Kanagawa (JP); Masayuki Sakakura, Kanagawa (JP); Ryo Tokumaru, Kanagawa (JP); Yasumasa Yamane, Kanagawa (JP); Yuhei Sato, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/350,213

(22) Filed: Nov. 14, 2016

(65) Prior Publication Data

US 2017/0125553 A1    May 4, 2017

Related U.S. Application Data

(63) Continuation of application No. 14/719,431, filed on May 22, 2015, now Pat. No. 9,496,411.

(30) Foreign Application Priority Data

May 23, 2014 (JP) .................................. 2014-107570

(51) Int. Cl.
*H01L 21/02* (2006.01)
*H01L 21/441* (2006.01)
(Continued)

(52) U.S. Cl.
CPC .. *H01L 29/66969* (2013.01); *H01L 21/02255* (2013.01); *H01L 21/02565* (2013.01);
(Continued)

(58) Field of Classification Search
CPC ............... H01L 21/8258; H01L 29/401; H01L 29/7869; H01L 29/78696
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 102782859 A | 11/2012 |
| CN | 103681805 A | 3/2014 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Raj R Gupta
(74) *Attorney, Agent, or Firm* — Fish & Richardson P.C.

(57) ABSTRACT

A method for manufacturing a semiconductor device includes the steps of forming a first insulating film over a first gate electrode over a substrate while heated at a temperature higher than or equal to 450° C. and lower than the strain point of the substrate, forming a first oxide semiconductor film over the first insulating film, adding oxygen to the first oxide semiconductor film and then forming a second oxide semiconductor film over the first oxide semiconductor film, and performing heat treatment so (Continued)

that part of oxygen contained in the first oxide semiconductor film is transferred to the second oxide semiconductor film.

19 Claims, 51 Drawing Sheets

(51) Int. Cl.
    *H01L 21/465*     (2006.01)
    *H01L 21/477*     (2006.01)
    *H01L 29/786*     (2006.01)
    *H01L 29/66*     (2006.01)

(52) U.S. Cl.
    CPC .......... *H01L 21/441* (2013.01); *H01L 21/465* (2013.01); *H01L 21/477* (2013.01); *H01L 29/7869* (2013.01); *H01L 29/78648* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,129,717 B2 | 3/2012 | Yamazaki et al. |
| 8,129,719 B2 | 3/2012 | Yamazaki et al. |
| 8,395,148 B2 | 3/2013 | Yamazaki et al. |
| 8,518,755 B2 | 8/2013 | Yamazaki et al. |
| 8,530,285 B2 | 9/2013 | Yamazaki et al. |
| 8,569,753 B2 | 10/2013 | Isobe et al. |
| 8,890,152 B2 | 11/2014 | Yamazaki et al. |
| 9,496,411 B2 * | 11/2016 | Yamazaki ........... H01L 21/8258 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0212570 A1 | 9/2011 | Yamazaki et al. |
| 2011/0215331 A1 | 9/2011 | Yamazaki et al. |
| 2012/0032172 A1 | 2/2012 | Noda et al. |
| 2012/0043198 A1 * | 2/2012 | Yamazaki ............ C23C 14/086 204/192.1 |
| 2012/0319114 A1 | 12/2012 | Yamazaki et al. |
| 2013/0153889 A1 | 6/2013 | Yamazaki et al. |
| 2014/0008647 A1 | 1/2014 | Yamazaki |
| 2014/0042433 A1 | 2/2014 | Yamazaki |
| 2014/0077205 A1 | 3/2014 | Yamazaki et al. |
| 2014/0106504 A1 | 4/2014 | Yamazaki et al. |
| 2014/0113405 A1 | 4/2014 | Tsubuku et al. |
| 2014/0131696 A1 | 5/2014 | Ono et al. |
| 2015/0179774 A1 * | 6/2015 | Yamazaki ......... H01L 29/66969 438/104 |
| 2015/0179810 A1 | 6/2015 | Yamazaki et al. |

FOREIGN PATENT DOCUMENTS

| | | |
|---|---|---|
| CN | 103688364 A | 3/2014 |
| CN | 104584229 A | 4/2015 |
| DE | 102013217808 | 3/2014 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-199273 A | 10/2011 |
| JP | 4982620 | 7/2012 |
| JP | 2013-030682 A | 2/2013 |
| JP | 2014-030012 A | 2/2014 |
| JP | 2014-057051 A | 3/2014 |
| JP | 2014-075580 A | 4/2014 |
| JP | 2015-135953 A | 7/2015 |
| KR | 2013-0025871 A | 3/2013 |
| KR | 2014-0035822 A | 3/2014 |
| KR | 2014-0041795 A | 4/2014 |
| TW | 201203380 | 1/2012 |
| TW | 201306136 | 2/2013 |
| TW | 201411848 | 3/2014 |
| TW | 201417289 | 5/2014 |
| WO | WO-2004/114391 | 12/2004 |
| WO | WO-2011/105268 | 9/2011 |
| WO | WO-2013/018448 | 2/2013 |
| WO | WO-2014/025002 | 2/2014 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn -Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID DIgest '04 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe; Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 0, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2015/053510) dated Aug. 4, 2015.

Written Opinion (Application No. PCT/IB2015/053510) dated Aug. 4, 2015.

\* cited by examiner

100a

100b

100c

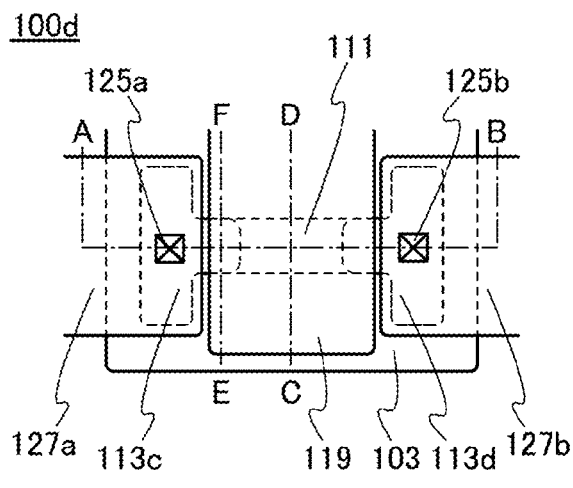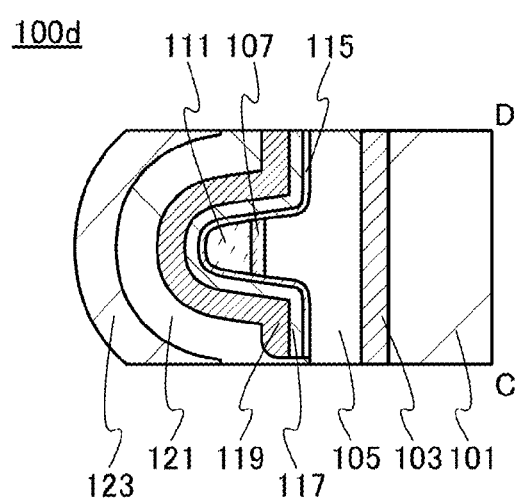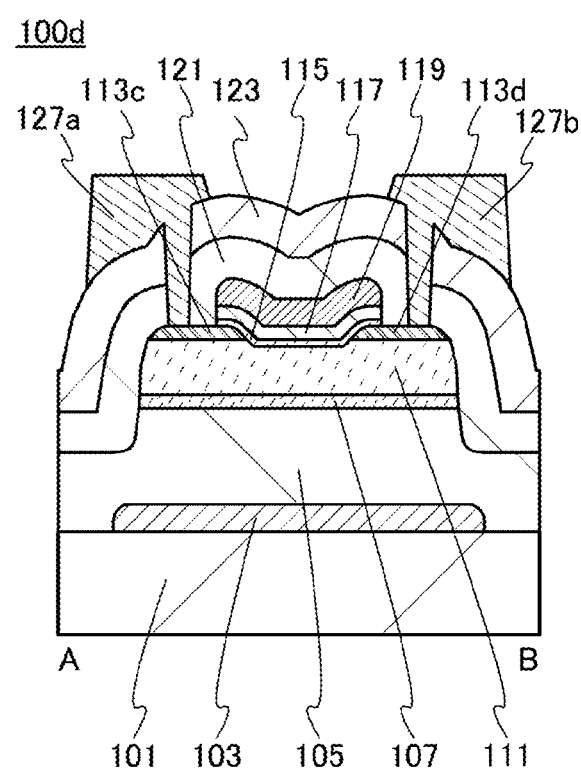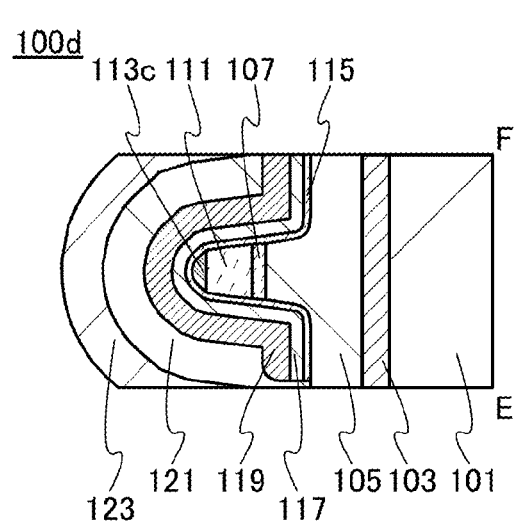

|  | charge : +1 | charge:neutral | charge : −1 |
|---|---|---|---|
| d(N-O) [Å] | 1.109(1.154) | 1.178(1.197) | 1.241(1.236) |
| ∠O-N-O [°] | 178.81(180) | 133.65(134) | 110.34(115) |

※ ( ) is the reference value of $NO_2$ molecule in a gaseous state.

※ ( ) is the reference value of NO₂ molecule in a gaseous state.

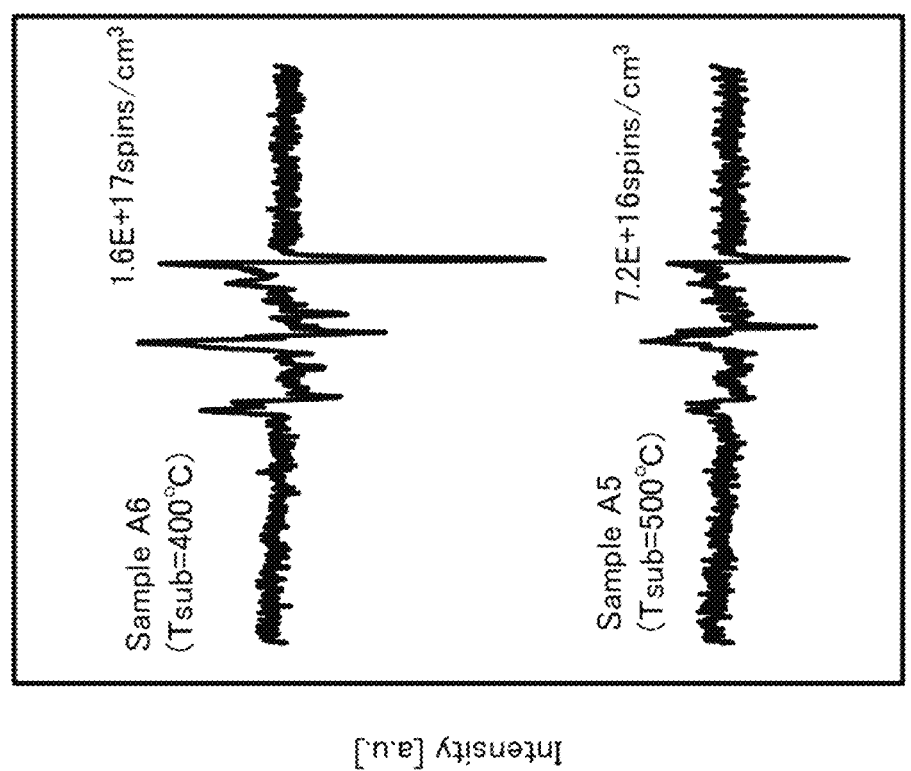
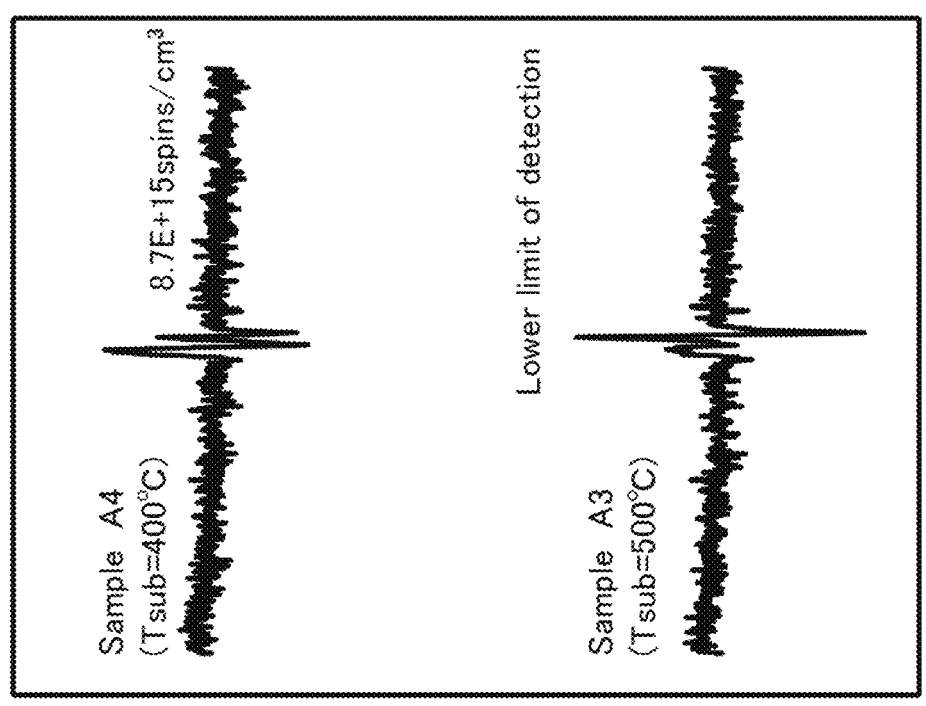

FIG. 40

| | Sample C1 |
|---|---|
| 119 | TaN\W=30nm\135nm |
| 117 | PECVD-SiON 200Pa Tsub.=350°C (20nm) |
| 115 | IGZO(132)=5nm O2=33%, Tsub=200°C |
| 113a, 113b | W=100nm |
| Heat treatment | 450°C N2 1hr. → 450°C O2 1hr. |
| 109 | IGZO(111)=20nm |
| Addition of oxygen 108 | $^{16}O^+$ 5kV 1E16ions/cm$^2$ |
| 106 | IGZO(134)=40nm |
| 104 | SiON=100nm 40Pa Tsub=500°C |
| 103 | W=50nm |
| 101 and insulator | Si_wafer\SiOx 400nm |
| +GBT<br>L/W=0.82/0.8 μm<br>Vg=+3.3V, Vd=0V,<br>Vs=0V, Vbg=0V<br>150°C 1hr | (Id-Vg and μFE-Vg curves at Vd=0.1V and Vd=1.8V) |
| −GBT<br>L/W=0.82/0.8 μm<br>Vg=−1.8V, Vd=0V,<br>Vs=0V, Vbg=0V<br>150°C 1hr | (Id-Vg and μFE-Vg curves at Vd=0.1V and Vd=1.8V) |

FIG. 41

| | Sample C2 |
|---|---|
| 119 | TaN\W=30nm\135nm |
| 117 | PECVD-SiON 200Pa Tsub.=350°C (20nm) |
| 115 | IGZO(132)=5nm O2=33%, Tsub=200°C |
| 113a、113b | W=100nm |
| heat treatment | 550°C N2 1hr.→ 550°C O2 1hr. |
| 109 | IGZO(111)=20nm |
| Addition of oxygen 108 | $^{16}O^+$ 5kV 1E16ions/cm$^2$ |
| 106 | IGZO(134)=40nm |
| 104 | SiON=100nm 40Pa Tsub=500°C |
| 103 | W=50nm |
| 101and insulator | Si_wafer\SiOx 400nm |
| +GBT L/W=0.82/0.8 μm Vg=+3.3V, Vd=0V, Vs=0V, Vbg=0V 150°C 1hr | (Id [A] and μFE [cm²/Vs] vs Vg [V] plot, Vd=0.1V, Vd=1.8V) |
| −GBT L/W=0.82/0.8 μm Vg=−1.8V, Vd=0V, Vs=0V, Vbg=0V 150°C 1hr | (Id [A] and μFE [cm²/Vs] vs Vg [V] plot, Vd=0.1V, Vd=1.8V) |

FIG. 48A
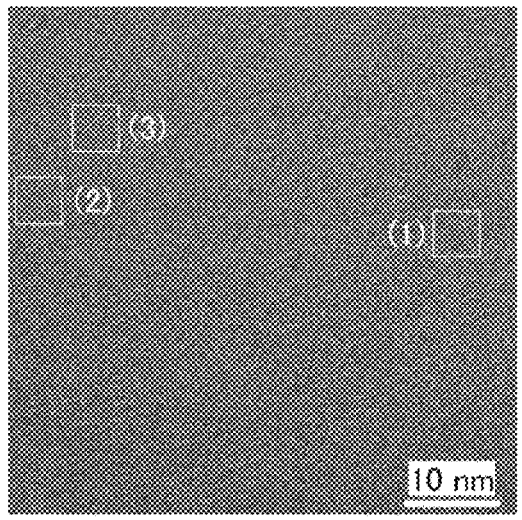
FIG. 48B  FIG. 48C  FIG. 48D
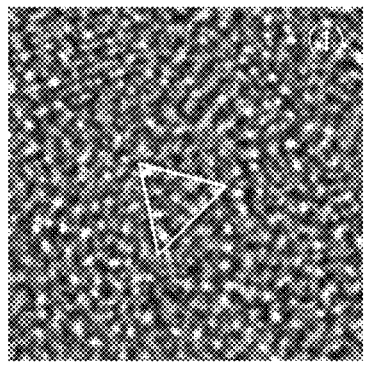 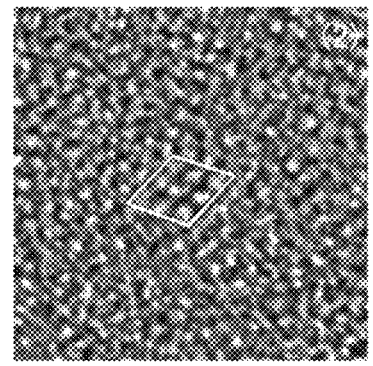 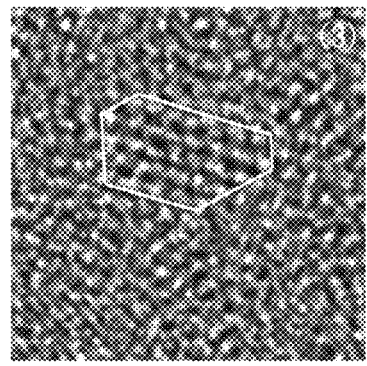

FIG. 50A
FIG. 50B
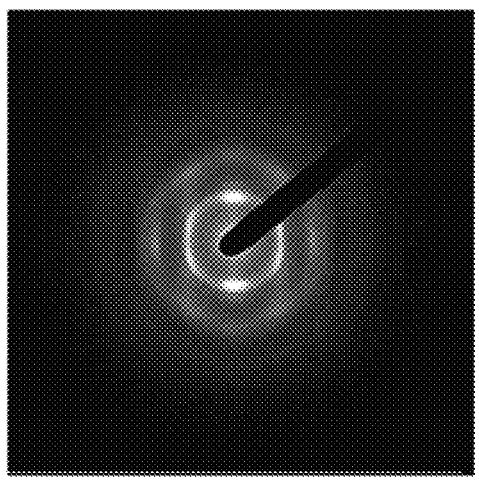
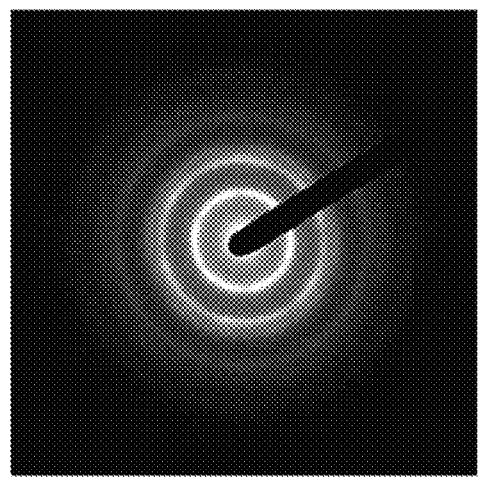

MANUFACTURING METHOD OF SEMICONDUCTOR DEVICE

CROSS-REFERENCE TO RELATED APPLICATIONS

This application is a continuation of U.S. application Ser. No. 14/719,431, filed Dec. May 22, 2015, now allowed, which claims the benefit of a foreign priority application filed in Japan as Serial No. 2014-107570 on May 23, 2014, both of which are incorporated by reference.

TECHNICAL FIELD

The present invention relates to an object, a process (including a method and a manufacturing method), a machine, a manufacture, or a composition of matter. In particular, one embodiment of the present invention relates to a semiconductor device, a display device, a light-emitting device, a driving method thereof, a manufacturing method thereof, or the like. In particular, one embodiment of the present invention relates to a semiconductor device, a display device, a memory device, a light-emitting device, or the like including an oxide semiconductor.

In this specification, the category of semiconductor devices includes all devices that can function by utilizing electronic characteristics of a semiconductor; for example, a semiconductor circuit is included in the category of semiconductor devices. Moreover, an electro-optic device, a display device, an electric appliance, or the like includes a semiconductor device in some cases.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. The transistors formed using such silicon semiconductors are also used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, disclosed is a technique in which a transistor is manufactured using zinc oxide or an In—Ga—Zn oxide as an oxide semiconductor and the transistor is used as a switching element or the like of a pixel of a display device (see Patent Documents 1 and 2).

REFERENCES

Patent Documents

[Patent Document 1] Japanese Published Patent Application No. 2007-123861
[Patent Document 2] Japanese Published Patent Application No. 2007-096055

DISCLOSURE OF INVENTION

In a transistor using an oxide semiconductor, oxygen vacancies, which may cause localized states in an oxide semiconductor film, lead to poor electrical characteristics of the transistor.

In view of this, an object of one embodiment of the present invention is to improve the electrical characteristics of a semiconductor device using an oxide semiconductor. Another object of one embodiment of the present invention is to improve the reliability of a semiconductor device using an oxide semiconductor. Another object of one embodiment of the present invention is to reduce oxygen vacancies in an oxide semiconductor. Another object of one embodiment of the present invention is to prevent a transistor from becoming normally-on. Another object of one embodiment of the present invention is to control change, variation, or decrease in the threshold voltage of a transistor. Another object of one embodiment of the present invention is to provide a transistor having a low off-state current. Another object of one embodiment of the present invention is to provide a novel semiconductor device or the like.

Note that the description of these objects does not disturb the existence of other objects. Note that there is no need to achieve all of these objects in one embodiment of the present invention. Other objects will be apparent from and can be derived from the description of the specification, the drawings, the claims, and the like.

One embodiment of the present invention is a transistor including a first oxide semiconductor film, a second oxide semiconductor film, a pair of electrodes in contact with the second oxide semiconductor film, and a third oxide semiconductor film in contact with the second oxide semiconductor film and the pair of electrodes, in which oxygen is added to the first oxide semiconductor film or the third oxide semiconductor film to reduce oxygen vacancies. Further, the oxygen is diffused into the second oxide semiconductor film by heat treatment or the like, so that oxygen vacancies in the second oxide semiconductor film are reduced.

One embodiment of the present invention is a method for manufacturing a semiconductor device including the following steps. A first insulating film is formed over a first gate electrode over a substrate while heated at a temperature higher than or equal to 450° C. and lower than the strain point of the substrate. A first oxide semiconductor film is formed over the first insulating film. After oxygen is added to the first oxide semiconductor film, a second oxide semiconductor film is formed over the first oxide semiconductor film. First heat treatment is performed so that part of oxygen contained in the first oxide semiconductor film is transferred to the second oxide semiconductor film. Next, part of the first insulating film, part of the first oxide semiconductor film to which oxygen has been added, and part of the second oxide semiconductor film are etched to form a first gate insulating film having a projection, the etched first oxide semiconductor film, and the etched second oxide semiconductor film. Then, a pair of electrodes is formed over the etched second oxide semiconductor film, and a third oxide semiconductor film is formed over the etched second oxide semiconductor film and the pair of electrodes. Next, a second gate insulating film is formed over the third oxide semiconductor film, and a second gate electrode is formed over the second gate insulating film.

One embodiment of the present invention is a method for manufacturing a semiconductor device including the following steps. A first insulating film is formed over a first gate electrode over a substrate while heated at a temperature higher than or equal to 450° C. and lower than the strain point of the substrate. A first oxide semiconductor film is formed over the first insulating film, and a second oxide semiconductor film is formed over the first oxide semiconductor film. Then, part of the first insulating film, part of the first oxide semiconductor film, and part of the second oxide semiconductor film are etched to form a first gate insulating film having a projection, the etched first oxide semiconductor film, and the etched second oxide semiconductor film. Next, a pair of electrodes is formed over the etched second oxide semiconductor film, and a third oxide semiconductor film is formed over the etched second oxide semiconductor film and the pair of electrodes. After oxygen is added to the third oxide semiconductor film, first heat treatment is performed so that part of oxygen contained in the third oxide semiconductor film is transferred to the etched second oxide semiconductor film. Then, a second gate insulating film is formed over the third oxide semiconductor film to which oxygen has been added, and a second gate electrode is formed over the second gate insulating film.

The temperature of the first heat treatment is preferably lower than a temperature at which the first insulating film is formed.

Note that by adding oxygen to the first oxide semiconductor film and/or the third oxide semiconductor film and then performing heat treatment, oxygen vacancies in the first oxide semiconductor film and/or the third oxide semiconductor film can be reduced.

Note that the second oxide semiconductor film is an oxide semiconductor film containing In or Ga and is typically an In—Ga oxide film, an In—Zn oxide film, an In—Mg oxide film, a Zn—Mg oxide film, or an In-M-Zn oxide film (M is Al, Ti, Ga, Y, Zr, Sn, La, Ce, Mg, or Nd). Note that the element M is a metal element whose strength of bonding with oxygen is higher than that of In.

The first oxide semiconductor film and the third oxide semiconductor film are typically each an In—Ga oxide film, an In—Zn oxide film, an In—Mg oxide film, a Zn—Mg oxide film, or an In-M-Zn oxide film (M is Al, Ti, Ga, Y, Zr, Sn, La, Ce, Mg, or Nd), and has the energy level at the conduction band minimum that is closer to a vacuum level than that of the second oxide semiconductor film is. Typically, a difference between the energy level at the conduction band minimum of the second oxide semiconductor film and the energy level at the conduction band minimum of each of the first and third oxide semiconductor films is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the difference between the vacuum level and the energy at the conduction band minimum is referred to as electron affinity.

In the case where the first and third oxide semiconductor films and the second oxide semiconductor film are each an In-M-Zn oxide film (M is Al, Ti, Ga, Y, Zr, Sn, La, Ce, Mg, or Nd), the proportion of M atoms (M is Al, Ti, Ga, Y, Zr, Sn, La, Ce, Mg, or Nd) in each of the first and third oxide semiconductor films is higher than that in the second oxide semiconductor film. Typically, the proportion of M in each of the first and third oxide semiconductor films is higher than or equal to 1.5 times, preferably higher than or equal to twice, further preferably higher than or equal to three times as high as that in the second oxide semiconductor film.

As a method for adding oxygen to the first oxide semiconductor film or the third oxide semiconductor film, an ion implantation method, an ion doping method, plasma treatment, or the like can be used. The oxygen added to the first oxide semiconductor film or the third oxide semiconductor film is at least one kind selected from oxygen radicals, oxygen atoms, oxygen atomic ions, oxygen molecular ions, and the like.

According to one embodiment of the present invention, the electrical characteristics of a semiconductor device using an oxide semiconductor can be improved. According to one embodiment of the present invention, the reliability of a semiconductor device using an oxide semiconductor can be improved. Furthermore, according to one embodiment of the present invention, a novel semiconductor device or the like can be provided. Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

In the accompanying drawings:

FIGS. 7A to 7D are a top view and cross-sectional views illustrating one embodiment of a semiconductor device;

FIGS. 36A and 36B show the results of ESR measurement;

FIG. 40 shows the measurement results of the $V_g$-$I_d$ characteristics of a transistor;

FIG. 41 shows the measurement results of the $V_g$-$I_d$ characteristics of a transistor;

FIGS. 48A to 48D are Cs-corrected high-resolution TEM images of a plane of a CAAC-OS;

FIGS. 50A and 50B show electron diffraction patterns of a CAAC-OS; and

BEST MODE FOR CARRYING OUT THE INVENTION

Figure 1A:
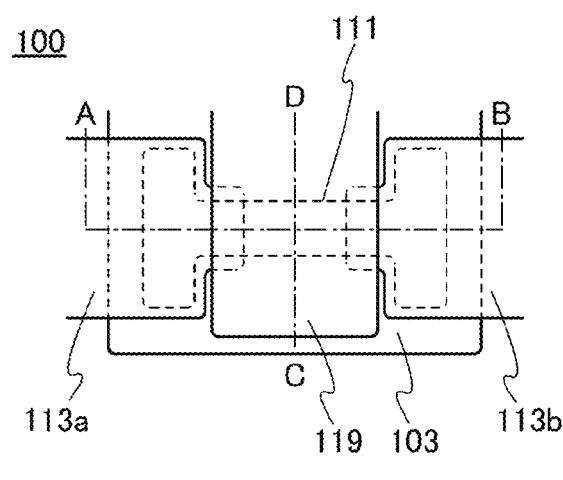
FIGS. 1A to 1C are a top view and cross-sectional views illustrating one embodiment of a semiconductor device.

Embodiments of the present invention will be described below in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

The functions of "source" and "drain" may be switched in the case where, for example, the direction of a current flow is changed during circuit operation. Therefore, the terms "source" and "drain" can be used to denote the drain and the source, respectively, in this specification.

The term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

A voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

A transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the channel length refers to, for example, the distance between a source (a source region or a source electrode) and a drain (a drain region or a drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where an oxide semiconductor film (or a portion where a current flows in an oxide semiconductor film when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of an oxide semiconductor film is known. Therefore, in the case where the shape of an oxide semiconductor film is not known accurately, it is difficult to measure an effective channel width accurately.

Thus, in this specification, an apparent channel width, which is the length of a portion where a source and a drain face each other in a region where an oxide semiconductor film and a gate electrode overlap with each other in a top view of a transistor, is referred to as a "surrounded channel width (SCW)" in some cases. Further, in this specification, in the case where the term "channel width" is simply used, it may denote a surrounded channel width or an apparent channel width. Alternatively, in this specification, in the case where the term "channel width" is simply used, it denotes an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the electric field mobility, the current value per channel width, and the like of a transistor are obtained by calculation, a surrounded channel width may be used for the calculation. The value obtained in that case is sometimes different from the one obtained from the calculation using an effective channel width.

Embodiment 1

The threshold voltage of a transistor using an oxide semiconductor film including oxygen vacancies easily shifts in the negative direction, and such a transistor tends to be normally-on. This is because electric charges are generated owing to oxygen vacancies in the oxide semiconductor film, and the resistance is reduced. In addition, a transistor using an oxide semiconductor film including oxygen vacancies has such a problem that the electrical characteristics, typically, the threshold voltage, are changed with time or changed by a stress test (typically, a gate bias-temperature (BT) stress test under light irradiation). In this embodiment, a highly reliable semiconductor device with a small change in threshold voltage and a manufacturing method thereof will be described. Further, a semiconductor device with excellent electrical characteristics and a manufacturing method thereof will be described.

<Structure Example of Semiconductor Device>

In this embodiment, a method for manufacturing a top-gate transistor is described.

Figure 1C:
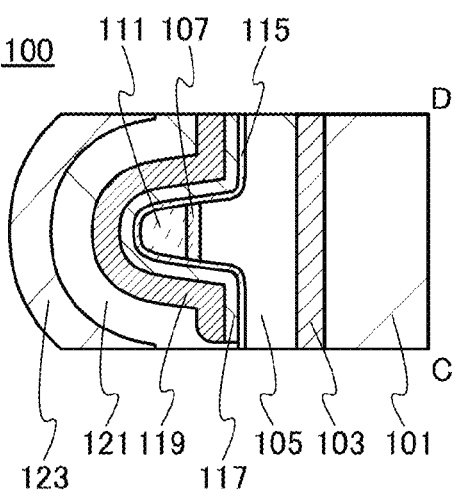
Figure 1B:
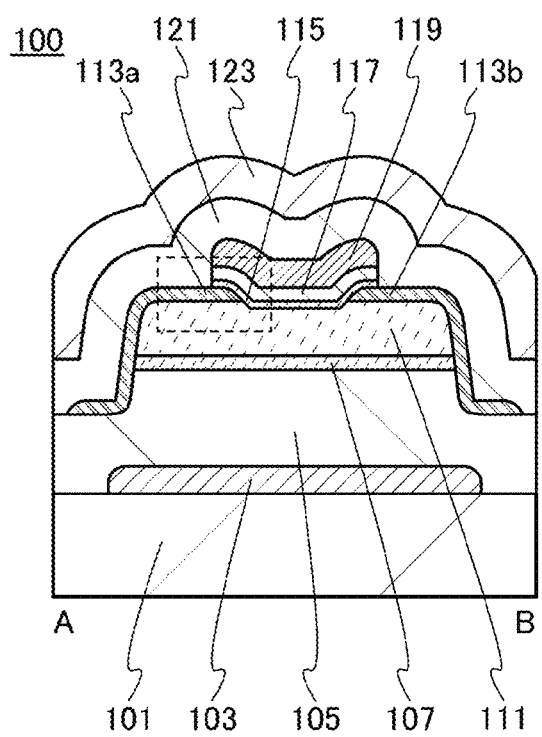

FIGS. 1A to 1C are a top view and cross-sectional views of a transistor 100 of a semiconductor device. FIG. 1A is a top view of the transistor 100, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 101, a gate insulating film 105, an oxide semiconductor film 107, an oxide semiconductor film 115, a gate insulating film 117, an insulating film 121, an insulating film 123, and the like are not illustrated for simplicity.

FIG. 1B is a cross-sectional view in the channel length direction of the transistor 100 and FIG. 1C is a cross-sectional view in the channel width direction of the transistor 100.

The transistor 100 illustrated in FIGS. 1A to 1C is provided over the substrate 101. The transistor 100 includes a gate electrode 103 over the substrate 101, the gate insulating film 105 over the substrate 101 and the gate electrode 103, the oxide semiconductor film 107 in contact with the gate insulating film 105, an oxide semiconductor film 111 in contact with the oxide semiconductor film 107, a pair of electrodes 113a and 113b in contact with at least a top surface and a side surface of the oxide semiconductor film 111 and a side surface of the oxide semiconductor film 107, the oxide semiconductor film 115 in contact with the oxide semiconductor film 111 and the pair of electrodes 113a and 113b, the gate insulating film 117 overlapping with the oxide semiconductor film 111 with the oxide semiconductor film 115 positioned therebetween, and a gate electrode 119 being in contact with the gate insulating film 117 and overlapping with the oxide semiconductor film 111 with the oxide semiconductor film 115 and the gate insulating film 117 positioned therebetween. Furthermore, the transistor 100 may include the insulating film 121 that covers the pair of electrodes 113a and 113b, the oxide semiconductor film 115, the gate insulating film 117, and the gate electrode 119 and the insulating film 123 that covers the insulating film 121.

Note that at least part (or the whole) of the electrode 113a (and/or the electrode 113b) is provided on at least part (or the whole) of a surface, a side surface, a top surface, and/or a bottom surface of a semiconductor film such as the oxide semiconductor film 107 (and/or the oxide semiconductor film 111).

Alternatively, at least part (or the whole) of the electrode 113a (and/or the electrode 113b) is in contact with at least part (or the whole) of a surface, a side surface, a top surface, and/or a bottom surface of a semiconductor film such as the oxide semiconductor film 107 (and/or the oxide semiconductor film 111). Alternatively, at least part (or the whole) of the electrode 113a (and/or the electrode 113b) is in contact with at least part (or the whole) of a semiconductor film such as the oxide semiconductor film 107 (and/or the oxide semiconductor film 111).

Alternatively, at least part (or the whole) of the electrode 113a (and/or the electrode 113b) is electrically connected to at least part (or the whole) of a surface, a side surface, a top surface, and/or a bottom surface of a semiconductor film such as the oxide semiconductor film 107 (and/or the oxide semiconductor film 111). Alternatively, at least part (or the whole) of the electrode 113a (and/or the electrode 113b) is electrically connected to part (or the whole) of a semiconductor film such as the oxide semiconductor film 107 (and/or the oxide semiconductor film 111).

Alternatively, at least part (or the whole) of the electrode 113a (and/or the electrode 113b) is positioned close to at least part (or the whole) of a surface, a side surface, a top surface, and/or a bottom surface of a semiconductor film such as the oxide semiconductor film 107 (and/or the oxide semiconductor film 111). Alternatively, at least part (or the whole) of the electrode 113a (and/or the electrode 113b) is positioned close to part (or the whole) of a semiconductor film such as the oxide semiconductor film 107 (and/or the oxide semiconductor film 111).

Alternatively, at least part (or the whole) of the electrode 113a (and/or the electrode 113b) is positioned beside at least part (or the whole) of a surface, a side surface, a top surface, and/or a bottom surface of a semiconductor film such as the oxide semiconductor film 107 (and/or the oxide semiconductor film 111). Alternatively, at least part (or the whole) of the electrode 113a (and/or the electrode 113b) is positioned beside part (or the whole) of a semiconductor film such as the oxide semiconductor film 107 (and/or the oxide semiconductor film 111).

Alternatively, at least part (or the whole) of the electrode 113a (and/or the electrode 113b) is positioned diagonally above at least part (or the whole) of a surface, a side surface, a top surface, and/or a bottom surface of a semiconductor film such as the oxide semiconductor film 107 (and/or the oxide semiconductor film 111). Alternatively, at least part (or the whole) of the electrode 113a (and/or the electrode 113b) is positioned diagonally above part (or the whole) of a semiconductor film such as the oxide semiconductor film 107 (and/or the oxide semiconductor film 111).

Alternatively, at least part (or the whole) of the electrode 113a (and/or the electrode 113b) is positioned above at least part (or the whole) of a surface, a side surface, a top surface, and/or a bottom surface of a semiconductor film such as the oxide semiconductor film 107 (and/or the oxide semiconductor film 111). Alternatively, at least part (or the whole) of the electrode 113a (and/or the electrode 113b) is positioned above part (or the whole) of a semiconductor film such as the oxide semiconductor film 107 (and/or the oxide semiconductor film 111).

The transistor 100 includes two gate electrodes. One of them has a function of controlling the on/off state of the transistor 100. The other has a function of controlling the threshold voltage of the transistor 100. When a voltage that makes the threshold voltage of the transistor 100 positive is applied to one of the gate electrodes, the transistor 100 can have normally-off characteristics.

The gate insulating film 105 included in the transistor 100 has a projection. The oxide semiconductor films 107 and 111 are formed in this order over the projection. Hence, in the channel width direction, the gate electrode 119 faces side surfaces of the oxide semiconductor films 107 and 111 with the gate insulating film 117 positioned therebetween as illustrated in FIG. 1C. In other words, when a voltage is applied to the gate electrode 119, the oxide semiconductor films 107 and 111 are surrounded by the electric field of the gate electrode 119 in the channel width direction. The transistor structure in which an oxide semiconductor film is surrounded by the electric field of the gate electrode 119 is referred to as a surrounded channel (s-channel) structure. In the transistor with the s-channel structure, a channel is formed in the whole oxide semiconductor film 111 (bulk) in the on state, increasing the on-state current. In the off state, the entire region of the channel region formed in the oxide semiconductor film 111 is depleted, which allows the off-state current to be further reduced.

Components of the transistor 100 are described below.

Although there is no particular limitation on a material and the like of the substrate 101, it is necessary that the substrate have heat resistance high enough to withstand at least heat treatment performed later. For example, a glass substrate, a ceramic substrate, a quartz substrate, a sapphire substrate, or the like may be used as the substrate 101. Alternatively, a single crystal semiconductor substrate or a polycrystalline semiconductor substrate made of silicon, silicon carbide, or the like, a compound semiconductor substrate made of silicon germanium or the like, a silicon on insulator (SOI) substrate, or the like may be used as the substrate 101. Furthermore, any of these substrates provided with a semiconductor element may be used as the substrate 101. Alternatively, gallium arsenide, aluminum gallium arsenide, indium gallium arsenide, gallium nitride, indium phosphide, silicon germanium, or the like which can be employed for a high-electron-mobility transistor (HEMT) may be used as the material of the substrate 101. By using any of these semiconductors for the substrate 101, the transistor 100 suited to high speed operation can be fabricated. The substrate 101 is not limited to a simple supporting substrate, and may be a substrate where a device such as a transistor is formed. In this case, at least one of the gate electrode, the source electrode, and the drain electrode of the transistor 100 may be electrically connected to the device.

Note that a flexible substrate may also be used as the substrate 101. In the case where a flexible substrate is used, a semiconductor element such as a transistor or a capacitor may be directly formed over the flexible substrate, or the semiconductor element may be formed over a manufacturing substrate and then separated and transferred onto the flexible substrate. To perform separation and transfer of the semiconductor element from the manufacturing substrate to the flexible substrate, a separation layer may be provided between the manufacturing substrate and the semiconductor element.

The gate electrode 103 has a function of controlling the threshold voltage of the transistor 100. The gate electrode 103 can be formed using a metal element selected from aluminum, chromium, copper, tantalum, titanium, molybdenum, manganese, and tungsten; an alloy containing any of these metal elements as a component; an alloy containing any of these metal elements in combination; or the like. Furthermore, one or more metal elements selected from manganese and zirconium may be used. Moreover, the gate electrode 103 may have a single-layer structure or a stacked structure of two or more layers. For example, the gate electrode 103 can have a single-layer structure of an aluminum film containing silicon, a single-layer structure of a copper film containing manganese, a two-layer structure in which a titanium film is stacked over an aluminum film, a two-layer structure in which a copper film is stacked over a copper-magnesium alloy film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or a three-layer structure in which a copper-magnesium alloy film, a copper film, and a copper-magnesium alloy film are stacked in this order. Alternatively, an alloy film or a nitride film which contains aluminum and one or more elements selected from titanium, tantalum, tungsten, molybdenum, chromium, neodymium, and scandium may be used.

The gate electrode 103 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode 103 can have a stacked structure formed using the above-described light-transmitting conductive material and the above-described metal element.

Note that it is preferable that element(s) included in the gate electrode 103 be not diffused into the gate insulating film 105. For example, when an alloy film that contains one or more elements selected from tungsten, tantalum, molybdenum, copper, titanium, and aluminum, an alloy film to which a small amount of element is added, or the like is used as the gate electrode 103, it is hard for the element(s) included in the gate electrode 103 to be diffused into the gate insulating film 105.

As the gate electrode 103, an In—Ga—Zn oxynitride film, an In—Sn oxynitride film, an In—Ga oxynitride film, an In—Zn oxynitride film, a metal oxynitride film (e.g., SnON, InON), a metal nitride film (e.g., InN, ZnN), or the like may be provided. For example, in the case of using an In—Ga—Zn oxynitride film, an In—Ga—Zn oxynitride film whose nitrogen concentration is higher than at least the nitrogen concentration of the oxide semiconductor film 111, specifically, an In—Ga—Zn oxynitride film whose nitrogen concentration is higher than or equal to 7 at. % is used. In the case where the gate electrode 103 is formed using any of the above-described metal oxynitride films or the metal nitride films, it is preferable to provide a protective film that prevents diffusion of metal, oxygen, or nitrogen over the gate electrode 103. Examples of the protective film are an alloy film containing one or more elements selected from tungsten, tantalum, molybdenum, copper, titanium, and aluminum, and an alloy film to which a small amount of element is added.

The gate insulating film 105 has a function of a base film of the oxide semiconductor film 107. As the gate insulating film 105, a single layer or a stacked layer of, for example, a silicon oxide film, a silicon oxynitride film, a silicon nitride oxide film, a silicon nitride film, an aluminum oxide film, a hafnium oxide film, a gallium oxide film, or a Ga—Zn metal oxide film can be provided. The gate insulating film 105 preferably includes a small number of defects or impurities in order to reduce a shift in the electrical characteristics of the transistor such as the threshold voltage.

It is possible to prevent outward diffusion of oxygen from the oxide semiconductor film 107 and entry of hydrogen, water, or the like into the oxide semiconductor film 107 from the outside by providing an insulating film having a blocking effect against oxygen, hydrogen, water, and the like as the gate insulating film 105. Examples of the insulating film having a blocking effect against oxygen, hydrogen, water, and the like include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The gate insulating film 105 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, yttrium oxide, or aluminum oxide, so that the gate leakage current of the transistor can be reduced.

The thickness of the gate insulating film 105 is greater than or equal to 5 nm and less than or equal to 400 nm, greater than or equal to 5 nm and less than or equal to 300 nm, or greater than or equal to 10 nm and less than or equal to 50 nm. By reducing the thickness of the gate insulating film 105, the voltage applied to the gate electrode 103 can be lowered, reducing the power consumption of the semiconductor device.

The gate insulating film 105 can be formed using an oxide insulating film with a low content of nitrogen oxide and a low density of defect states. The oxide insulating film with a low content of nitrogen oxide and a low density of defect states is, specifically, an oxide insulating film having a low density of defect states located 4.6 eV or more and 8 eV or less lower than a vacuum level, that is, an oxide film having a low density of defect states attributed to nitrogen oxide. As the oxide insulating film with a low content of nitrogen oxide and a low density of defect states, a silicon oxynitride film that releases little nitrogen oxide, a silicon oxide film that releases little nitrogen oxide, an aluminum oxynitride film that releases little nitrogen oxide, an aluminum oxide film that releases little nitrogen oxide, or the like can be used.

Nitrogen oxide ($NO_x$; x is greater than or equal to 0 and less than or equal to 2, preferably greater than or equal to 1 and less than or equal to 2), typically $NO_2$ or NO, forms levels in, for example, the gate insulating film 105. The level is positioned in the energy gap of the oxide semiconductor film 107. Therefore, when nitrogen oxide is diffused into the interface between the gate insulating film 105 and the oxide semiconductor film 107, an electron is trapped by the level on the gate insulating film 105 side of the oxide semiconductor film 107. As a result, the trapped electron remains in the vicinity of the interface between the gate insulating film 105 and the oxide semiconductor film 107; thus, the threshold voltage of the transistor is shifted in the positive direction.

By using an oxide insulating film with a low content of nitrogen oxide and a low density of defect states for the gate insulating film 105, a shift in the threshold voltage of the transistor can be reduced, which leads to a smaller change in the electrical characteristics of the transistor.

Note that in an electron spin resonance (ESR) spectrum at 100 K or lower of the gate insulating film 105, by heat treatment in a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are not observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than the detection limit, typically lower than or equal to $1\times10^{17}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen dioxide. Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

After heat treatment in the manufacturing process of the transistor, typically heat treatment at a temperature higher than or equal to 300° C. and lower than the strain point of the substrate, the oxide insulating film with a low content of nitrogen oxide and a low density of defect states has a nitrogen concentration measured by secondary ion mass spectrometry (SIMS) of less than $2\times10^{20}$ atoms/cm$^3$, less than $7\times10^{19}$ atoms/cm$^3$, or less than $2\times10^{19}$ atoms/cm$^3$. The content of nitrogen oxide in the gate insulating film 105 can be reduced as the formation temperature of the gate insulating film 105 rises. The gate insulating film 105 is preferably formed at a temperature higher than or equal to 450° C. and lower than the strain point of the substrate, higher than or equal to 500° C. and lower than strain point of the substrate, or higher than or equal to 500° C. and lower than or equal to 550° C.

The oxide semiconductor film 111 is an oxide semiconductor film containing In or Ga and typically an In—Ga oxide film, an In—Zn oxide film, an In—Mg oxide film, a Zn—Mg oxide film, or an In-M-Zn oxide film (M is Al, Ti, Ga, Y, Zr, Sn, La, Ce, Mg, or Nd).

Note that in the case where the oxide semiconductor film 111 is an In-M-Zn oxide film, the proportions of In and M when the summation of In and M is assumed to be 100 atomic % are preferably as follows: the atomic percentage of In is greater than or equal to 25 atomic % and the atomic percentage of M is less than 75 atomic %, or further preferably, the atomic percentage of In is greater than or equal to 34 atomic % and the atomic percentage of M is less than 66 atomic %.

The indium and gallium contents in the oxide semiconductor film 111 can be compared with each other by time-of-flight secondary ion mass spectrometry (TOF-SIMS), X-ray photoelectron spectrometry (XPS), or inductively coupled plasma mass spectrometry (ICP-MS).

Since the oxide semiconductor film 111 has an energy gap of 2 eV or more, preferably 2.5 eV or more, further preferably 3 eV or more, the off-state current of the transistor 100 can be low.

The thickness of the oxide semiconductor film 111 is greater than or equal to 3 nm and less than or equal to 200 nm, preferably greater than or equal to 3 nm and less than or equal to 100 nm, further preferably greater than or equal to 3 nm and less than or equal to 50 nm.

The oxide semiconductor film 107 and the oxide semiconductor film 115 are oxide semiconductor films containing one or more elements that are included in the oxide semiconductor film 111. Therefore, interface scattering is unlikely to occur at the interface between the oxide semiconductor film 111 and each of the oxide semiconductor films 107 and 115. Thus, the transistor 100 can have a high field-effect mobility because the movement of carriers is not hindered at the interfaces.

The oxide semiconductor film 107 and the oxide semiconductor film 115 are typically each a Ga oxide film, an In—Ga oxide film, an In—Zn oxide film, an In—Mg oxide film, a Zn—Mg oxide film, or an In-M-Zn oxide film (M is Al, Ti, Ga, Y, Zr, Sn, La, Ce, Mg, or Nd), and has the energy level at the conduction band minimum that is closer to a vacuum level than that of the oxide semiconductor film 111 is. Typically, a difference between the energy level at the conduction band minimum of the oxide semiconductor film 111 and the energy level at the conduction band minimum of each of the oxide semiconductor films 107 and 115 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. That is, the difference between the electron affinity of the oxide semiconductor film 111 and the electron affinity of each of the oxide semiconductor films 107 and 115 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the electron affinity refers to the energy gap between the vacuum level and the conduction band minimum.

When the oxide semiconductor films 107 and 115 contain a larger amount of Al, Ti, Ga, Y, Zr, Sn, La, Ce, Mg, or Nd in an atomic ratio than the amount of In in an atomic ratio, any of the following effects may be obtained.

(1) The energy gap of each of the oxide semiconductor films 107 and 115 is widened.
(2) The electron affinity of each of the oxide semiconductor films 107 and 115 is reduced.
(3) Impurities from the outside are blocked.
(4) An insulating property of each of the oxide semiconductor films 107 and 115 is higher than that of the oxide semiconductor film 111.
(5) Oxygen vacancies are less likely to be generated in the oxide semiconductor films 107 and 115 because Al, Ti, Ga, Y, Zr, Sn, La, Ce, Mg, and Nd are metal elements that can be strongly bonded to oxygen.

When an In-M-Zn oxide is used for the oxide semiconductor films 107 and 115, the proportions of In and M, not taking Zn and O into consideration, are preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

Further, in the case where the oxide semiconductor films 107, 111, and 115 are each an In-M-Zn oxide film (M is Al, Ti, Ga, Y, Zr, Sn, La, Ce, Mg, or Nd), the proportion of M atoms (M is Al, Ti, Ga, Y, Zr, Sn, La, Ce, Mg, or Nd) in each of the oxide semiconductor films 107 and 115 is higher than that in the oxide semiconductor film 111. Typically, the proportion of M in each of the oxide semiconductor films 107 and 115 is higher than or equal to 1.5 times, preferably higher than or equal to twice, further preferably higher than or equal to three times as high as that in the oxide semiconductor film 111. Any of the above-described elements represented by M is more strongly bonded to oxygen than indium is, and thus has a function of suppressing generation of oxygen vacancies in the oxide semiconductor films 107 and 115. That is, oxygen vacancies are less likely to be generated in the oxide semiconductor films 107 and 115 than in the oxide semiconductor film 111.

In the case where the oxide semiconductor film 111 is an In-M-Zn oxide film (M is Al, Ti, Ga, Y, Zr, Sn, La, Ce, Mg, or Nd) and a target having the atomic ratio of metal elements of In:M:Zn=$x_1$:$y_1$:$z_1$ is used for forming the oxide semiconductor film 111, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 111 can be easily formed. Typical examples of the atomic ratio of In to M and Zn of the target are 1:1:1, 1:1:1.2, 2:1:1.5, 2:1:2.3, 2:1:3, 3:1:2, and 4:2:4.1.

In the case where the oxide semiconductor film 107 and the oxide semiconductor film 115 are each an In-M-Zn oxide film (M is Al, Ti, Ga, Y, Zr, Sn, La, Ce, Mg, or Nd) and a target having the atomic ratio of metal elements of In:M:Zn=$x_2$:$y_2$:$z_2$ is used for forming the oxide semiconductor films 107 and 115, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films can be easily formed as the oxide semiconductor films 107 and 115. Typical examples of the atomic ratio of In to M and Zn of the target are 1:2:4, 1.1:2.9:7.5, 1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, and 1:6:8.

In each of the oxide semiconductor films 107, 111, and 115, the proportion of each atom in the above-described atomic ratio varies within a range of ±40% as an error.

The atomic ratio is not limited to the above, and may be appropriately set in accordance with needed semiconductor characteristics.

The oxide semiconductor film 107 and the oxide semiconductor film 115 may have the same composition. For example, each of the oxide semiconductor film 107 and the oxide semiconductor film 115 may be an In—Ga—Zn oxide film with an atomic ratio of In:Ga:Zn=1:3:2, 1:3:4, or 1:4:5.

Alternatively, the oxide semiconductor film 107 and the oxide semiconductor film 115 may have different compositions. For example, the oxide semiconductor film 107 may be an In—Ga—Zn oxide film with an atomic ratio of In:Ga:Zn=1:3:2, and the oxide semiconductor film 115 may be an In—Ga—Zn oxide film with an atomic ratio of In:Ga:Zn=1:3:4 or 1:4:5.

The oxide semiconductor film 107 and the oxide semiconductor film 115 may each have a thickness of more than or equal to 3 nm and less than or equal to 100 nm, or more than or equal to 3 nm and less than or equal to 50 nm.

Here, it is preferable that the thickness of the oxide semiconductor film 111 be at least larger than that of the oxide semiconductor film 107. The thicker the oxide semiconductor film 111 is, the larger the on-state current of the transistor can be. The thickness of the oxide semiconductor film 107 may be set as appropriate as long as the formation of interface states at the interface with the oxide semiconductor film 111 can be inhibited. For example, the thickness of the oxide semiconductor film 111 is larger than that of the oxide semiconductor film 107, preferably 2 or more times, further preferably 4 or more times, still further preferably 6 or more times as large as that of the oxide semiconductor film 107. Note that the above description does not apply in the case where the on-state current of the transistor need not be increased, in which case the thickness of the oxide semiconductor film 107 may be larger than or equal to that of the oxide semiconductor film 111. In this case, more oxygen can be added to the oxide semiconductor film 107, and oxygen vacancies in the oxide semiconductor film 111 can be reduced by heat treatment.

The thickness of the oxide semiconductor film 115 may be set as appropriate, in a manner similar to that of the oxide semiconductor film 107, as long as the formation of interface states at the interface with the oxide semiconductor film 111 can be inhibited. For example, the thickness of the oxide semiconductor film 115 may be set smaller than or equal to that of the oxide semiconductor film 107. If the oxide semiconductor film 115 is thick, it may become difficult for the electric field from the gate electrode 103 to reach the oxide semiconductor film 111; thus, the oxide semiconductor film 115 is preferably thin. In addition, to prevent oxygen contained in the oxide semiconductor film 115 from diffusing to the pair of electrodes 113a and 113b and thus oxidizing the pair of electrodes 113a and 113b, the oxide semiconductor film 115 is preferably thin. For example, the oxide semiconductor film 115 is preferably thinner than the oxide semiconductor film 111. Note that the thickness of the oxide semiconductor film 115 is not limited to the above, and may be set as appropriate in accordance with the driving voltage of the transistor in consideration of the withstand voltage of the gate insulating film 117.

In the case where the oxide semiconductor film 107, the oxide semiconductor film 111, and the oxide semiconductor film 115 have different compositions from one another, the interfaces thereof can be observed by scanning transmission electron microscopy (STEM) in some cases.

Hydrogen contained in the oxide semiconductor films 107, 111, and 115 reacts with oxygen bonded to a metal atom to produce water, which causes oxygen vacancies in a lattice from which oxygen is released (or a portion from which oxygen is released). Electrons serving as carriers might be generated when hydrogen enters the oxygen vacancies. Further, electrons serving as carriers might be generated when part of hydrogen is bonded to oxygen bonded to a metal atom. Thus, a transistor including an oxide semiconductor which contains hydrogen is likely to be normally on.

Accordingly, it is preferable that hydrogen be reduced as much as possible as well as the oxygen vacancies in the oxide semiconductor films 107, 111, and 115. Specifically, the hydrogen concentration of the oxide semiconductor films 107, 111, and 115, which is measured by SIMS, is lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$. As a result, the transistor 100 has a positive threshold voltage (normally-off characteristics).

Note that the impurity concentration in the oxide semiconductor films 107, 111, and 115 can be measured by SIMS.

When the oxide semiconductor films 107, 111, and 115 contain silicon or carbon that is a Group 14 element, oxygen vacancies in the films increase to form n-type regions. Thus, the concentration of silicon or carbon (the concentration is measured by SIMS) of each of the oxide semiconductor films 107, 111, and 115 is set lower than or equal to $2\times10^{18}$ atoms/cm$^3$, preferably lower than or equal to $2\times10^{17}$ atoms/cm$^3$. As a result, the transistor 100 has a positive threshold voltage (normally-off characteristics).

Furthermore, the concentration of alkali metal or alkaline earth metal of the oxide semiconductor films 107, 111, and 115, which is measured by SIMS, is set lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Thus, it is preferable to reduce the concentration of alkali metal or alkaline earth metal of the oxide semiconductor films 107, 111, and 115. As a result, the transistor 100 has a positive threshold voltage (normally-off characteristics).

Further, when containing nitrogen, the oxide semiconductor films 107, 111, and 115 easily become n-type by generation of electrons serving as carriers and an increase of carrier density. Thus, a transistor including an oxide semiconductor film which contains nitrogen is likely to be normally on. For this reason, nitrogen in the oxide semiconductor film is preferably reduced as much as possible; the concentration of nitrogen which is measured by SIMS is preferably set, for example, lower than or equal to $5\times10^{18}$ atoms/cm$^3$.

When impurities in the oxide semiconductor films 107, 111, and 115 are reduced, the carrier density of the oxide semiconductor films can be lowered. The oxide semiconductor films 107, 111, and 115 preferably have a carrier density of $1\times10^{17}$/cm$^3$ or less, further preferably $1\times10^{15}$/cm$^3$ or less, still further preferably $1\times10^{13}$/cm$^3$ or less, yet further preferably $1\times10^{11}$/cm$^3$ or less.

When an oxide semiconductor film with a low impurity concentration and a low density of defect states is used as the oxide semiconductor films 107, 111, and 115, the transistor can have more excellent electrical characteristics. Here, the state in which the impurity concentration is low and the density of defect states is low (the number of oxygen vacancies is small) is described as "highly purified intrinsic" or "substantially highly purified intrinsic." A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Further, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage between a source electrode and a drain electrode (drain voltage) of from 1 V to 10 V. Thus, the transistor whose channel region is formed in the oxide semiconductor film has a small variation in electrical characteristics and high reliability in some cases.

The oxide semiconductor films 107, 111, and 115 may have, for example, a non-single-crystal structure. The non-single-crystal structure includes, for example, a CAAC-OS which is described later, a polycrystalline structure, a microcrystalline structure, or an amorphous structure. Among the non-single-crystal structure, the amorphous structure has the highest density of defect states, whereas the CAAC-OS has the lowest density of defect states.

The oxide semiconductor films 107, 111, and 115 may have, for example, a microcrystalline structure. The oxide semiconductor films 107, 111, and 115 which have the microcrystalline structure each include a microcrystal with a size, for example, greater than or equal to 1 nm and less than 10 nm. Alternatively, the oxide semiconductor films which have the microcrystalline structure have, for example, a mixed phase structure where crystal parts (each of which is greater than or equal to 1 nm and less than 10 nm) are distributed in an amorphous phase.

The oxide semiconductor films 107, 111, and 115 may have, for example, an amorphous structure. The oxide semiconductor films 107, 111, and 115 which have the amorphous structure each have, for example, disordered atomic arrangement and no crystalline component. Alternatively, the oxide semiconductor films which have an amorphous structure have, for example, an absolutely amorphous structure and no crystal part.

Note that the oxide semiconductor films 107, 111, and 115 may each be a mixed film including regions having two or more of the following structures: a CAAC-OS, a microcrystalline structure, and an amorphous structure. The mixed film, for example, has a single-layer structure including a region having an amorphous structure, a region having a microcrystalline structure, and a region of a CAAC-OS. Alternatively, the mixed film may have, for example, a stacked-layer structure including a region having an amorphous structure, a region having a microcrystalline structure, and a region of a CAAC-OS.

Note that the oxide semiconductor films 107, 111, and 115 may have, for example, a single-crystal structure.

Oxygen vacancies in the oxide semiconductor film 111 can be reduced by providing an oxide semiconductor film in which oxygen vacancies are less likely to be generated than in the oxide semiconductor film 111, over and under and in contact with the oxide semiconductor film 111. Further, since the oxide semiconductor film 111 is in contact with the oxide semiconductor films 107 and 115 containing one or more metal elements forming the oxide semiconductor film 111, the density of states at the interface between the oxide semiconductor film 107 and the oxide semiconductor film 111 and at the interface between the oxide semiconductor film 111 and the oxide semiconductor film 115 is extremely low. Thus, after oxygen is added to the oxide semiconductor film 107 or 115, the oxygen is transferred from the oxide semiconductor film 107 or 115 to the oxide semiconductor film 111 by heat treatment; however, the oxygen is hardly trapped by the interface states at this time, and the oxygen in the oxide semiconductor film 107 or 115 can be efficiently transferred to the oxide semiconductor film 111. Accordingly, oxygen vacancies in the oxide semiconductor film 111 can be reduced. Since oxygen is added to the oxide semiconductor film 107 or 115, oxygen vacancies in the oxide semiconductor film 107 or 115 can be reduced. In other words, the density of localized states of the oxide semiconductor film 111 and the oxide semiconductor film 107 or 115 can be reduced.

In addition, when the oxide semiconductor film 111 is in contact with an insulating film including a different constituent element (e.g., a gate insulating film including a silicon oxide film), an interface state is sometimes formed and the interface state forms a channel. At this time, a second transistor having a different threshold voltage appears, so that an apparent threshold voltage of the transistor is varied in some cases. However, since the oxide semiconductor films 107 and 115 containing one or more kinds of metal elements forming the oxide semiconductor film 111 are in contact with the oxide semiconductor film 111, an interface state is not easily formed at the interfaces between the oxide semiconductor film 107 and the oxide semiconductor film 111 and between the oxide semiconductor film 115 and the oxide semiconductor film 111.

The oxide semiconductor films 107 and 115 function as barrier films that prevent constituent elements of the gate insulating films 105 and 117 from entering the oxide semiconductor film 111 and forming an impurity state.

For example, in the case of using a silicon-containing insulating film as the gate insulating films 105 and 117, silicon in the gate insulating films 105 and 117 or carbon which might be contained in the gate insulating films 105 and 117 enters the oxide semiconductor film 107 or the oxide semiconductor film 115 to a depth of several nanometers from the interface in some cases. An impurity such as silicon or carbon entering the oxide semiconductor film 111 forms an impurity state. The impurity state serves as a donor to generate electrons; thus, the oxide semiconductor film 111 might have n-type conductivity.

However, when the thicknesses of the oxide semiconductor film 107 and the oxide semiconductor film 115 are each larger than several nanometers, the impurity such as silicon or carbon does not reach the oxide semiconductor film 111, so that the influence of impurity state is suppressed.

Thus, providing the oxide semiconductor films 107 and 115 makes it possible to reduce variation in the electrical characteristics of the transistor, such as the threshold voltage.

In the case where a channel is formed at the interfaces between the gate insulating film 105 and the oxide semiconductor film 111 and between the gate insulating film 117 and the oxide semiconductor film 111, interface scattering occurs at the interfaces to reduce the field-effect mobility of the transistor. However, since the oxide semiconductor films 107 and 115 containing one or more kinds of metal elements forming the oxide semiconductor film 111 are provided in contact with the oxide semiconductor film 111, scattering of carriers does not easily occur at the interfaces between the oxide semiconductor film 111 and each of the oxide semiconductor films 107 and 115, and thus the field-effect mobility of the transistor can be increased.

In this embodiment, the number of oxygen vacancies in the oxide semiconductor film 111, and further the number of oxygen vacancies in the oxide semiconductor film 107 in contact with the oxide semiconductor film 111 can be reduced; accordingly, the density of localized states of the oxide semiconductor film 111 can be reduced. As a result, the transistor 100 in this embodiment has a small variation in threshold voltage and high reliability. Furthermore, the transistor 100 of this embodiment has excellent electrical characteristics.

The pair of electrodes 113a and 113b is formed to have a single-layer structure or a stacked-layer structure including, as a conductive material, any of metals such as aluminum, titanium, chromium, nickel, copper, yttrium, zirconium, molybdenum, silver, tantalum, manganese, and tungsten or an alloy containing any of these metals as a main component. Examples of the structure include a single-layer structure of an aluminum film containing silicon, a single-layer structure of a copper film containing manganese, a two-layer structure in which a titanium film is stacked over an aluminum film, a two-layer structure in which a titanium film is stacked over a tungsten film, a two-layer structure in which a copper film is stacked over a copper-magnesium alloy film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a copper-magnesium alloy film, a copper film, and a copper-magnesium alloy film are stacked in this order. Note that a transparent conductive material containing indium oxide, tin oxide, or zinc oxide may be used.

Note that in the oxide semiconductor film 111, a channel formation region refers to a region that overlaps with the gate electrode 119 and is positioned between the pair of electrodes 113a and 113b. Further, a channel region refers to a region through which carriers mainly flow in the channel formation region. Here, a channel region is part of the oxide semiconductor film 111, which is positioned between the pair of electrodes 113a and 113b. A channel length refers to the distance between the pair of electrodes 113a and 113b.

For the pair of electrodes 113a and 113b, it is preferable to use a conductive material that is easily bonded to oxygen, such as tungsten, titanium, aluminum, copper, molybdenum, chromium, or tantalum, or an alloy thereof. Tungsten or titanium with a relatively high melting point is preferably used, which allows subsequent process temperatures to be relatively high. Note that the conductive material that is easily bonded to oxygen includes a material to which oxygen is easily diffused. In this case, oxygen in the oxide semiconductor film 111 and the conductive material contained in the pair of electrodes 113a and 113b are bonded, and accordingly, an oxygen vacancy region is formed in the oxide semiconductor film 111. Further, in some cases, part of constituent elements of the conductive material forming the pair of electrodes 113a and 113b is mixed into the oxide semiconductor film 111. In this case, n-type regions (low resistance regions) are formed in regions in contact with the pair of electrodes 113a and 113b at least in the oxide semiconductor film 111. The n-type regions (low resistance regions) function as a source region and a drain region.

A region having a high oxygen concentration may be formed in part of the pair of electrodes 113a and 113b in contact with the low-resistance regions. Constituent elements of the oxide semiconductor film 111 enter the pair of electrodes 113a and 113b in contact with the low-resistance regions in some cases. In other words, in the vicinities of the interfaces between the oxide semiconductor film 111 and the pair of electrodes 113a and 113b, regions which can be called mixed regions or mixed layers of the two contacting layers are formed in some cases.

Since the n-type regions (low-resistance regions) have high conductivity, the contact resistance between the oxide semiconductor film 111 and the pair of electrodes 113a and 113b can be reduced to increase the on-state current of the transistor.

The gate insulating film 117 can be formed using any of the materials that can be used for the gate insulating film 105 as appropriate.

The gate electrode 119 can be formed using any of the materials that can be used for the gate electrode 103 as appropriate.

The insulating films 121 and 123 can be formed using any of the materials and formation methods that can be used for the gate insulating film 117, as appropriate. Although a stacked-layer structure of the insulating films 121 and 123 is used here, a single-layer structure may be used as well.

As the insulating film 121 or the insulating film 123, an aluminum oxide film is preferably used. Since the aluminum oxide film functions as a barrier film against hydrogen, water, and oxygen, when it is used as the insulating film 121 or 123, release of oxygen contained in the oxide semiconductor film 111 and diffusion of water, hydrogen, and the like from the outside to the oxide semiconductor film 111 can be prevented.

In the case where the insulating film 121 and the insulating film 123 are oxide insulating films, an oxide insulating film containing oxygen in excess of the stoichiometric composition may be used as one or both of the insulating film 121 and the insulating film 123. In this way, the oxygen in the insulating film is transferred to the oxide semiconductor film, so that oxygen vacancies can be filled with the oxygen and further reduced.

As the oxide insulating film containing oxygen in excess of the stoichiometric composition, it is preferable to use an oxide insulating film from which oxygen molecules with more than or equal to $1.0 \times 10^{18}$ molecules/cm$^3$ are released in thermal desorption spectroscopy (hereinafter referred to as TDS) at a surface temperature of the oxide insulating film of higher than or equal to 100° C. and lower than or equal to 700° C., or higher than or equal to 100° C. and lower than or equal to 500° C.

The oxide insulating film containing oxygen in excess of the stoichiometric composition has such a thickness as to allow oxygen to be supplied to the oxide semiconductor film 111. For example, the thickness can be more than or equal to 50 nm and less than or equal to 500 nm, or more than or equal to 50 nm and less than or equal to 400 nm.

As one or both of the insulating films 121 and 123, a nitride insulating film having a low content of hydrogen content may be provided. The nitride insulating film is preferably as follows, for example: the number of hydrogen molecules released from the nitride insulating film is less than $5.0 \times 10^{21}$ molecules/cm$^3$, preferably less than $3.0 \times 10^{21}$ molecules/cm$^3$, and further preferably less than $1.0 \times 10^{21}$ molecules/cm$^3$ when measured by TDS at a surface temperature of the nitride insulating film of higher than or equal to 100° C. and lower or equal to 700° C., preferably higher than or equal to 100° C. and lower than or equal to 500° C.

The nitride insulating film has such a thickness as to prevent entry of impurities such as hydrogen and water from the outside. For example, the thickness can be more than or equal to 50 nm and less than or equal to 200 nm, preferably more than or equal to 50 nm and less than or equal to 150 nm, and further preferably more than or equal to 50 nm and less than or equal to 100 nm.

Figure 2:
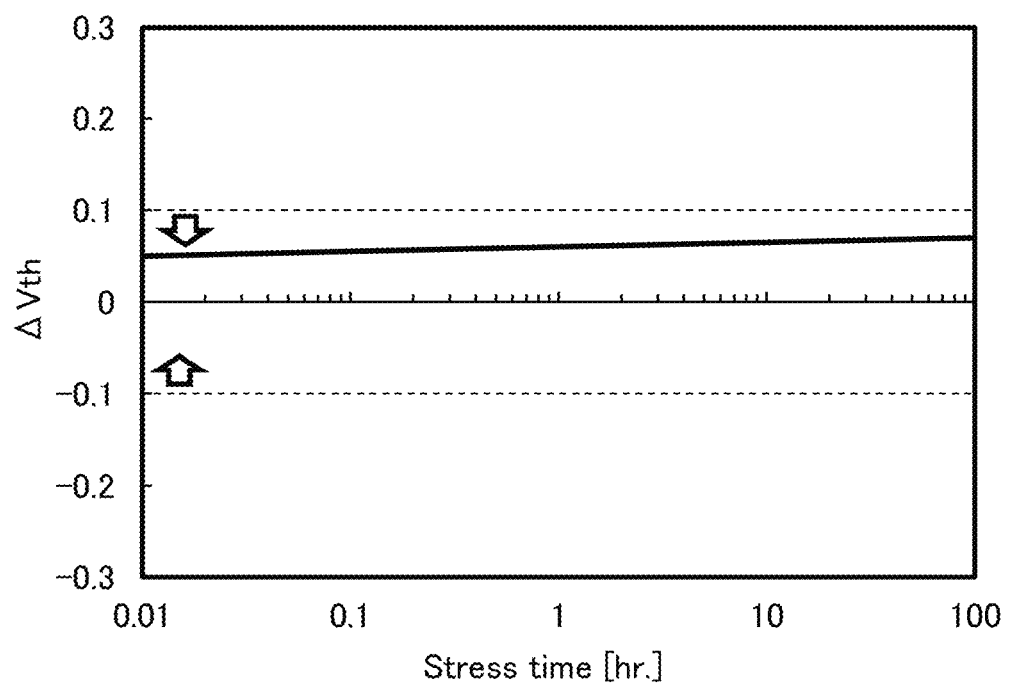
FIG. 2 shows the electrical characteristics of the semiconductor device.

As the gate insulating film 105 of the transistor, an oxide insulating film containing a small amount of nitrogen oxide and having a low density of defect states is used. FIG. 2 shows the amount of change in the threshold voltage ($\Delta V_{th}$) of the transistor with respect to stress time between before and after a gate BT stress test in which positive voltage or negative voltage is applied to the gate of the transistor. In FIG. 2, the horizontal axis represents the logarithm of stress time and the vertical axis represents the amount of change in the threshold voltage. The stress test conditions can be as follows: the maximum temperature is 150° C.; the maximum driving voltage is 3.3 V; and the stress is applied for a given period of time, e.g., longer than or equal to 50 hours or longer than or equal to 100 hours.

A measurement method of the gate BT stress test is described here. First, substrate temperature is kept constant at given temperature (hereinafter, referred to as stress temperature) to measure the initial $V_g$-$I_d$ characteristics of the transistor.

Next, while the substrate temperature is kept at stress temperature, the pair of electrodes serving as a source electrode and a drain electrode of the transistor is set at the same potential and the gate electrode is supplied with a potential different from that of the pair of electrodes for a certain period of time (hereinafter referred to as stress time). Then, the $V_g$-$I_d$ characteristics of the transistor are measured while the substrate temperature is kept at the stress temperature. As a result, a difference in threshold voltage and a difference in shift value between before and after the gate BT stress test can be obtained as the amount of change in the electrical characteristics.

Note that a stress test where negative voltage is applied to a gate electrode is called negative gate BT stress test (dark negative stress); whereas a stress test where positive voltage is applied is called positive gate BT stress test (dark positive stress). Note that a stress test where negative voltage is applied to a gate electrode while light emission is performed is called negative gate BT photostress test (negative photostress); whereas a stress test where positive voltage is applied while light emission is performed is called positive gate BT photostress test (positive photostress).

In FIG. 2, the solid line represents the amount of change in threshold voltage with respect to stress time. As shown in FIG. 2, the transistor of this embodiment has an amount of change in the threshold voltage with respect to stress time of greater than −0.1 V and less than 0.1 V.

The transistor shown in this embodiment has a small amount of change in threshold voltage over time and has high reliability.

An insulating film having a function of a base film of the oxide semiconductor film is formed at a temperature higher than the temperature of heat treatment performed on the oxide semiconductor film, whereby the nitrogen concentration of the insulating film can be reduced. This prevents production of nitrogen oxide and an increase in defects in the insulating film even when heat treatment is performed.

When the oxide semiconductor film 111 is formed after addition of oxygen to the oxide semiconductor film 107, and then heat treatment is performed on the oxide semiconductor film 111, oxygen contained in the oxide semiconductor film 107 is diffused into the oxide semiconductor film 111. As a result, oxygen vacancies in the oxide semiconductor film 111 can be reduced.

<Manufacturing Method of Semiconductor Device>

A method for manufacturing a semiconductor device is described with reference to FIGS. 3A to 3D and FIGS. 4A to 4C.

Films of the transistor (e.g., an insulating film, an oxide semiconductor film, a metal oxide film, and a conductive film) can be formed by a sputtering method, a chemical vapor deposition (CVD) method, a vacuum vapor deposition method, or a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used as well. As a thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching the respective switching valves (also referred to as high-speed valves). In such a case, an inert gas (e.g., argon or nitrogen) or the like is introduced at the same time as or after the introduction of a first source gas, and then a second source gas is introduced so that the source gases are not mixed. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer, and then the second source gas is introduced to react with the first layer; as a result, a second layer is stacked over the first layer, so that a thin film is formed.

The sequence of the gas introduction is repeated a plurality of times until a desired thickness is obtained, whereby a thin film with excellent step coverage can be formed. The thickness of the thin film can be adjusted by the number of repetition times of the gas introduction sequence; therefore, the ALD method makes it possible to accurately adjust the thickness and thus is suitable for manufacturing a minute FET.

Figure 3A:
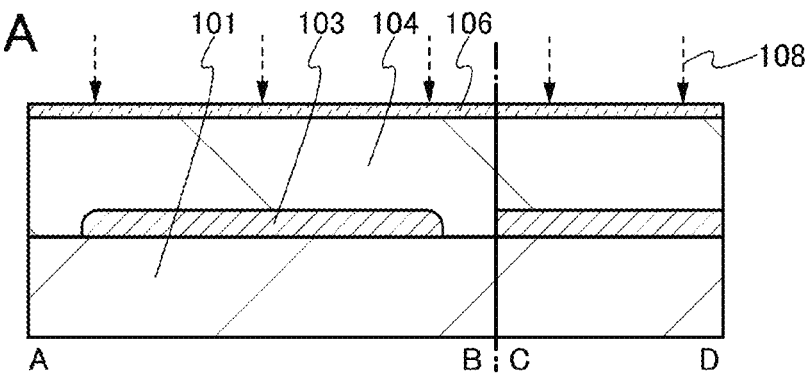
FIGS. 3A to 3D are cross-sectional views illustrating one embodiment of a method for manufacturing the semiconductor device.

As illustrated in FIG. 3A, the gate electrode 103 is formed over the substrate 101, an insulating film 104 is formed over the substrate 101 and the gate electrode 103, and then an oxide semiconductor film 106 is formed over the insulating film 104. Next, oxygen 108 is added to the oxide semiconductor film 106.

Note that the insulating film 104 is processed into the gate insulating film 105 later. The oxide semiconductor film 106 is processed into the oxide semiconductor film 107 later.

A method for forming the gate electrode 103 will be described below. First, a conductive film is formed by a sputtering method, a chemical vapor deposition (CVD) method such as a metal organic chemical vapor deposition (MOCVD) method, a metal chemical vapor deposition method, an atomic layer deposition (ALD) method, or a plasma-enhanced chemical vapor deposition (PECVD) method, an evaporation method, a pulsed laser deposition (PLD) method, or the like. Then, a mask is formed over the conductive film by a lithography process. Then, part of the conductive film is etched using the mask to form the gate electrode 103. After that, the mask is removed.

A tungsten film can be formed as the conductive film with a deposition apparatus employing an ALD method. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Here, a 20-nm-thick tungsten film is formed as the conductive film by a sputtering method. Then, a mask is formed over the conductive film by a lithography step, and the conductive film is wet-etched using the mask, so that the gate electrode 103 is formed.

The insulating film 104 can be formed by a sputtering method, a chemical vapor deposition (CVD) method such as a metal organic chemical vapor deposition (MOCVD) method, an atomic layer deposition (ALD) method, or a plasma-enhanced chemical vapor deposition (PECVD) method, a pulsed laser deposition (PLD) method, a coating method, a printing method, or the like.

In the case where the insulating film 104 is formed using a silicon oxide film or a silicon oxynitride film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case where the insulating film 104 is formed by a CVD method using, as the oxidizing gas, a nitrogen-containing gas, typically dinitrogen monoxide, nitrogen dioxide, or the like, the deposition temperature is set at higher than or equal to 450° C. and lower than the strain point of the substrate, higher than or equal to 500° C. and lower than the strain point of the substrate, or higher than or equal to 500° C. and lower than or equal to 550° C. In that case, the amount of nitrogen or nitrogen oxide contained in the insulating film 104 can be reduced. Hence, even when oxygen is added to the insulating film 104 in a subsequent step of adding oxygen to an oxide semiconductor film 106b, the amount of nitrogen oxide produced in a later heat treatment step can be reduced.

In the case where a gallium oxide film is formed as the insulating film 104, an MOCVD method can be employed.

In the case where a hafnium oxide film is formed as the insulating film 104 by a thermal CVD method such as an MOCVD method or an ALD method, two kinds of gases are used: ozone ($O_3$) as an oxidizer and a source material gas which is obtained by vaporizing a liquid containing a solvent and a hafnium precursor compound (a hafnium alkoxide solution, which is typified by tetrakis(dimethylamide)hafnium (TDMAH)). Note that the chemical formula of tetrakis (dimethylamide)hafnium is $Hf[N(CH_3)_2]_4$. Examples of another material liquid include tetrakis(ethylmethylamide) hafnium.

In the case where an aluminum oxide film is formed as the insulating film 104 by a thermal CVD method such as an MOCVD method or an ALD method, two kinds of gases are used: $H_2O$ as an oxidizer and a source material gas which is obtained by vaporizing a liquid containing a solvent and an aluminum precursor compound (e.g., trimethylaluminum (TMA)). Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

In the case where a silicon oxide film is formed as the insulating film 104 by a thermal CVD method such as an MOCVD method or an ALD method, hexachlorodisilane is adsorbed on a deposition surface, chlorine contained in adsorbate is removed, and radicals of an oxidizing gas (e.g., $O_2$ or dinitrogen monoxide) are supplied to react with the adsorbate.

Here, as the insulating film 104, a 100-nm-thick silicon oxynitride film is formed by a CVD method; silane and dinitrogen monoxide are used as the source gas and the deposition temperature is 500° C.

Then, heat treatment may be performed to release water, hydrogen, or the like contained in the insulating film 104. This reduces the concentration of water, hydrogen, or the like contained in the gate insulating film 105 that is to be formed later. The heat treatment can reduce the amount of water, hydrogen, or the like diffused into the oxide semiconductor film 111.

The oxide semiconductor film 106 can be formed by a sputtering method, a coating method, a pulsed laser deposition method, a laser ablation method, a metal organic chemical vapor deposition (MOCVD) method, an atomic layer deposition (ALD) method, or the like.

In the case where the oxide semiconductor film 106 is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of the rare gas.

Further, a target may be appropriately selected in accordance with the composition of the oxide semiconductor film 106 to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., a CAAC-OS film can be formed as the oxide semiconductor film.

For the deposition of the CAAC-OS film, the following conditions are preferably used.

By inhibiting entry of impurities during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

In the case where an oxide semiconductor film, e.g., an InGaZnOx (X>0) film is formed using a deposition apparatus employing an ALD method, an $In(CH_3)_3$ gas and an $O_3$ gas are sequentially introduced two or more times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, or a GaZnO layer may be formed by mixing of these gases. Note that although an $H_2O$ gas which is bubbled with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used.

Here, as the oxide semiconductor film 106, a 20-nm-thick In—Ga—Zn oxide film (In:Ga:Zn=1:3:4) is formed by a sputtering method.

The oxygen 108 added to the oxide semiconductor film 106 is at least one kind selected from oxygen radicals, oxygen atoms, oxygen atomic ions, oxygen molecular ions, and the like. As a method for adding the oxygen 108 to the oxide semiconductor film 106, an ion doping method, an ion implantation method, and the like can be given.

In the case of using an ion implantation method as the method for adding the oxygen 108, damage to the oxide semiconductor film 106 can be reduced by using oxygen molecular ions as the oxygen 108 added to the oxide semiconductor film 106. Oxygen molecular ions are broken down into oxygen atomic ions at the surface of the oxide semiconductor film 106, and the oxygen atomic ions are added to the oxide semiconductor film 106. Since the energy for breaking oxygen molecules down into oxygen atoms is used, the energy per oxygen atomic ion in the case of adding oxygen molecular ions to the oxide semiconductor film 106 is lower than that in the case of adding oxygen atomic ions to the oxide semiconductor film 106. Therefore, in the case of adding oxygen molecular ions to the oxide semiconductor film 106, damage to the oxide semiconductor film 106 can be reduced.

By using oxygen molecular ions, the energy of each oxygen atomic ion injected to the insulating film 104 is lowered, which makes the injected oxygen atomic ion be positioned in a shallow region. Accordingly, oxygen atoms easily move in later heat treatment, so that more oxygen can be supplied to an oxide semiconductor film 109 that is to be formed later.

In the case of injecting oxygen molecular ions, the energy per oxygen atomic ion is low as compared with the case of injecting oxygen atomic ions. Thus, by using oxygen molecular ions for injection, the acceleration voltage can be increased and throughput can be increased. Moreover, by using oxygen molecular ions for injection, the dose can be half of the amount that is necessary in the case of using oxygen atomic ions. As a result, throughput can be increased.

In the case of adding oxygen to the oxide semiconductor film 106, it is preferable that oxygen be added to the oxide semiconductor film 106 so that a peak of the concentration profile of oxygen atomic ions can be positioned in the oxide semiconductor film 106. As a result, damage to the gate insulating film 105 that is to be formed later can be reduced. In other words, defects in the gate insulating film 105 can be reduced, so that variation in the electrical characteristics of the transistor can be reduced. Furthermore, in the case where oxygen is added to the oxide semiconductor film 106 so that the amount of added oxygen atoms at the interface between the insulating film 104 and the oxide semiconductor film 106 is less than $1\times10^{21}$ atoms/cm$^3$, less than $1\times10^{20}$ atoms/cm$^3$, or less than $1\times10^{19}$ atoms/cm$^3$, the amount of oxygen added to the gate insulating film 105 that is to be formed later can be reduced. As a result, damage to the gate insulating film 105 that is to be formed later can be reduced, suppressing variation in the electrical characteristics of the transistor.

Even if oxygen is also added to the insulating film 104 in this step for adding oxygen, since the nitrogen concentration of the insulating film 104 is low, the amount of nitrogen oxide produced by heat treatment performed later can be small and defects in a back channel of the transistor can be reduced. Thus, there are a small number of carrier traps in the back channel of the transistor, leading to a reduction in the amount of change in the threshold voltage of the transistor in a GBT stress test.

Oxygen may be added to the oxide semiconductor film 106 by plasma treatment in which the oxide semiconductor film 106 is exposed to plasma generated in an atmosphere containing oxygen. As the oxygen-containing atmosphere, an atmosphere containing an oxidation gas such as oxygen, ozone, dinitrogen monoxide, or nitrogen dioxide can be given. Note that it is preferable that the oxide semiconductor film 106 be exposed to plasma generated in a state where bias is applied on the substrate 101 side, because the amount of oxygen added to the oxide semiconductor film 106 can be increased. Examples of the apparatus used in such plasma treatment include an ashing apparatus.

Here, oxygen atomic ions are added to the oxide semiconductor film 106 by an ion implantation method at an acceleration voltage of 5 kV to a dose of $1\times10^{16}/cm^2$.

Figure 3B:
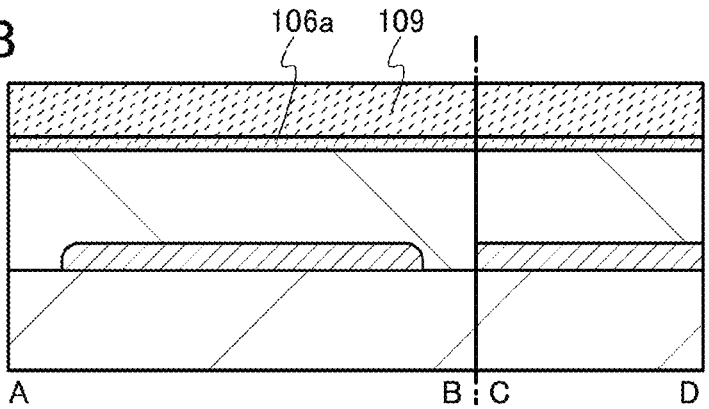

Through the above-described steps, an oxide semiconductor film 106a to which oxygen has been added can be formed as illustrated in FIG. 3B. As a result, the number of oxygen vacancies in the oxide semiconductor film 109 can be reduced in a later heat treatment step. Note that the oxide semiconductor film 106a to which oxygen has been added has a low film density compared with the oxide semiconductor film 106 to which oxygen has not been added.

Next, as illustrated in FIG. 3B, the oxide semiconductor film 109 is formed over the oxide semiconductor film 106a to which oxygen has been added.

The oxide semiconductor film 109 can be formed by a sputtering method, a coating method, a pulsed laser deposition method, a laser ablation method, a metal organic chemical vapor deposition (MOCVD) method, an atomic layer deposition (ALD) method, or the like.

As a power supply device for generating plasma in forming the oxide semiconductor film 109, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of the rare gas.

Further, a target may be appropriately selected in accordance with the composition of the oxide semiconductor film 109.

Note that in the case where the oxide semiconductor film 109 is formed by, for example, a sputtering method, the substrate temperature may be set to higher than or equal to 100° C. and lower than or equal to 450° C., preferably higher than or equal to 170° C. and lower than or equal to 350° C., and the oxide semiconductor film 109 may be formed while being heated.

Here, as the oxide semiconductor film 109, a 20-nm-thick In—Ga—Zn oxide film (In:Ga:Zn=1:1:1) is formed by a sputtering method.

Next, heat treatment is performed so that part of oxygen contained in the oxide semiconductor film 106a to which oxygen has been added can be transferred to the oxide semiconductor film 109; consequently, oxygen vacancies in the oxide semiconductor film 109 can be reduced. This oxide semiconductor film with reduced oxygen vacancies is represented as an oxide semiconductor film 109a in FIG. 3C. Oxygen vacancies in the oxide semiconductor film 106a to which oxygen has been added can also be reduced. This oxide semiconductor film is represented as the oxide semiconductor film 106b in FIG. 3C. Hydrogen, water, and the like contained in the oxide semiconductor film 106a to which oxygen has been added and the oxide semiconductor film 109 can be released. This reduces the amount of impurities contained in the oxide semiconductor film 106a to which oxygen has been added and the oxide semiconductor film 109.

The temperature of heat treatment is preferably within the range of temperatures at which oxygen moves to the oxide semiconductor film 109 from the oxide semiconductor film 106a to which oxygen has been added. In addition, the temperature of the heat treatment is preferably lower than the formation temperature of the insulating film 104. In that case, nitrogen oxide is unlikely to be produced in the insulating film 104 by the heat treatment, so that the number of electron traps can be reduced. The temperature of the heat treatment is typically higher than or equal to 250° C. and lower than the strain point of the substrate, preferably higher than or equal to 300° C. and lower than or equal to 550° C., further preferably higher than or equal to 350° C. and lower than or equal to 510° C., still further preferably higher than or equal to 350° C. and lower than or equal to 450° C.

The heat treatment is performed in an inert gas atmosphere containing nitrogen or a rare gas such as helium, neon, argon, xenon, or krypton. Further, after heat treatment is performed in an inert gas atmosphere, heat treatment may be additionally performed in an oxygen atmosphere or a dry air atmosphere (air whose dew point is lower than or equal to −80° C., preferably lower than or equal to −100° C., further preferably lower than or equal to −120° C.). Note that it is preferable that hydrogen, water, and the like be not contained in an inert gas and oxygen, like the dry air, and the dew point is preferably lower than or equal to −80° C., further preferably lower than or equal to −100° C. The treatment time is 3 minutes to 24 hours.

In the heat treatment, instead of an electric furnace, any device for heating an object by heat conduction or heat radiation from a heating element such as a resistance heating element may be used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas such as nitrogen or a rare gas like argon is used.

Here, after heat treatment is performed at 450° C. for 1 hour in a nitrogen atmosphere, another heat treatment is performed at 450° C. for 1 hour in an oxygen atmosphere.

Through the above-described steps, oxygen vacancies in the oxide semiconductor films can be reduced. The oxide semiconductor films can have a low density of localized states.

Note that the heat treatment may be performed in a later step, not in this step. In other words, in another heating step performed later, part of oxygen contained in the oxide semiconductor film 106a to which oxygen has been added may be transferred to the oxide semiconductor film 109. As a result, the number of heating steps can be reduced.

Then, after a mask is formed over the oxide semiconductor film 109a by a lithography process, part of the oxide semiconductor film 106b and part of the oxide semiconductor film 109a are etched using the mask. Thus, the oxide semiconductor film 107 and an oxide semiconductor film 110 are formed as illustrated in FIG. 3D. Then, the mask is removed. Note that in the etching step, part of the insulating film 104 is preferably etched. As a result, a transistor with the s-channel structure where, in the channel width direction, the side surfaces of the oxide semiconductor film 107 and the oxide semiconductor film 111 face the gate electrode 119 with the gate insulating film interposed therebetween can be formed. Here, the insulating film 104 which is partly etched is referred to as the gate insulating film 105.

Here, a mask is formed over the oxide semiconductor film 109a by a lithography process, and the oxide semiconductor film 106b and the oxide semiconductor film 109a are wet-etched using the mask, so that the oxide semiconductor film 107 and the oxide semiconductor film 110 are formed.

Figure 4A:
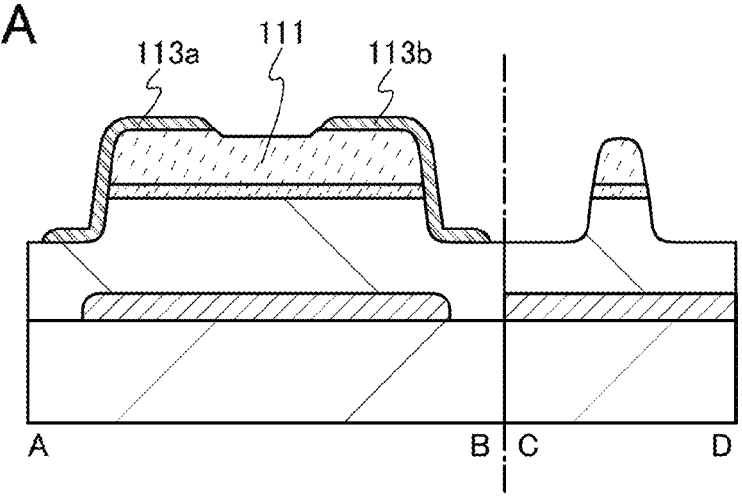
FIGS. 4A to 4C are cross-sectional views illustrating one embodiment of a method for manufacturing the semiconductor device.

Next, the pair of electrodes 113a and 113b is formed over the oxide semiconductor film 110 as illustrated in FIG. 4A.

A method for forming the pair of electrodes 113a and 113b is described below. A conductive film is formed by a sputtering method, a chemical vapor deposition (CVD) method such as a metal organic chemical vapor deposition (MOCVD) method, a metal chemical vapor deposition method, an atomic layer deposition (ALD) method, or a plasma-enhanced chemical vapor deposition (PECVD) method, an evaporation method, a pulsed laser deposition (PLD) method, or the like. Then, a mask is formed over the conductive film by a lithography process. Then, part of the conductive film is etched using the mask to form the pair of electrodes 113a and 113b. After that, the mask is removed.

Note that in the case where a transistor having an extremely short channel length is formed, at least the conductive film in a region to divide the pair of electrodes 113a and 113b is etched using a resist mask that is processed by a method suitable for micropatterning, such as electron beam exposure, liquid immersion exposure, or EUV exposure. Note that by the use of a positive type resist for the resist mask, the exposed region can be minimized to improve throughput. In the above-described manner, a transistor having a channel length of 100 nm or less, further, 30 nm or less can be formed. Alternatively, minute processing may be performed by an exposure technology which uses light with an extremely short wavelength (e.g., extreme ultraviolet (EUV)), X-rays, or the like.

Here, a 10 nm-thick tungsten film is formed as the conductive film by a sputtering method. Then, a mask is formed over the conductive film by a lithography process and the conductive film is dry-etched with use of the mask to form the pair of electrodes 113a and 113b.

After the pair of electrodes 113a and 113b is formed, cleaning treatment is preferably performed to remove an etching residue. A short circuit of the pair of electrodes 113a and 113b can be suppressed by this cleaning treatment. The cleaning treatment can be performed using an alkaline solution such as a tetramethylammonium hydroxide (TMAH) solution, or an acidic solution such as diluted hydrofluoric acid, an oxalic acid solution, or a phosphoric acid solution. By the cleaning treatment, part of the oxide semiconductor film 110 is etched, so that the oxide semiconductor film 111 having a depression is formed.

Figure 4B:
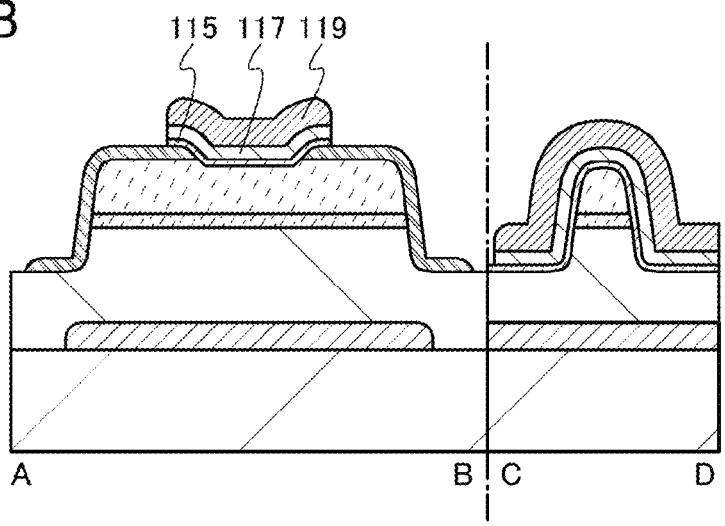

Next, as illustrated in FIG. 4B, the oxide semiconductor film 115 is formed over the oxide semiconductor film 111 and the pair of electrodes 113a and 113b, the gate insulating film 117 is formed over the oxide semiconductor film 115, and the gate electrode 119 is formed over the gate insulating film 117.

A method for forming the oxide semiconductor film 115, the gate insulating film 117, and the gate electrode 119 is described below. First, an oxide semiconductor film is formed using any of the methods that can be used for forming the oxide semiconductor film 106. Next, an insulating film is formed using any of the methods that can be used for forming the insulating film 104. Then, a conductive film is formed. Then, a mask is formed over the conductive film by a lithography process. Next, the oxide semiconductor film, the insulating film, and the conductive film are etched using the mask to form the oxide semiconductor film 115, the gate insulating film 117, and the gate electrode 119. After that, the mask is removed.

Here, as the oxide semiconductor film, a 5-nm-thick In—Ga—Zn oxide film (In:Ga:Zn=1:3:2) is formed by a sputtering method. Next, as the insulating film, a 10-nm-thick silicon oxynitride film is formed by a CVD method. Then, as the conductive film, a 20-nm-thick tungsten film is formed by a sputtering method. Then, a mask is formed over the conductive film by a lithography process. Next, the oxide semiconductor film, the insulating film, and the conductive film are etched using the mask to form the oxide semiconductor film 115, the gate insulating film 117, and the gate electrode 119. After that, the mask is removed.

In the transistor 100, by providing the oxide semiconductor film 115 in which oxygen vacancies are unlikely to occur, release of oxygen from side surfaces of the oxide semiconductor film 111 in the channel width direction is suppressed, so that generation of oxygen vacancies can be suppressed. As a result, a transistor that has improved electrical characteristics and high reliability can be provided.

Figure 4C:
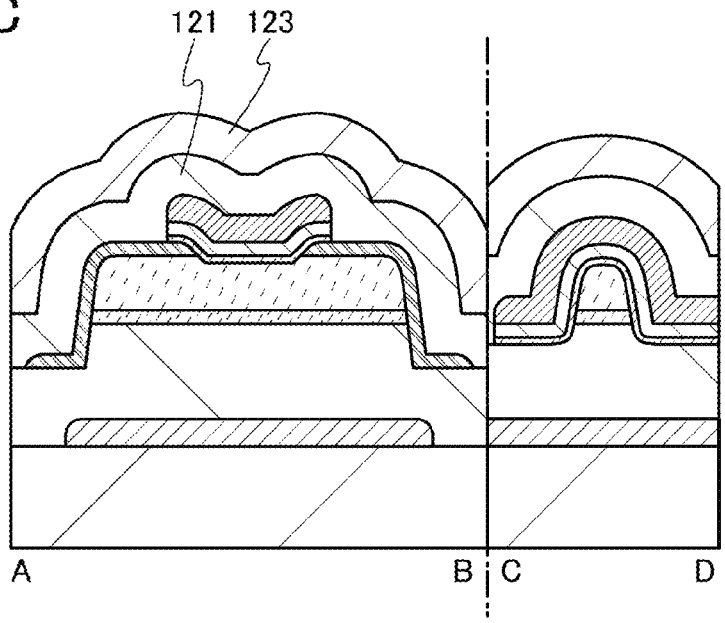

Next, as illustrated in FIG. 4C, the insulating film 121 and the insulating film 123 are formed sequentially over the gate insulating film 105, the pair of electrodes 113a and 113b, the oxide semiconductor film 115, the gate insulating film 117, and the gate electrode 119. After that, heat treatment is preferably performed.

The insulating films 121 and 123 can be formed by a sputtering method, a CVD method, or the like as appropriate.

In the case where the insulating films 121 and 123 are oxide insulating films containing oxygen in excess of the stoichiometric composition, they can be formed by a CVD method, a sputtering method, or the like. After the oxide insulating films are formed by a CVD method, a sputtering method, or the like, oxygen may be added to the oxide insulating films by an ion implantation method, an ion doping method, plasma treatment, or the like.

The heat treatment is preferably performed at a temperature lower than the formation temperature of the insulating film 104. In that case, nitrogen oxide is unlikely to be produced in the insulating film 104 by the heat treatment. In addition, the number of carrier traps in the back channel of the transistor can be reduced. The temperature of the heat treatment is typically higher than or equal to 150° C. and lower than the strain point of the substrate, preferably higher than or equal to 250° C. and lower than or equal to 500° C., further preferably higher than or equal to 350° C. and lower than or equal to 450° C.

Here, a 40-nm-thick aluminum oxide film is formed as the insulating film 121 by a sputtering method, and a 150-nm-thick silicon oxynitride film is formed as the insulating film 123 by a CVD method. Further, heat treatment is performed at 350° C. in an oxygen atmosphere for 1 hour.

Through the above-described steps, the density of localized states of the oxide semiconductor films is lowered, and thus a transistor with excellent electrical characteristics can be manufactured. In addition, a highly reliable transistor with a small variation in electrical characteristics with time or due to a stress test can be manufactured.

<Band Structure>

Here, a band structure is described. For easy understanding, the band structure is illustrated with the energy levels (Ec) at the conduction band minimum of the gate insulating film 105, the oxide semiconductor film 107, the oxide semiconductor film 111, the oxide semiconductor film 115, and the gate insulating film 117.

Figure 5A:
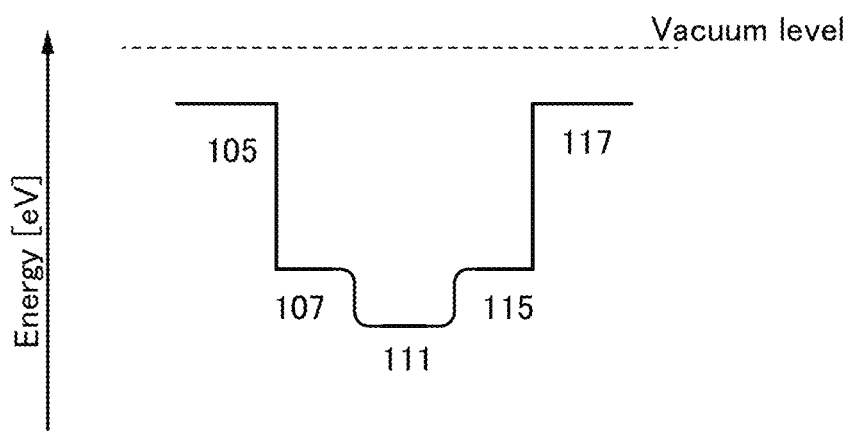
FIGS. 5A and 5B each show a band structure of a transistor.
Figure 5B:
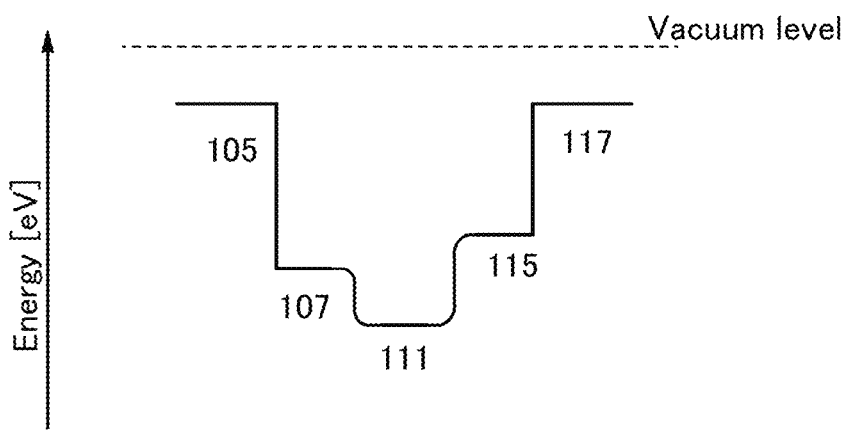

As illustrated in FIGS. 5A and 5B, the energy at the conduction band minimum changes continuously within the oxide semiconductor films 107, 111, and 115. This can be understood also from the fact that the constituent elements are common to the oxide semiconductor films 107, 111, and 115 and oxygen is easily diffused among the oxide semiconductor films 107, 111, and 115. Thus, the oxide semiconductor films 107, 111, and 115 have a continuous physical property although they are a stack of films having different compositions.

The oxide semiconductor films, which contain the same main components and are stacked, are not simply stacked but are formed to have continuous junction (here, in particular, a well structure having a U shape in which the energy at the conduction band minimum continuously changes among the films (U-shape well)). In other words, a stacked-layer structure is formed such that there exist no impurities which form a defect level such as a trap center or a recombination center at each interface. If impurities are mixed between the films in the stacked multilayer film, the continuity of the energy band is lost and carriers disappear by a trap or recombination at the interface.

Note that FIG. 5A shows the case where the energy level (Ec) at the conduction band minimum of the oxide semiconductor film 107 and that of the oxide semiconductor film 115 are equal to each other; however, they may be different from each other. For example, FIG. 5B shows part of the band structure in the case where the energy level (Ec) at the conduction band minimum of the oxide semiconductor film 115 is closer to the vacuum level than that of the oxide semiconductor film 107 is.

As shown in FIGS. 5A and 5B, the oxide semiconductor film 111 serves as a well and a channel of the transistor 100 is formed in the oxide semiconductor film 111. Note that a channel having a U-shaped well structure in which the energy at the conduction band minimum continuously changes like the one formed in the oxide semiconductor films 107, 111, and 115, can also be referred to as a buried channel.

Note that trap levels due to impurities or defects might be formed in the vicinity of the interface between an insulating film such as a silicon oxide film and each of the oxide semiconductor films 107 and 115. The oxide semiconductor film 111 can be distanced away from the trap levels owing to the existence of the oxide semiconductor films 107 and 115.

However, when the difference between the energy (Ec) at the conduction band minimum of the oxide semiconductor film 107 or 115 and the energy (Ec) at the conduction band minimum of the oxide semiconductor film 111 is small, electrons in the oxide semiconductor film 111 might reach the trap levels across the energy difference. When electrons to be negative charge are trapped in the trap levels, negative fixed charges are generated at the interface with the insulating film, whereby the threshold voltage of the transistor is shifted in the positive direction.

Thus, to reduce a change in the threshold voltage of the transistor, the Ec at the conduction band minimum of the oxide semiconductor film 111 and the Ec at the conduction band minimum of each of the oxide semiconductor films 107 and 115 needs to have an energy difference. The energy difference is preferably greater than or equal to 0.1 eV, further preferably greater than or equal to 0.2 eV.

The oxide semiconductor films 107, 111, and 115 preferably include a crystal portion. In particular, a transistor including an oxide semiconductor film having a c-axis aligned crystal can have stable electrical characteristics.

In the band structure illustrated in FIG. 5B, instead of the oxide semiconductor film 115, an In—Ga oxide film (e.g., an In—Ga oxide film with an atomic ratio of In:Ga=7:93) may be provided between the oxide semiconductor film 111 and the gate insulating film 117.

For the oxide semiconductor film 111, an oxide semiconductor having an electron affinity higher than those of the oxide semiconductor films 107 and 115 is used. The oxide semiconductor used for the oxide semiconductor film 111 has, for example, an electron affinity higher than that of each of the oxide semiconductor films 107 and 115 by 0.07 eV or higher and 1.3 eV or lower, preferably 0.1 eV or higher and 0.7 eV or lower, and further preferably 0.2 eV or higher and 0.4 eV or lower.

Since the transistor described in this embodiment includes the oxide semiconductor films 107 and 115 each of which includes one or more kinds of metal elements included in the oxide semiconductor film 111, interface states are unlikely to occur at the interface between the oxide semiconductor film 107 and the oxide semiconductor film 111 and the interface between the oxide semiconductor film 115 and the oxide semiconductor film 111. Thus, providing the oxide semiconductor films 107 and 115 makes it possible to reduce variation or change in the electrical characteristics of the transistor, such as the threshold voltage.

When a channel is formed at the interface between the gate insulating film 117 and the oxide semiconductor film 111, interface scattering occurs at the interface and the field-effect mobility of the transistor may decrease in some cases. In the transistor of this structure, however, the oxide semiconductor film 115 includes one or more kinds of metal elements included in the semiconductor film 111. Therefore, scattering of carriers is unlikely to occur at the interface between the semiconductor film 111 and the oxide semiconductor film 115, and thus the field-effect mobility of the transistor can be increased.

Modification Example 1

Transistors including an oxide semiconductor film and a gate insulating film with different shapes from those of the oxide semiconductor film 115 and the gate insulating film 117 in the transistor 100 illustrated in FIGS. 1A to 1C will be described with reference to FIGS. 6A to 6C.

Figure 6A:
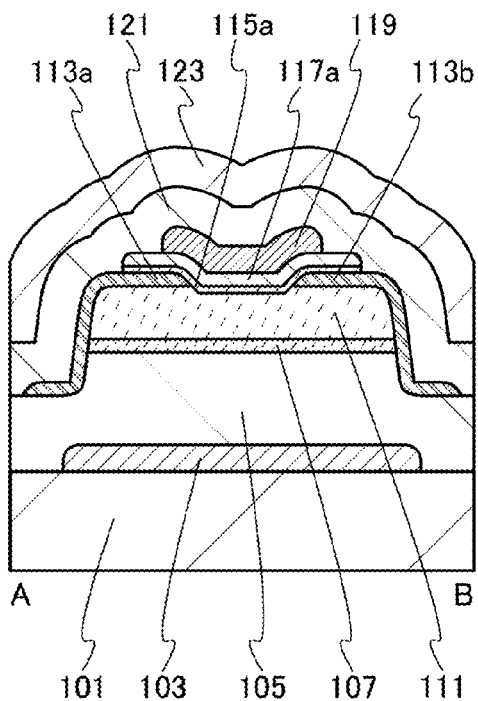
FIGS. 6A to 6C are cross-sectional views illustrating one embodiment of a semiconductor device.

A transistor 100a illustrated in FIG. 6A includes an oxide semiconductor film 115a that is in contact with the oxide semiconductor film 111 and the pair of electrodes 113a and 113b, and a gate insulating film 117a that is in contact with the oxide semiconductor film 115a. The gate insulating film 117a is also in contact with the gate electrode 119.

In the transistor 100a, end portions of the oxide semiconductor film 115a and the gate insulating film 117a are located on the outer side of an end portion of the gate electrode 119.

Figure 6B:
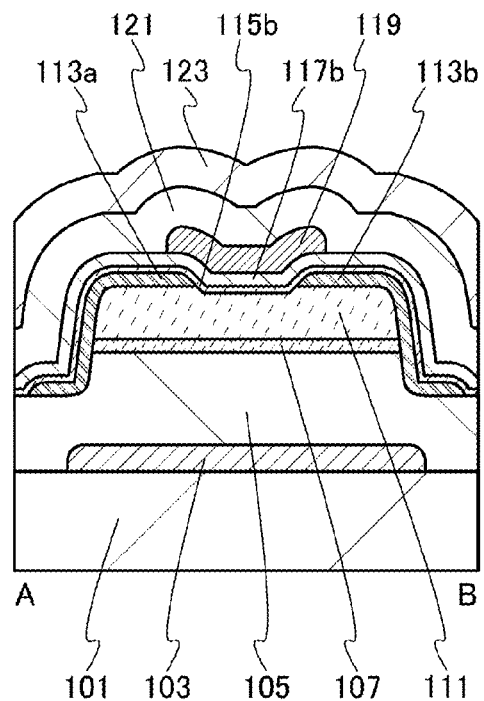

A transistor 100b illustrated in FIG. 6B includes an oxide semiconductor film 115b that is in contact with the oxide semiconductor film 111 and the pair of electrodes 113a and 113b, and a gate insulating film 117b that is in contact with the oxide semiconductor film 115b. The gate insulating film 117b is also in contact with the gate electrode 119.

In the transistor 100b, the oxide semiconductor film 115b and the gate insulating film 117b are each not disconnected and cover the pair of electrodes 113a and 113b and the gate insulating film 105.

Figure 6C:
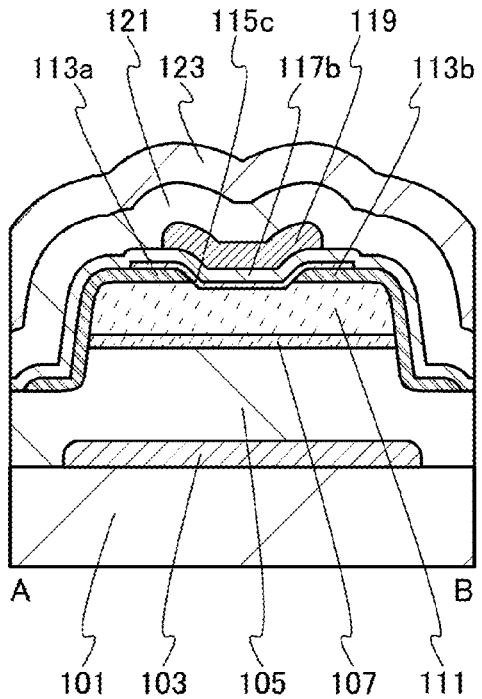

A transistor 100c illustrated in FIG. 6C includes an oxide semiconductor film 115c that is in contact with the oxide semiconductor film 111 and the pair of electrodes 113a and 113b, and a gate insulating film 117b that is in contact with the oxide semiconductor film 115c. The gate insulating film 117b is also in contact with the gate electrode 119.

In the transistor 100c, an end portion of the oxide semiconductor film 115c is located on the outer side of an end portion of the gate electrode 119, and the gate insulating film 117b is not disconnected and covers the oxide semiconductor film 115c, the pair of electrodes 113a and 113b, and the gate insulating film 105.

The oxide semiconductor films 115a, 115b, and 115c can be formed using the same material as that of the oxide semiconductor film 115, as appropriate. The gate insulating films 117a and 117b can be formed using the same material as that of the gate insulating film 117, as appropriate.

Here, manufacturing methods of the transistors 100a, 100b, and 100C will be described.

First, the manufacturing method of the transistor 100a will be described. Through the steps of FIGS. 3A to 3D and FIG. 4A, the gate electrode 103, the gate insulating film 105, the oxide semiconductor film 107, the oxide semiconductor film 111, and the pair of electrodes 113a and 113b are formed over the substrate 101.

Then, an oxide semiconductor film to be the oxide semiconductor film 115a is formed over the gate insulating film 105, the oxide semiconductor film 111, and the pair of electrodes 113a and 113b. Further, an insulating film to be the gate insulating film 117a is formed over the oxide semiconductor film to be the oxide semiconductor film 115a. Next, a conductive film is formed over the insulating film to be the gate insulating film 117a. Further, a mask is formed over the conductive film by a lithography process, and etched using the mask to form the gate electrode 119. Then, the mask is removed.

In the etching step, since the pair of electrodes 113a and 113b is covered with the insulating film to be the gate insulating film 117a, surfaces of the pair of electrodes 113a and 113b can be prevented from bearing electrical charges. Consequently, electrostatic destruction between the gate electrode 119 and the pair of electrodes 113a and 113b is unlikely to occur and yield can be increased.

Next, a mask is formed over the gate electrode 119 and the insulating film to be the gate insulating film 117a by a lithography process, and the oxide semiconductor film to be the oxide semiconductor film 115a and the insulating film to be the gate insulating film 117a are etched using the mask, whereby the oxide semiconductor film 115a and the gate insulating film 117a are formed.

In the etching step, since the gate electrode 119 is covered with the mask, a surface of the gate electrode 119 can be prevented from bearing electrical charges. Consequently, electrostatic destruction between the gate electrode 119 and the pair of electrodes 113a and 113b is unlikely to occur although the pair of electrodes 113a and 113b is exposed at the time of forming the oxide semiconductor film 115a and the gate insulating film 117a; thus, yield can be increased.

The later steps are the same as those for the transistor 100 of Embodiment 1. Through the later steps, the transistor 100a can be manufactured.

As for the transistor 100b, through the steps of FIGS. 3A to 3D and FIG. 4A, the gate electrode 103, the gate insulating film 105, the oxide semiconductor film 107, the oxide semiconductor film 111, and the pair of electrodes 113a and 113b are formed over the substrate 101.

Next, the oxide semiconductor film 115b is formed over the gate insulating film 105, the oxide semiconductor film 111, and the pair of electrodes 113a and 113b, and the gate insulating film 117b is formed over the oxide semiconductor film 115b. Then, the gate electrode 119 is formed over the gate insulating film 117b.

The later steps are the same as those for the transistor 100 of Embodiment 1. Through the later steps, the transistor 100b can be manufactured.

As for the transistor 100c, through the steps of FIGS. 3A to 3D and FIG. 4A, the gate electrode 103, the gate insulating film 105, the oxide semiconductor film 107, the oxide semiconductor film 111, and the pair of electrodes 113a and 113b are formed over the substrate 101.

Next, an oxide semiconductor film to be the oxide semiconductor film 115c is formed over the gate insulating film 105, the oxide semiconductor film 111, and the pair of electrodes 113a and 113b, and then a mask is formed over the oxide semiconductor film by a lithography process. The oxide semiconductor film is etched using the mask to form the oxide semiconductor film 115c. Then, the mask is removed.

Next, the gate insulating film 117b is formed over the oxide semiconductor film 115c. Then, the gate electrode 119 is formed over the gate insulating film 117b.

The later steps are the same as those for the transistor 100 of Embodiment 1. Through the later steps, the transistor 100c can be manufactured.

Modification Example 2

A transistor including a pair of electrodes with a different shape from that of the pair of electrodes 113a and 113b in the transistor 100 illustrated in FIGS. 1A to 1C will be described with reference to FIGS. 7A to 7D.

FIGS. 7A to 7D are a top view and cross-sectional views of a transistor 100d of a semiconductor device. FIG. 7A is a top view of the transistor 100d, FIG. 7B is a cross-sectional view taken along dashed-dotted line A-B in FIG. 7A, FIG. 7C is a cross-sectional view taken along dashed-dotted line C-D in FIG. 7A, and FIG. 7D is a cross-sectional view taken along dashed-dotted line E-F in FIG. 7A.

FIG. 7B is a cross-sectional view in the channel length direction of the transistor 100d, FIG. 7C is a cross-sectional view in the channel width direction of the transistor 100d, and FIG. 7D is a cross-sectional view in the channel width direction of the transistor 100d showing the region where the pair of electrodes and the oxide semiconductor films are stacked.

Note that in FIG. 7A, the substrate 101, the gate insulating film 105, the oxide semiconductor film 107, the gate insulating film 117, the insulating film 121, the insulating film 123, and the like are not illustrated for simplicity.

The transistor 100d illustrated in FIGS. 7A to 7D includes a pair of electrodes 113c and 113d that is not in contact with the side surfaces of the oxide semiconductor film 107 and the oxide semiconductor film 111 and is in contact with the top surface of the oxide semiconductor film 111. Furthermore, the transistor 100d includes plugs 127a and 127b that are in contact with the pair of electrodes 113c and 113d at openings 125a and 125b provided in the insulating film 121 and the insulating film 123.

As illustrated in FIG. 7D, since the side surfaces of the oxide semiconductor films 107 and 111 are not in contact with the pair of electrodes 113c and 113d in the channel width direction, the electric field of the gate electrode 119 is not blocked by the pair of electrodes 113c and 113d. As a result, the effect of the electric field of the gate electrode 119 on the side surfaces of the oxide semiconductor films 107 and 111 can be increased, and this transistor can therefore have an excellent subthreshold swing (hereinafter referred to as S value) and a high field-effect mobility. Note that the S value is the value of a gate voltage necessary to change the on-state current by one digit; a smaller S value means better transistor characteristics.

Next, a manufacturing method of the transistor 100d will be described with reference to FIGS. 3A to 3D and FIGS. 8A to 8C. Here, the manufacturing method of the transistor 100d will be described with reference to cross-sectional views taken along dashed-dotted lines A-B and C-D in FIG. 7A.

Figure 3C:
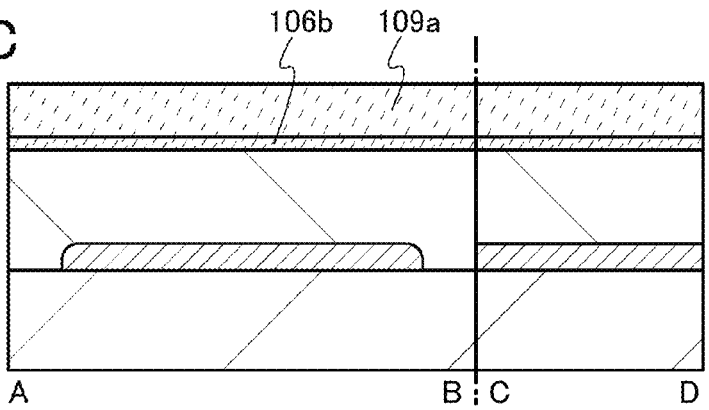
Figure 3D:
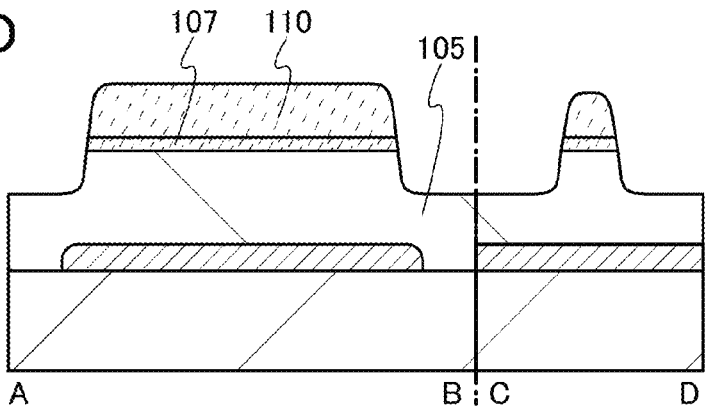

Through the steps of FIGS. 3A to 3C, the gate electrode 103, the insulating film 104, the oxide semiconductor film 106b, and the oxide semiconductor film 109a are formed over the substrate 101. Next, a conductive film 112 is formed over the oxide semiconductor film 109a (see FIG. 8A).

The conductive film 112 can be formed by the formation method of the pair of electrodes 113a and 113b in Embodiment 1, as appropriate.

Next, a mask is formed over the conductive film 112 by a lithography process, and then the oxide semiconductor film 106b, the oxide semiconductor film 109a, and the conductive film 112 are etched using the mask to form the oxide semiconductor film 107, the oxide semiconductor film 110, and a conductive film 113. In this step, part of the insulating film 104 is also etched, so that the gate insulating film 105 is formed (see FIG. 8B).

The shape of the resist mask is changed in the etching step, so that if etching is performed using only the resist mask without providing a hard mask, the shapes of the formed oxide semiconductor film 107 and oxide semiconductor film 110 might be different from predetermined shapes. This problem arises outstandingly in micropatterning such as electron beam exposure, liquid immersion exposure, or EUV exposure. However, since the conductive film 112 provided over the oxide semiconductor film 109a functions as a hard mask here, the oxide semiconductor film 107 and the oxide semiconductor film 110 with predetermined shapes can be obtained.

Then, a mask is formed over the conductive film 113 by a lithography process, and the conductive film 113 is etched using the mask to form the pair of electrodes 113c and 113d. In the case of using a positive-type photoresist as the mask, the exposing time can be shortened. In the etching step, part of the oxide semiconductor film 110 may be etched to form a depression. Here, the oxide semiconductor film having a depression is referred to as the oxide semiconductor film 111 (see FIG. 8C).

Then, by the steps similar to those of FIG. 4B, the oxide semiconductor film 115, the gate insulating film 117, and the gate electrode 119 are formed. In this way, the transistor 100d illustrated in FIGS. 7A to 7D can be manufactured.

Figure 9:
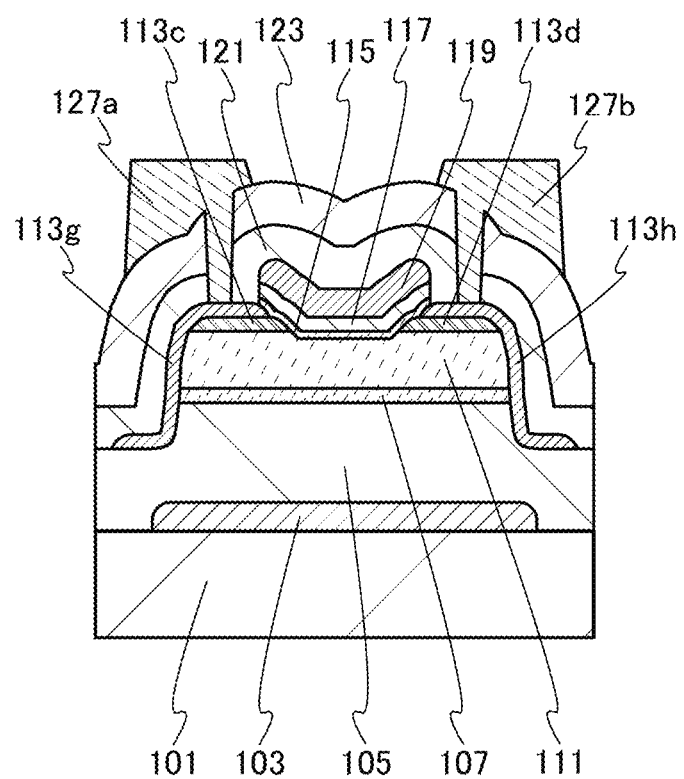
FIG. 9 is a cross-sectional view illustrating one embodiment of a semiconductor device.

Note that as illustrated in FIG. 9, a pair of electrodes 113g and 113h that is provided over the pair of electrodes 113c and 113d and is in contact with the side surfaces of the oxide semiconductor film 107 and the oxide semiconductor film 111 in the channel length direction of the transistor may be included. In FIG. 9, the electrode 113g is in contact with the electrode 113c, and the electrode 113h is in contact with the electrode 113d.

Modification Example 3

A transistor including the oxide semiconductor film 111 with a different shape from that in the transistor 100 illustrated in FIGS. 1A to 1C will be described with reference to FIGS. 10A to 10C.

Figure 10A:
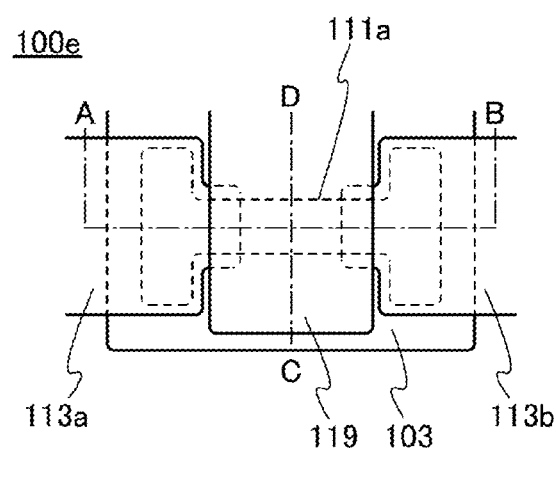
FIGS. 10A to 10C are a top view and cross-sectional views illustrating one embodiment of a semiconductor device.
Figure 10C:
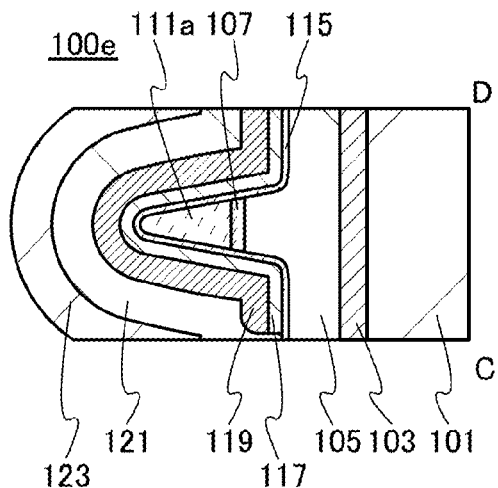
Figure 10B:
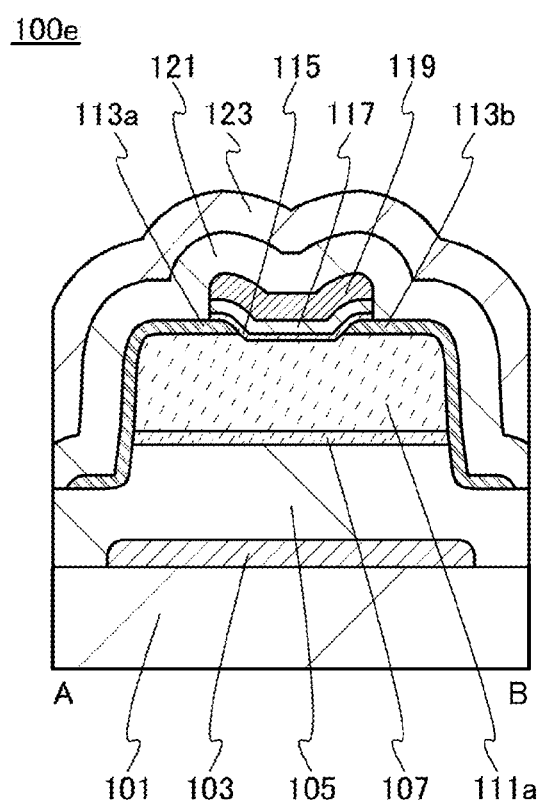

FIGS. 10A to 10C are a top view and cross-sectional views of a transistor 100e included in a semiconductor device. FIG. 10A is a top view of the transistor 100e, FIG. 10B is a cross-sectional view taken along dashed-dotted line A-B in FIG. 10A, and FIG. 10C is a cross-sectional view taken along dashed-dotted line C-D in FIG. 10A.

FIG. 10B is a cross-sectional view in the channel length direction of the transistor 100e and FIG. 10C is a cross-sectional view in the channel width direction of the transistor 100e.

Note that in FIG. 10A, the substrate 101, the gate insulating film 105, the oxide semiconductor film 107, the gate insulating film 117, the insulating film 121, the insulating film 123, and the like are not illustrated for simplicity.

As illustrated in FIG. 10C, the transistor 100e includes an oxide semiconductor film 111a whose cross section in the channel width direction is substantially triangular or substantially trapezoidal. Here, the substantial triangle and the substantial trapezoid refer to the shapes in which the angle between the bottom surface in contact with the oxide semiconductor film 107 and the side surface in contact with the oxide semiconductor film 115 in the oxide semiconductor film 111a is greater than 0° and less than or equal to 85° or greater than or equal to 30° and less than or equal to 80°. In addition, the surface on the opposite side to the bottom surface may have a sharp corner or a rounded corner. The shape may have a vertex on the opposite side to the bottom surface.

As compared with an upper region in an oxide semiconductor film whose cross section in the channel width direction is substantially rectangular, an upper region in the oxide semiconductor film 111a whose cross section is substantially triangular or trapezoidal has a small cross-sectional area. This decreases a region having high current density on the gate insulating film 117 side. As a result, excellent S value and increased on-state current can be achieved.

A method for manufacturing the oxide semiconductor film 111 with the substantially triangular or trapezoidal cross section will be described. A mask is formed over the oxide semiconductor film 109a illustrated in FIG. 3C by a lithography process, and then, the oxide semiconductor film 109a is etched while the mask is made to recede. Thus, the oxide semiconductor film whose cross section in the channel width direction is substantially triangular or substantially trapezoidal as illustrated in FIG. 10C can be formed.

Modification Example 4

A transistor including the gate electrode with a different shape from that in the transistor 100 illustrated in FIGS. 1A to 1C will be described with reference to FIGS. 11A to 11C.

Figure 11A:
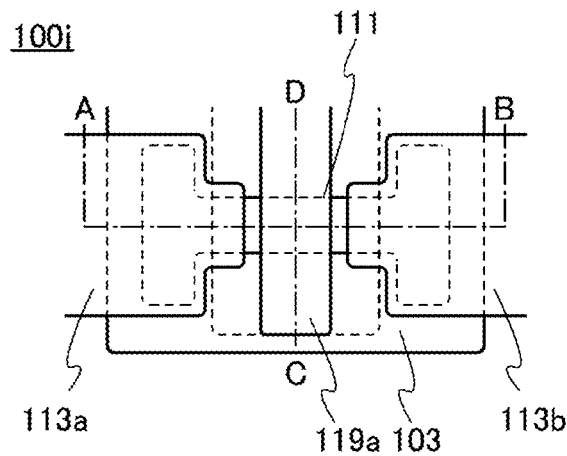
FIGS. 11A to 11C are a top view and cross-sectional views illustrating one embodiment of a semiconductor device.
Figure 11C:
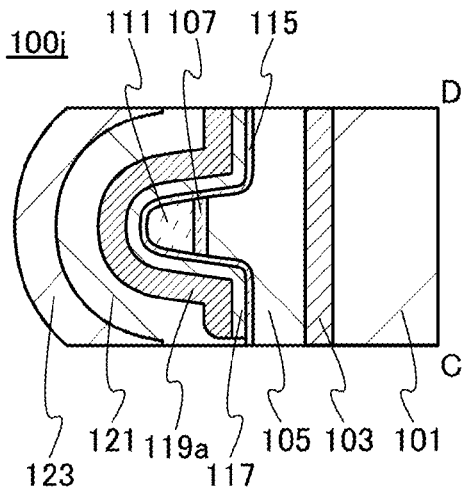
Figure 11B:
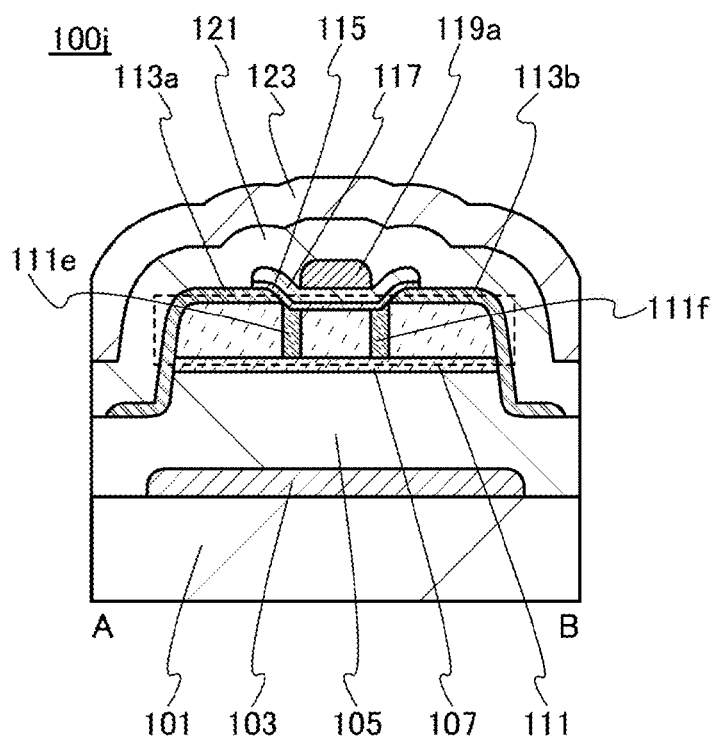

FIGS. 11A to 11C are a top view and cross-sectional views of a transistor 100j in a semiconductor device. FIG. 11A is a top view of the transistor 100j, FIG. 11B is a cross-sectional view taken along dashed-dotted line A-B in FIG. 11A, and FIG. 11C is a cross-sectional view taken along dashed-dotted line C-D in FIG. 11A.

FIG. 11B is a cross-sectional view in the channel length direction of the transistor 100j and FIG. 11C is a cross-sectional view in the channel width direction of the transistor 100j.

Note that in FIG. 11A, the substrate 101, the gate insulating film 105, the oxide semiconductor film 107, the gate insulating film 117, the insulating film 121, the insulating film 123, and the like are not illustrated for simplicity.

As illustrated in FIGS. 11A and 11B, the transistor 100j is characterized in that the pair of electrodes 113a and 113b does not overlap with a gate electrode 119a in the channel length direction. As a result, parasitic capacitance between the pair of electrodes 113a and 113b and the gate electrode 119a can be reduced to increase the on-state current of the transistor.

After the gate electrode 119a is formed, it is preferable to form impurity regions 111e and 111f by adding impurities to the oxide semiconductor film 111 using the gate electrode 119a and the pair of electrodes 113a and 113b as masks. This increases the on-state current of the transistor. Note that as the impurities added to the oxide semiconductor film 111, hydrogen, helium, neon, argon, krypton, xenon, boron, nitrogen, phosphorus, or arsenic can be used.

Modification Example 5

Figure 43:
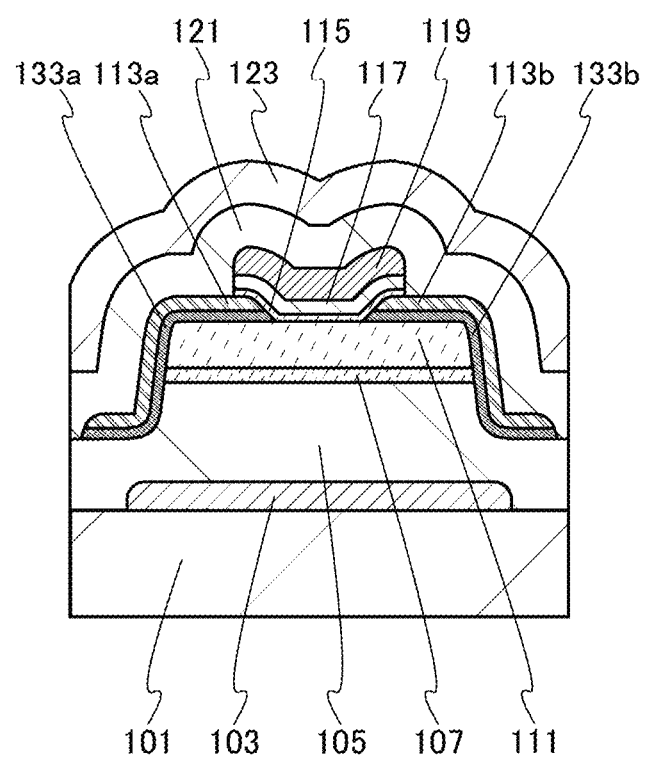
FIG. 43 is a cross-sectional view illustrating one embodiment of a semiconductor device.

A modification example of the transistor 100 illustrated in FIGS. 1A to 1C will be described with reference to FIG. 43.

The transistor may include low-resistance regions 133a and 133b between the oxide semiconductor films 107 and 111 and the pair of electrodes 113a and 113b. The low-resistance regions 133a and 133b can be formed using any of the light-transmitting conductive materials listed as the materials of the gate electrode 103. The low-resistance regions 133a and 133b can also be formed by adding hydrogen or nitrogen to the surfaces of the oxide semiconductor films 107 and 111.

The low-resistance regions 133a and 133b provided between the oxide semiconductor films 107 and 111 and the pair of electrodes 113a and 113b can reduce the contact resistance between the oxide semiconductor films 107 and 111 and the pair of electrodes 113a and 113b. As a result, the on-state current of the transistor can be increased.

Modification Example 6

Figure 44A:
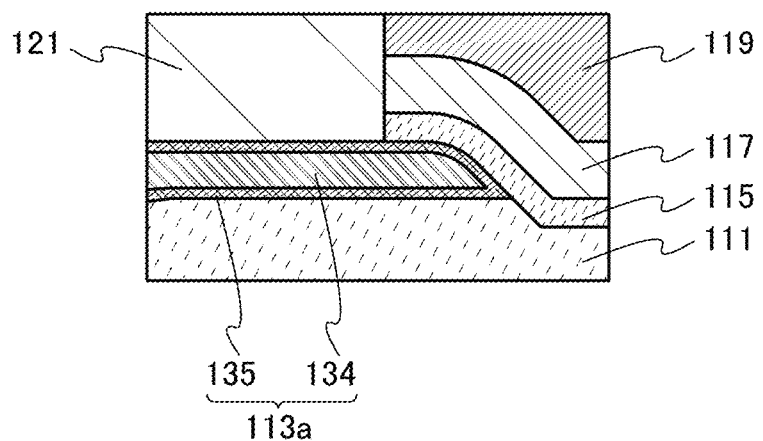
FIGS. 44A and 44B are cross-sectional views each illustrating one embodiment of a semiconductor device.
Figure 44B:
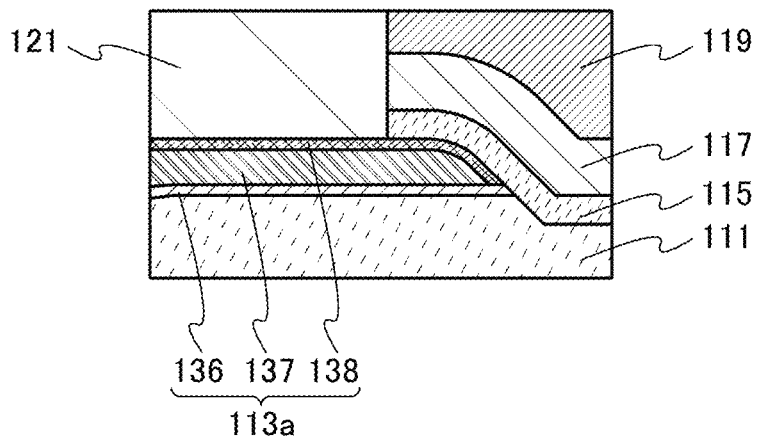

A modification example of the pair of electrodes included in the transistor will be described with reference to FIGS. 44A and 44B. FIGS. 44A and 44B are each an enlarged view of a region surrounded by a dashed line in FIG. 1B.

The pair of electrodes 113a and 113b preferably includes at least a Cu—X alloy film (hereinafter, simply referred to as a Cu—X alloy film, where X is Mn, Ni, Cr, Fe, Co, Mo, Ta, or Ti). When the pair of electrodes is formed using, for example, a single-layer structure of a Cu—X alloy film or a stacked-layer structure including a Cu—X alloy film, the resistance of the pair of electrodes can be reduced. Here, the electrode 113a is described as an example of the electrodes.

In the electrode 113a illustrated in FIG. 44A, a Cu—X alloy film 134 and a covering film 135 formed on a surface of the Cu—X alloy film 134 are stacked. The covering film 135 contains X in the Cu—X alloy film and a compound formed by reaction between X and an element contained in the oxide semiconductor film 111 or 115 or the insulating film 121. Examples of the compound containing X include an oxide containing X, a nitride containing X, silicide containing X, and carbide containing X. Examples of the oxide containing X include an X oxide, an In—X oxide, a Ga—X oxide, an In—Ga—X oxide, and an In—Ga—Zn—X oxide. Since the covering film 135 serves as a blocking film, entry of Cu in the Cu—X alloy film into the oxide semiconductor film 111 or 115 or the insulating film 121 can be prevented.

Note that when a Cu—Mn alloy film is used as an example of the Cu—X alloy film 134, the adhesion between the electrode 113a and the oxide semiconductor film 111 or 115 or the insulating film 121 can be increased. The use of the Cu—Mn alloy film results in a favorable ohmic contact between the electrode 113a and each of the oxide semiconductor films 111 and 115.

Specifically, the covering film 135 might be formed in the following manner: a Cu—Mn alloy film is formed as the Cu—X alloy film 134 and then is subjected to heat treatment at higher than or equal to 150° C. and lower than or equal to 450° C., preferably higher than or equal to 250° C. and lower than or equal to 350° C., for example; and Mn in the Cu—Mn alloy film is segregated at the interfaces between the Cu—X alloy film 134 and each of the oxide semiconductor films 111 and 115 and the insulating film 121. The covering film 135 can contain a Mn oxide formed by oxidation of the segregated Mn, or an In—Mn oxide, a Ga—Mn oxide, an In—Ga—Mn oxide, an In—Ga—Zn—Mn oxide, or the like, which is formed by reaction between the segregated Mn and a constituent element in the oxide semiconductor films 111 and 115. The covering film 135 increases the adhesion between the electrode 113a and each of the oxide semiconductor films 111 and 115. Furthermore, with the segregation of Mn in the Cu—Mn alloy film, part of the Cu—Mn alloy film becomes a pure Cu film, so that the electrode 113a can obtain high conductivity.

In the electrode 113a illustrated in FIG. 44B, a conductive film 136, a Cu—X alloy film 137, and a covering film 138 are stacked in this order. The conductive film 136 can be formed using a metal such as tungsten or titanium or an alloy containing the metal. The materials for the Cu—X alloy film 137 and the covering film 138 can be the same as those of the Cu—X alloy film 134 and the covering film 135 illustrated in FIG. 44A. The conductive film 136 can prevent diffusion of Cu contained in the Cu—X alloy film to the oxide semiconductor films 111 and 115.

The structures, methods, and the like described in this embodiment can be used in appropriate combination with any of the structures, methods, and the like described in the other embodiments and examples.

Embodiment 2

Described in this embodiment is a method for reducing oxygen vacancies in an oxide semiconductor film, which is different from the method in Embodiment 1. This embodiment is different from Embodiment 1 in adding oxygen to an oxide semiconductor film positioned over the pair of electrodes 113a and 113b.

Figure 12A:
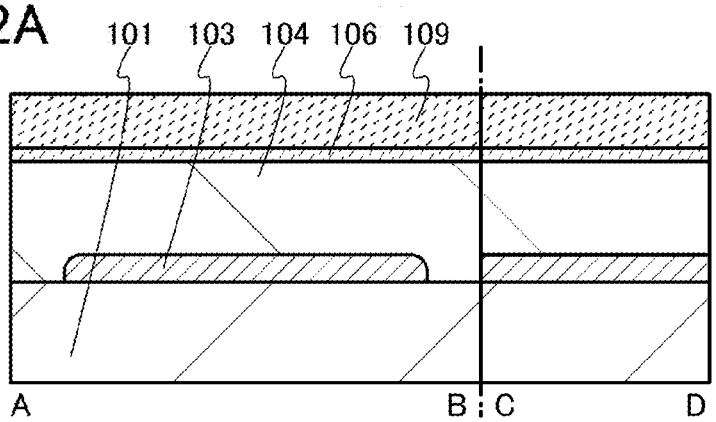
FIGS. 12A to 12D are cross-sectional views illustrating one embodiment of a method for manufacturing a semiconductor device.

As illustrated in FIG. 12A, the gate electrode 103 is formed over the substrate 101, and the insulating film 104 is formed over the gate electrode 103. Then, the oxide semiconductor film 106 is formed over the insulating film 104, and the oxide semiconductor film 109 is formed over the oxide semiconductor film 106.

Figure 12B:
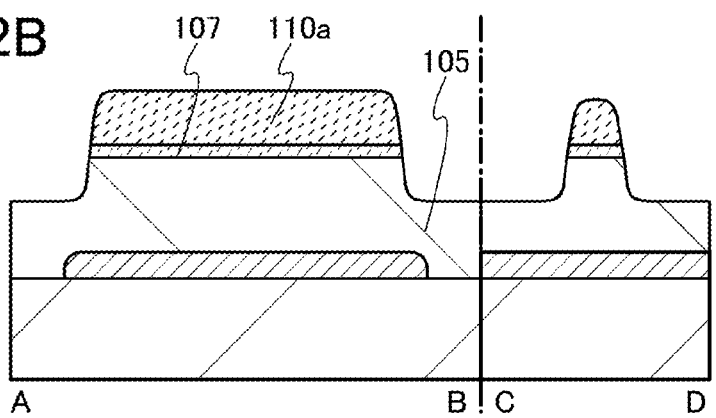

Next, a mask is formed over the oxide semiconductor film 109 by a lithography process, and part of the insulating film 104, part of the oxide semiconductor film 106, and part of the oxide semiconductor film 109 are etched using the mask; thus, the gate insulating film 105, the oxide semiconductor film 107, and an oxide semiconductor film 110a are formed as illustrated in FIG. 12B.

Next, heat treatment may be performed to release water, hydrogen, and the like contained in the oxide semiconductor film 109. This heat treatment may be skipped and water, hydrogen, and the like contained in the oxide semiconductor film 109 may be released by heat treatment performed in a later step.

Figure 12C:
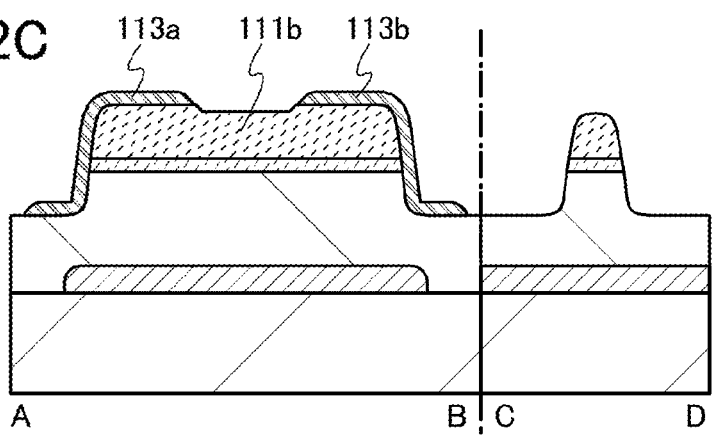

Next, the pair of electrodes 113a and 113b is formed over the oxide semiconductor film 110a. After the pair of electrodes 113a and 113b is formed, cleaning treatment is preferably performed to remove an etching residue. A short circuit of the pair of electrodes 113a and 113b can be suppressed by this cleaning treatment. By the cleaning treatment, an oxide semiconductor film 111b part of which is etched is formed (see FIG. 12C).

Figure 12D:
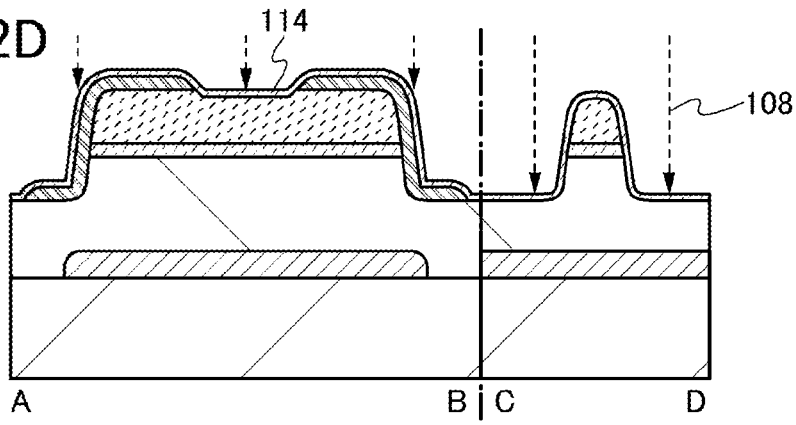

Next, as illustrated in FIG. 12D, an oxide semiconductor film 114 is formed over the gate insulating film 105, the oxide semiconductor film 111b, and the pair of electrodes 113a and 113b. Next, oxygen 108 is added to the oxide semiconductor film 114.

As the oxygen 108 added to the oxide semiconductor film 114, at least one kind selected from oxygen radicals, oxygen atoms, oxygen atomic ions, oxygen molecular ions, and the like is used. As a method for adding the oxygen 108 to the oxide semiconductor film 114, an ion doping method, an ion implantation method, or the like can be used.

In the case of adding oxygen to the oxide semiconductor film 114, it is preferable that oxygen be added to the oxide semiconductor film 114 so that a peak of the concentration profile of oxygen atomic ions is positioned in the oxide semiconductor film 114. In the case where the oxide semiconductor film 114 is thin, oxygen might enter the oxide semiconductor film 111b; however, by using such conditions as to make a peak of the concentration profile of oxygen atomic ions be positioned in the oxide semiconductor film 114, damage to the oxide semiconductor film 111b can be reduced. In other words, defects in the oxide semiconductor film 111b can be reduced, so that variation in the electrical characteristics of the transistor can be reduced. Furthermore, in the case where oxygen is added to the oxide semiconductor film 114 so that the amount of added oxygen atoms at the interface between the insulating film 104 and the oxide semiconductor film 106 is less than $1 \times 10^{21}$ atoms/cm$^3$, less than $1 \times 10^{20}$ atoms/cm$^3$, or less than $1 \times 10^{19}$ atoms/cm$^3$, damage to the oxide semiconductor film 111b can be reduced by later heat treatment, whereby variation in the electrical characteristics of the transistor can be reduced.

In the case of using an ion implantation method as the method for adding the oxygen 108, damage to the oxide semiconductor film 114 can be reduced by using oxygen molecular ions as the oxygen 108 added to the oxide semiconductor film 114.

Oxygen may be added to the oxide semiconductor film 114 by plasma treatment in which the oxide semiconductor film 114 is exposed to plasma generated in an atmosphere containing oxygen.

Figure 13A:
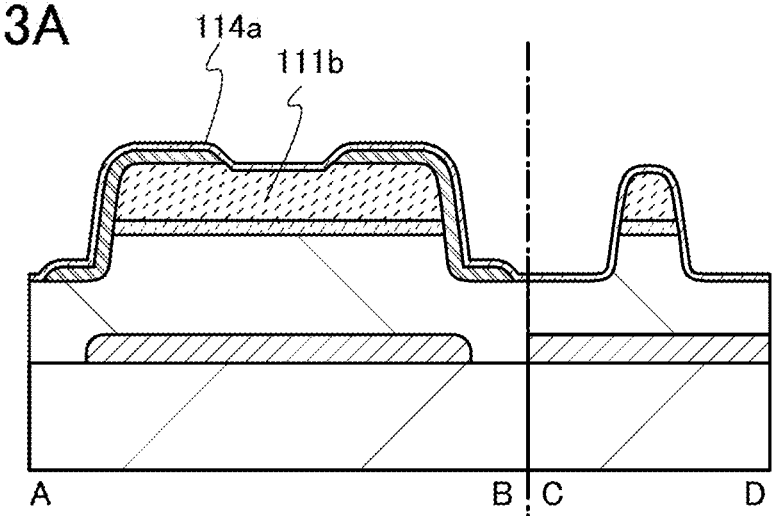
FIGS. 13A to 13C are cross-sectional views illustrating one embodiment of the method for manufacturing the semiconductor device.

Through the above-described steps, an oxide semiconductor film 114a to which oxygen has been added, which is illustrated in FIG. 13A, can be formed.

Figure 13B:
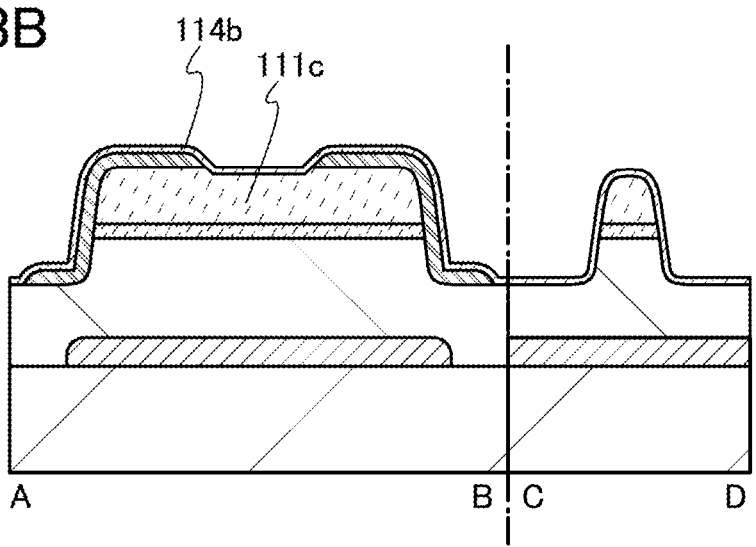

Next, heat treatment is performed so that part of oxygen contained in the oxide semiconductor film 114a to which oxygen has been added can be transferred to the oxide semiconductor film 111b; consequently, oxygen vacancies in the oxide semiconductor film 111b can be reduced. This oxide semiconductor film with reduced oxygen vacancies is represented as an oxide semiconductor film 111c in FIG. 13B. Oxygen vacancies in the oxide semiconductor film 114a to which oxygen has been added can be reduced. This oxide semiconductor film is represented as an oxide semiconductor film 114b in FIG. 13B.

Through the above-described steps, oxygen vacancies in the oxide semiconductor films can be reduced. The oxide semiconductor films can have a low density of localized states.

Figure 13C:
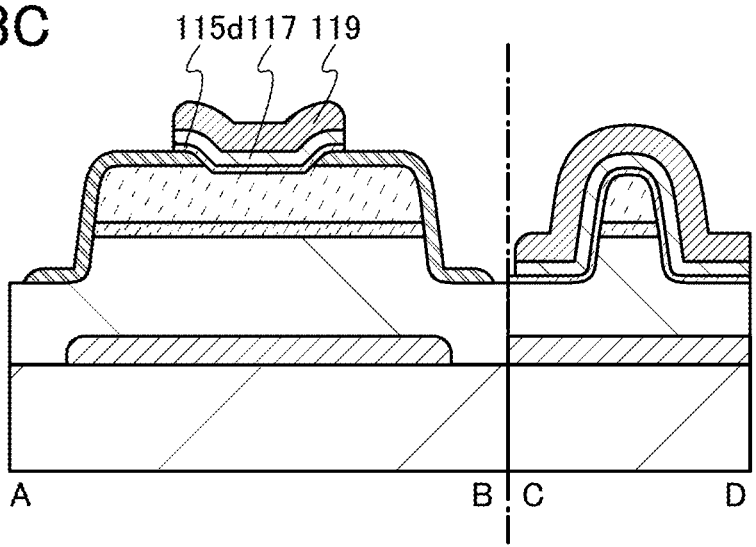

Then, part of the oxide semiconductor film 114b is etched in a manner similar to that of Embodiment 1, so that an oxide semiconductor film 115d can be formed. Furthermore, the gate insulating film 117 and the gate electrode 119 can be formed. Moreover, the insulating film 121 and the insulating film 123 can be formed (see FIG. 13C).

Through the above-described steps, the density of localized states of the oxide semiconductor films is lowered, and thus a transistor with excellent electrical characteristics can be manufactured. In addition, a highly reliable transistor with a small variation in electrical characteristics with time or due to a stress test can be manufactured.

Modification Example 1

Figure 14A:
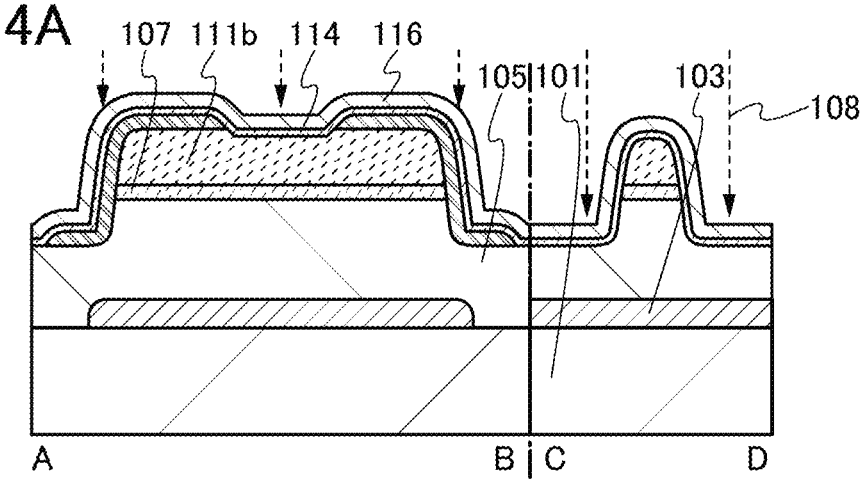
FIGS. 14A to 14C are cross-sectional views illustrating one embodiment of a method for manufacturing a semiconductor device.

A method for adding oxygen to the oxide semiconductor film 114, which is different from the above-described method in Embodiment 2, will be described with reference to FIGS. 14A to 14C.

In a manner similar to that described in Embodiment 2, the gate electrode 103, the gate insulating film 105, the oxide semiconductor film 107, the oxide semiconductor film 111b, the pair of electrodes 113a and 113b, and the oxide semiconductor film 114 are formed over the substrate 101. Next, the insulating film 116 is formed over the oxide semiconductor film 114. Then, the oxygen 108 is added to the oxide semiconductor film 114 through the insulating film 116 (see FIG. 14A).

Oxygen may be added to the oxide semiconductor film 114 through the insulating film 116 by plasma treatment in which the insulating film 116 is exposed to plasma generated in an atmosphere containing oxygen.

Figure 14B:
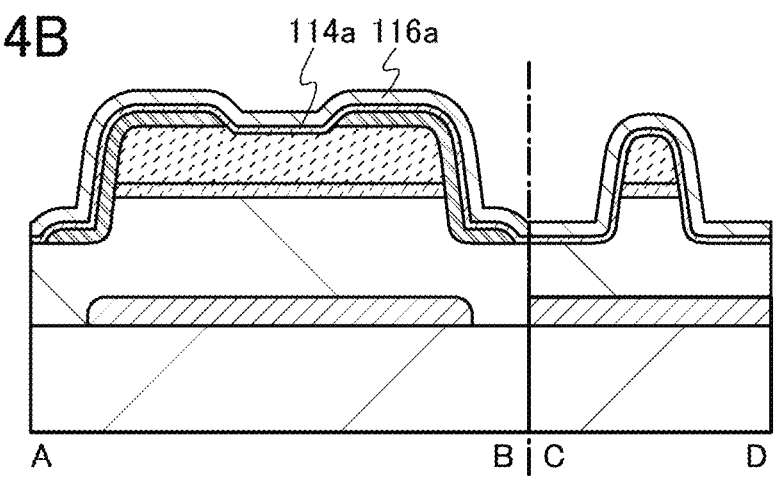
Figure 14C:
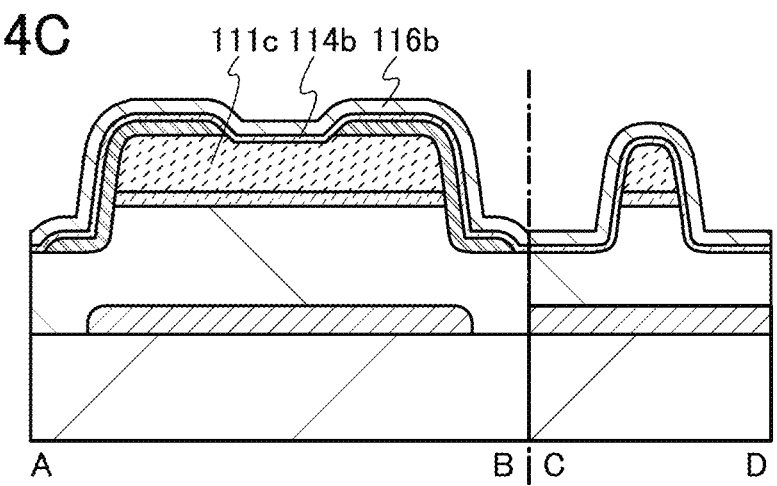

Through the above-described steps, the oxide semiconductor film 114a to which oxygen has been added and an insulating film 116a to which oxygen has been added, which are illustrated in FIG. 14B, can be formed.

Next, heat treatment is performed so that part of oxygen contained in the oxide semiconductor film 114a to which oxygen has been added and the insulating film 116a to which oxygen has been added can be transferred to the oxide semiconductor film 111b; consequently, oxygen vacancies in the oxide semiconductor film 111b can be reduced. This oxide semiconductor film with reduced oxygen vacancies is represented as the oxide semiconductor film 111c in FIG. 14C. Oxygen vacancies in the oxide semiconductor film 114a to which oxygen has been added can be reduced. This oxide semiconductor film is represented as the oxide semiconductor film 114b in FIG. 14C. Defects in the insulating film 116a to which oxygen has been added can be reduced. This insulating film is represented as an insulating film 116b in FIG. 14C.

Through the above-described steps, oxygen vacancies in the oxide semiconductor films can be reduced. The oxide semiconductors film can have a low density of localized states.

Then, part of the oxide semiconductor film 114b is etched in a manner similar to that of Embodiment 1, so that the oxide semiconductor film 115a can be formed. In addition, part of the insulating film 116b is etched, so that the gate insulating film 117 can be formed. Furthermore, the gate electrode 119 can be formed. Moreover, the insulating film 121 and the insulating film 123 can be formed.

Through the above-described steps, the density of localized states of the oxide semiconductor films is lowered, and thus a transistor with excellent electrical characteristics can be manufactured. In addition, a highly reliable transistor with a small variation in electrical characteristics with time or due to a stress test can be manufactured.

The structures, methods, and the like described in this embodiment can be used in appropriate combination with any of the structures, methods, and the like described in the other embodiments and examples.

Embodiment 3

Transistors having a stacked structure of oxide semiconductor films different from that in the transistor 100 illustrated in FIGS. 1A to 1C will be described with reference to FIGS. 15A to 15C.

Figure 15A:
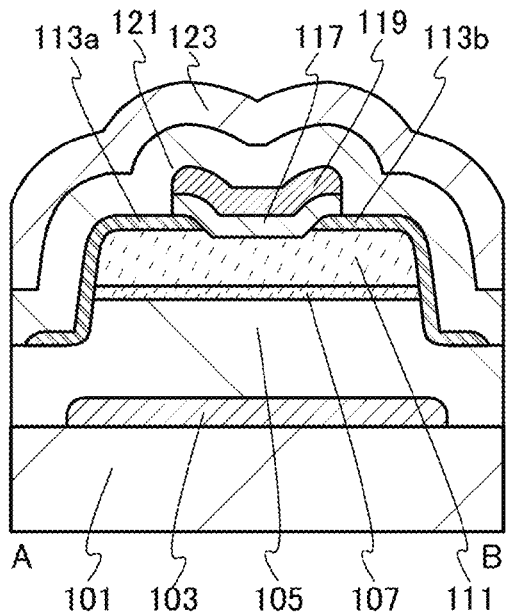
FIGS. 15A to 15C are cross-sectional views each illustrating one embodiment of a semiconductor device.

A transistor 100f illustrated in FIG. 15A is different from the transistor 100 illustrated in FIG. 1B in not including the oxide semiconductor film 115. In other words, the transistor 100f is characterized by including the gate insulating film 117 that is in contact with the oxide semiconductor film 111, the pair of electrodes 113a and 113b, and the gate electrode 119.

Note that in a method for manufacturing the transistor 100f illustrated in FIG. 15A, the method for forming the oxide semiconductor film 111 described in Embodiment 1 can be used as appropriate.

Figure 15B:
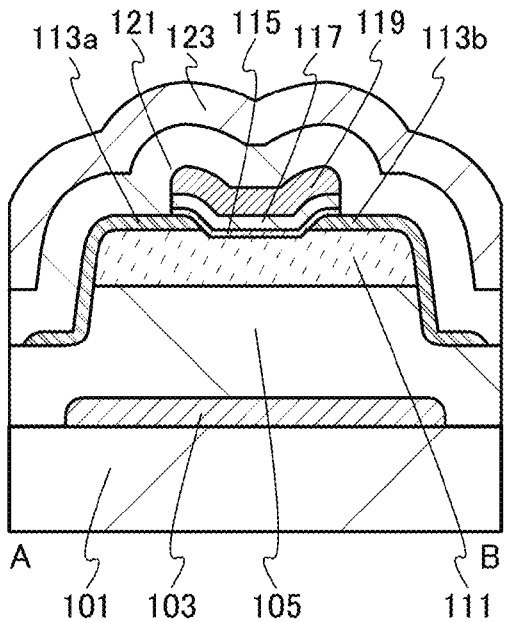

A transistor 100g illustrated in FIG. 15B is different from the transistor 100 illustrated in FIG. 1B in not including the oxide semiconductor film 107. In other words, the transistor 100g is characterized by including the gate insulating film 105 that is in contact with the gate electrode 103 and the oxide semiconductor film 111.

Note that in a method for manufacturing the transistor 100g illustrated in FIG. 15B, the method for forming the oxide semiconductor film 111 described in Embodiment 2 can be used as appropriate.

Figure 15C:
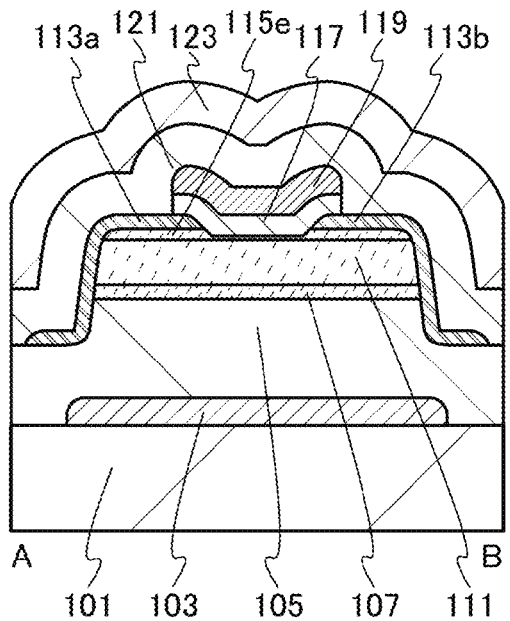

A transistor 100h illustrated in FIG. 15C is different from the transistor 100 illustrated in FIG. 1B in including an oxide semiconductor film 115e between the oxide semiconductor film 111 and the pair of electrodes 113a and 113b. In other words, the transistor 100h is characterized by including the oxide semiconductor film 115e that is in contact with the oxide semiconductor film 111, the pair of electrodes 113a and 113b, and the gate insulating film 117. The oxide semiconductor film 115e is provided between the oxide semiconductor film 111 and the pair of electrodes 113a and 113b.

Note that in a method for manufacturing the transistor 100h illustrated in FIG. 15C, the method for forming the oxide semiconductor film 111 described in Embodiment 1 and/or Embodiment 2 can be used as appropriate.

The structures, methods, and the like described in this embodiment can be used in appropriate combination with any of the structures, methods, and the like described in the other embodiments and examples.

Embodiment 4

Described in this embodiment are defects included in an oxide semiconductor film in a transistor and an oxide insulating film in contact with the oxide semiconductor film, and the deterioration of transistor characteristics.

<1. $NO_x$>

First, nitrogen oxide (hereinafter NON; x is greater than or equal to 0 and less than or equal to 2, preferably greater than or equal to 1 and less than or equal to 2) contained in the oxide insulating film in contact with the oxide semiconductor film is described.

<1-1. Transition Level of $NO_x$ in Oxide Insulating Film>

First, transition levels of point defects in a solid are described. A transition level shows the charge state of impurities or defects (hereinafter referred to as a defect D) forming a state in a gap, and is calculated from the formation energy of defects. In other words, a transition level is similar to a donor level or an acceptor level.

The relationship between formation energy and transition levels of the charge state of the defect D is described. The formation energy of the defect D depends on the charge state and also depends on the Fermi energy. Note that $D^+$ represents a state in which a defect releases one electron, $D^-$ represents a state in which a defect traps one electron, and $D^0$ represents a state in which no electron is transferred.

Figure 16A:
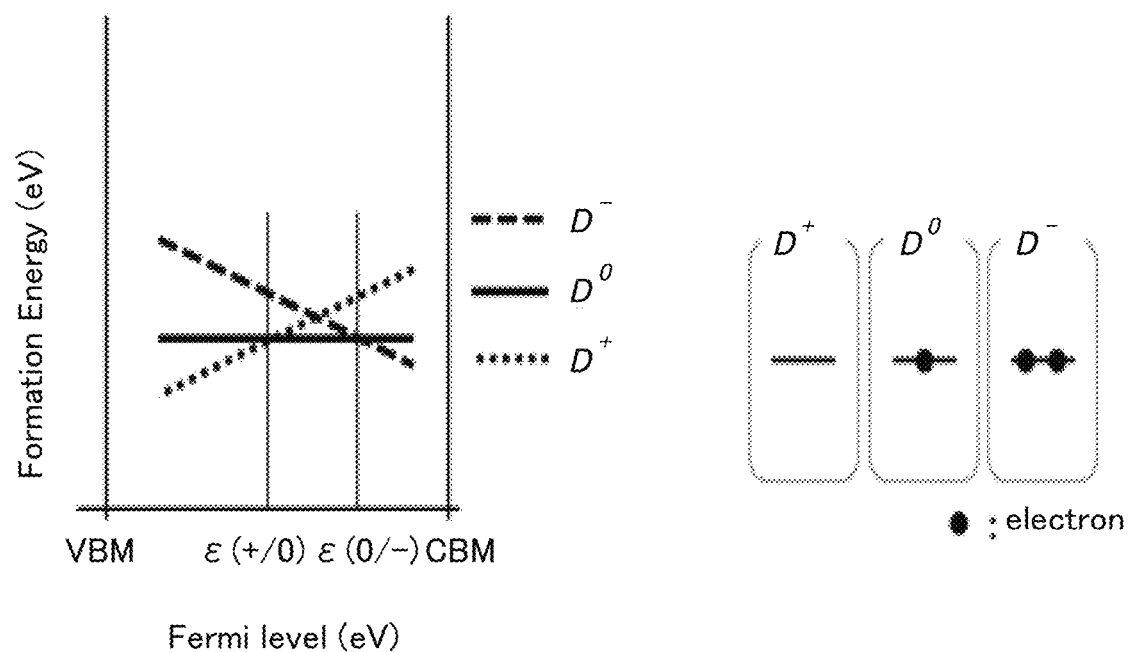
FIGS. 16A and 16B illustrate the relationship between formation energy and transition levels, and the electron configurations of defects.
Figure 16B:
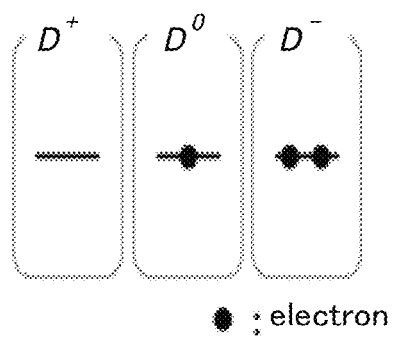

FIG. 16A illustrates the relationship between the formation energy and the transition level of each of the defects $D^+$, $D^0$, and $D^-$. FIG. 16B illustrates electron configurations of the defects $D^+$, $D^0$, and $D^-$ in the case where the defect D in a neutral state has an orbit occupied by one electron.

Figure 17:
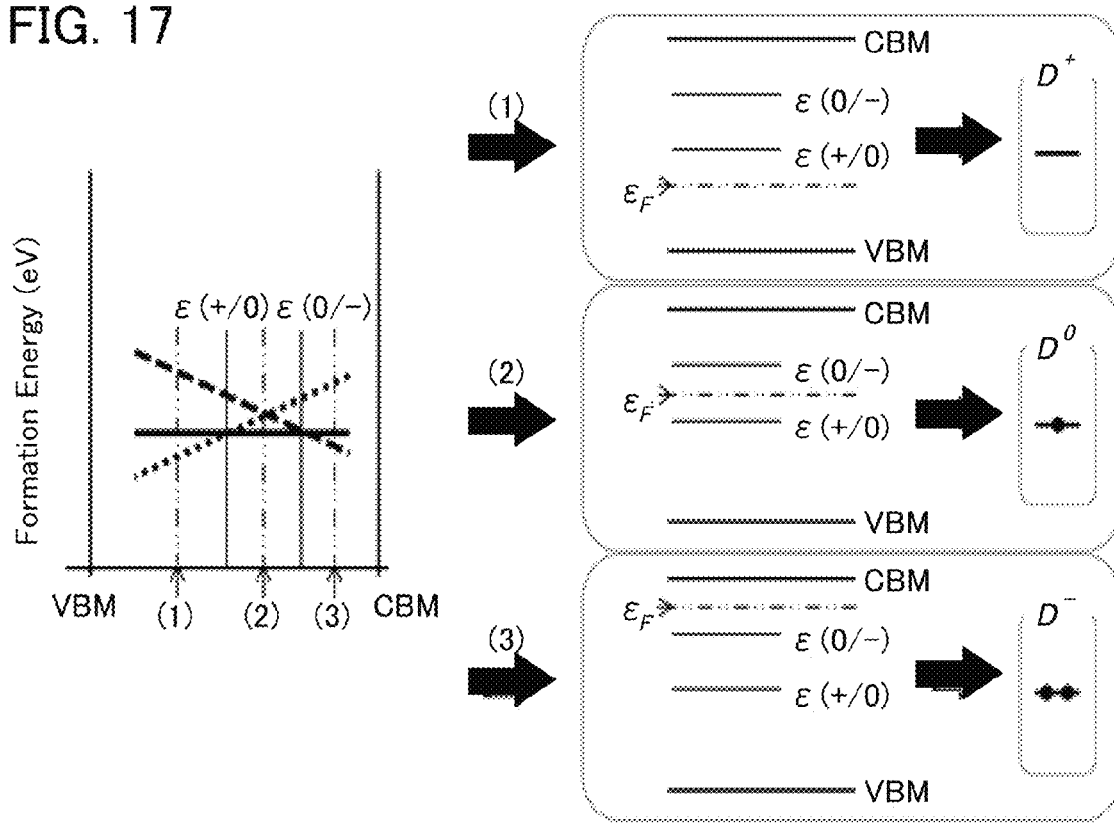
FIG. 17 illustrates a change in the Fermi level and a change in the charge states of defects.

In FIG. 16A, the dotted line indicates the formation energy of the defect $D^+$, the solid line indicates the formation energy of the defect $D^0$, and the dashed line indicates the formation energy of the defect $D^-$. The transition level means the position of the Fermi level at which the formation energies of the defects D having different charge states become equal to each other. The position of the Fermi level at which the formation energy of the defect $D^+$ becomes equal to that of the defect $D^0$ (that is, a position at which the dotted line and the solid line intersect) is denoted by $\in(+/0)$, and the position of the Fermi level at which the formation energy of the defect $D^0$ becomes equal to that of the defect $D^-$ (that is, a position at which the solid line and the dashed line intersect) is denoted by $\in(0/-)$ FIG. 17 is a conceptual diagram showing transition of charge states of a defect that are energetically stable when the Fermi level is changed. In FIG. 17, the dashed double-dotted line indicates the Fermi level. Right views of FIG. 17 are band diagrams of (1), (2), and (3) that indicate the Fermi level in a left view of FIG. 17.

By finding out the transition level of a solid, it is qualitatively known that which charge state allows a defect to be energetically stable at each of the Fermi levels when the Fermi level is used as a parameter.

As a typical example of the oxide insulating film in contact with the oxide semiconductor film, a silicon oxynitride (SiON) film was used, and the defect level in the silicon oxynitride film and an ESR signal attributed to the defect level were examined by calculation. Specifically, models in which $NO_2$, $N_2O$, NO, and an N atom were introduced into the respective silicon oxide (Sift) were formed, and the transition levels thereof were examined to verify whether $NO_2$, $N_2O$, NO, and an N atom introduced into silicon oxide serve as electron traps of the transistor.

Figure 18:
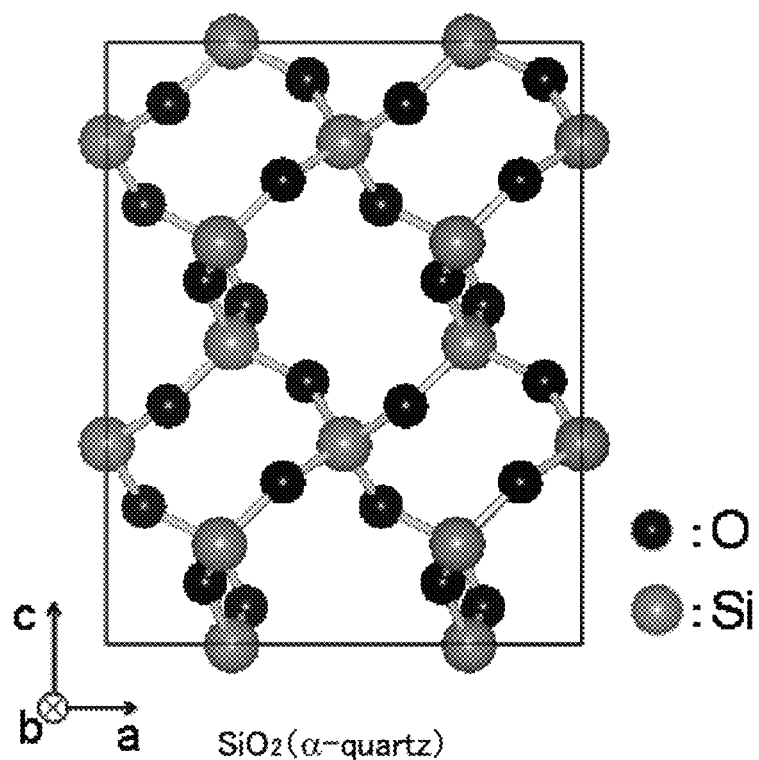
FIG. 18 shows a crystalline model of $c\text{-}SiO_2$.

In calculation, Sift ($c-SiO_2$) with a low-temperature quartz ($\alpha$-quartz) crystal structure was used as a model. A crystal model of $c-SiO_2$ without defects is shown in FIG. 18.

First, structure optimization calculation was performed on a model including 72 atoms, particularly on the lattice constants and the atomic coordinates. The model was obtained by doubling the unit cells in all axis direction of $c-SiO_2$. In the calculation, first principles calculation software VASP (the Vienna Ab initio Simulation Package) was used. The effect of inner-shell electron was calculated by a projector augmented wave (PAW) method, and as a functional, Heyd-Scuseria-Ernzerhof (HSE) DFT hybrid factor (HSE06) was used. The calculation conditions are shown below.

TABLE 1

| Software | VASP |
|---|---|
| Pseudopotential | PAW method |
| Functional | HSE06 |
| Mixing ratio of exchange term | 0.4 |
| Cut-off energy | 800 eV |
| k-point | 1 × 1 × 1 (optimization) |
| | 2 × 2 × 2 (total energy) |

The band gap of c-SiO$_2$ model after the structure optimization was 8.97 eV that is close to the experimental value, 9.0 eV.

Next, the structure optimization calculation was performed on the above c-SiO$_2$ models where NO$_2$, N$_2$O, NO, and an N atom were introduced into spaces (interstitial sites) in respective crystal structures. The structure optimization calculation was performed on each model with respect to the following three cases: a case where the whole model is positive monovalent (charge: +1); a case where the whole model is electrically neutral (zerovalent) (charge: neutral); and a case where the whole model is negative monovalent (charge: −1). Note that the charges imposed on the whole model, which were in the ground state of electrons, were localized in defects including NO$_2$, N$_2$O, NO, and an N atom.

Figure 19:
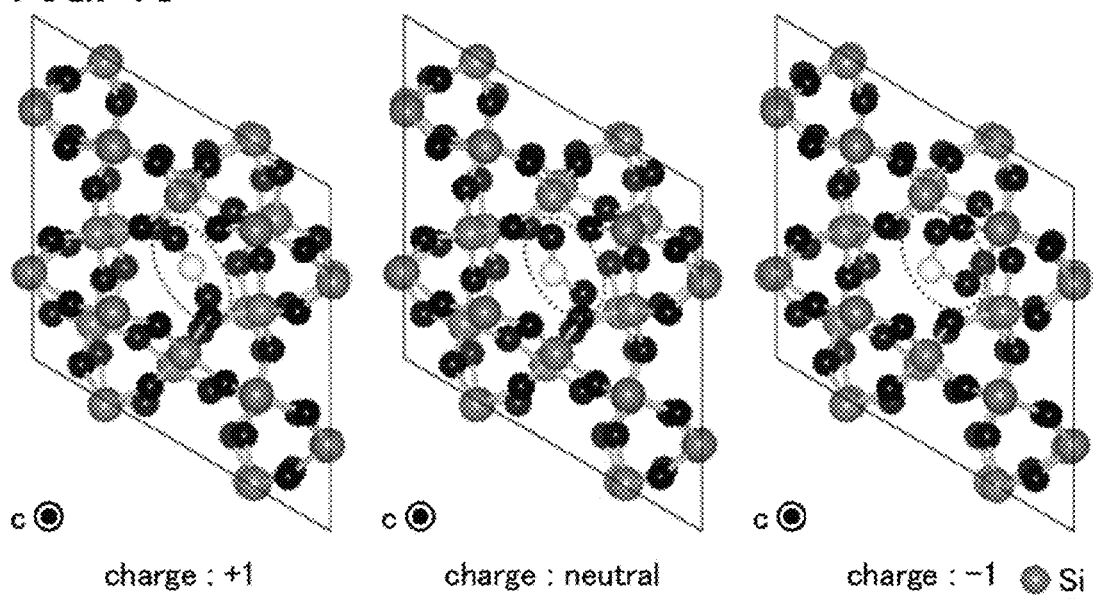
FIG. 19 shows a model in which $NO_2$ is introduced into an interstitial site of a $c\text{-}SiO_2$ model.

As for the model in which NO$_2$ was introduced into an interstitial site in the c-SiO$_2$ model, a structure after the structure optimization calculation was performed and structural parameters of an NO$_2$ are shown in FIG. 19. In FIG. 19, structural parameters of an NO$_2$ molecule in a gaseous state are also shown as a reference example.

Note that the molecule that is not electrically neutral is frequently called a molecular ion; however, unlike a gaseous state, it is difficult to quantitate the valence of molecule because the molecular discussed here is one introduced inside a crystal lattice. Thus, a molecule that is not electrically neutral is called molecular for convenience.

FIG. 19 shows that when an NO$_2$ molecule is introduced, the NO$_2$ molecule tends to be in a linear arrangement in the case where the charge of the model is +1. FIG. 19 also shows that the angle of the O—N—O bond of the model whose charge is −1 is smaller than that of the model whose charge is neutral, and the angle of the O—N—O bond of the model whose charge is neutral is smaller than that of the model whose charge is +1. This structure change in the NO$_2$ molecule is almost equal to a change in the bonding angle when the charge number of isolated molecules in a gas phase varies. Thus, it is suggested that almost the assumed charges are attributed to the NO$_2$ molecule, and the NO$_2$ molecule in SiO$_2$ probably exists in a state close to an isolated molecule.

Figure 20:
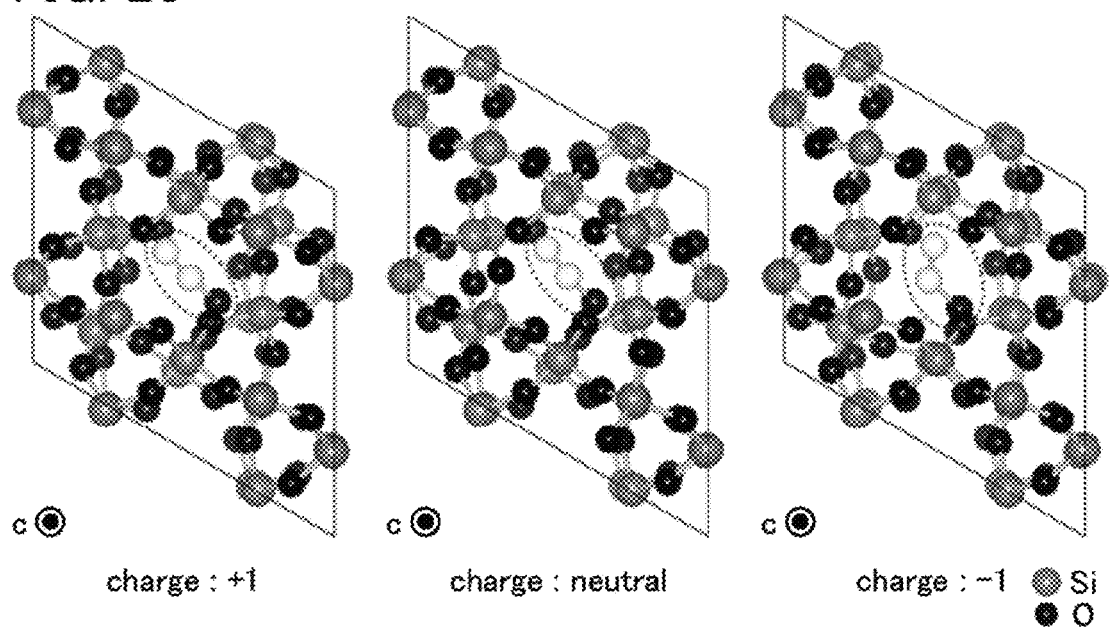
FIG. 20 shows a model in which $N_2O$ is introduced into an interstitial site of a $c\text{-}SiO_2$ model.

Next, as for the model in which an N$_2$O molecule was introduced into an interstitial site in the c-SiO$_2$ model, a structure after the structure optimization calculation was performed and structural parameters of the N$_2$O molecule are shown in FIG. 20. In FIG. 20, structural parameters of the N$_2$O molecule in a gaseous state are also shown as a reference example.

According to FIG. 20, in the case where the charge of the model is +1 and the case where the charge is neutral, the structures of the N$_2$O molecules are both in a linear arrangement, which means the N$_2$O molecules of two cases have almost the same structure. In contrast, in the case where the charge of the model is −1, the N$_2$O molecule has a bent shape, and the distance between N and O is longer than that of the above two cases. This conceivable reason is that an electron enters the LUMO level that is π* orbital of the N$_2$O molecule.

Figure 21:
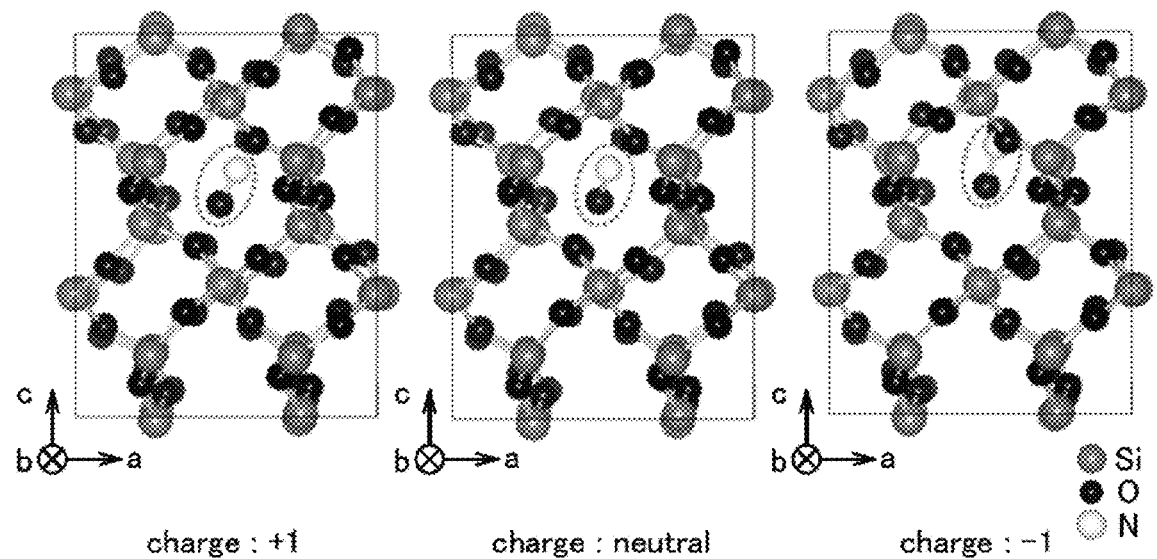
FIG. 21 shows a model in which NO is introduced into an interstitial site of a $c\text{-}SiO_2$ model.

Next, as for the model in which an NO molecule was introduced into an interstitial site in the c-SiO$_2$ model, a structure after the structure optimization calculation was performed and structural parameters of the NO molecule are shown in FIG. 21.

According to FIG. 21, the distance between N and O is short in the case where the charge of the model is +1, and the distance between N and O is long in the case where the charge of the model is −1. This tendency is probably caused by the following reason. In the case where the charge of the NO molecule in a gaseous state is +1, the bond order of the N—O bond is 3.0; in the case where the charge of the NO molecule in a gaseous state is 0, the bond order is 2.5; and in the case where the charge of the NO molecule in a gaseous state is −1, the bond order is 2.0. Thus, the bond order is the largest when the charge is +1. Therefore, the NO molecule in SiO$_2$ is considered to exist stably in a state close to the isolated molecule.

Figure 22:
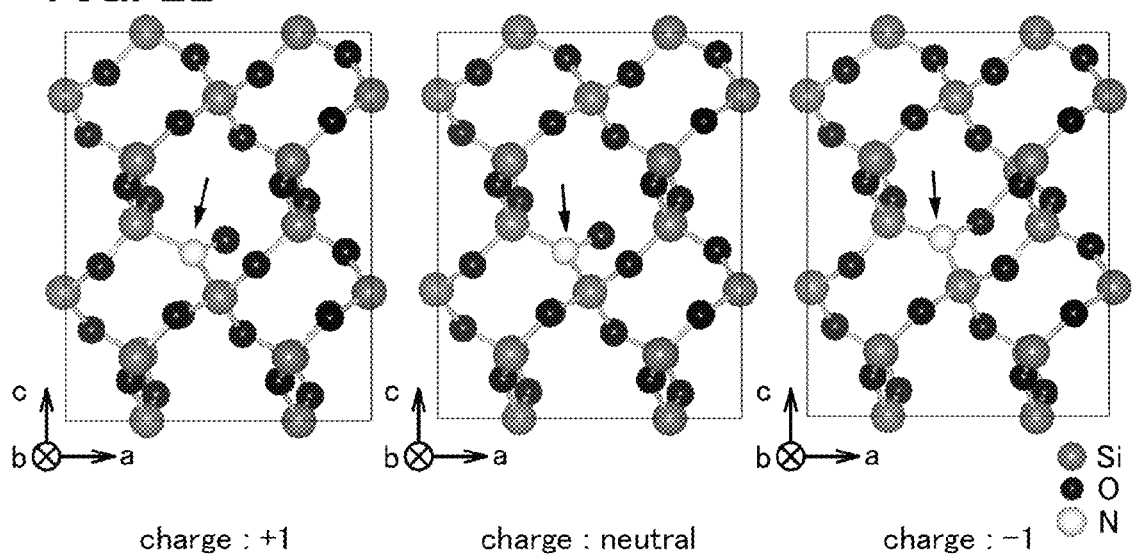
FIG. 22 shows a model in which an N atom is introduced into an interstitial site of a c-SiO$_2$ model.

Then, as for the model in which an N atom was introduced into an interstitial site in the c-SiO$_2$ model, a structure after the structure optimization calculation was performed is shown in FIG. 22.

According to FIG. 22, in either charge state, the N atom that is bonded to atoms in SiO$_2$ is more stable in terms of energy than the N atom that exists as an isolated atom in an interstitial site.

Next, the calculation of a transition level was performed on each model.

The transition level ∈(q/q') for transition between the charge q state and the charge q' state in a model having defect D in its structure can be calculated with Formula 1.

$$\varepsilon(q/q') = \frac{\Delta E^q - \Delta E^{q'}}{q' - q} \quad \text{[Formula 1]}$$

$$\Delta E^q = E_{tot}(D^q) - E_{tot}(\text{bulk}) + \sum_i n_i \mu_i + q(\varepsilon_{VBM} + \Delta V_q + E_f)$$

In the above formula, $E_{tot}(D^q)$ represents the total energy in the model having defect D of the charge q, $E_{tot}(\text{bulk})$ represents the total energy in a model without defects, $n_i$ represents the number of atoms i contributing to defects, $\mu_i$ represents the chemical potential of atom i, $\varepsilon_{VBM}$ represents the energy of the valence band maximum in the model without defects, $\Delta V_q$ represents the correction term relating to the electrostatic potential, and $E_f$ represents the Fermi energy.

Figure 23:
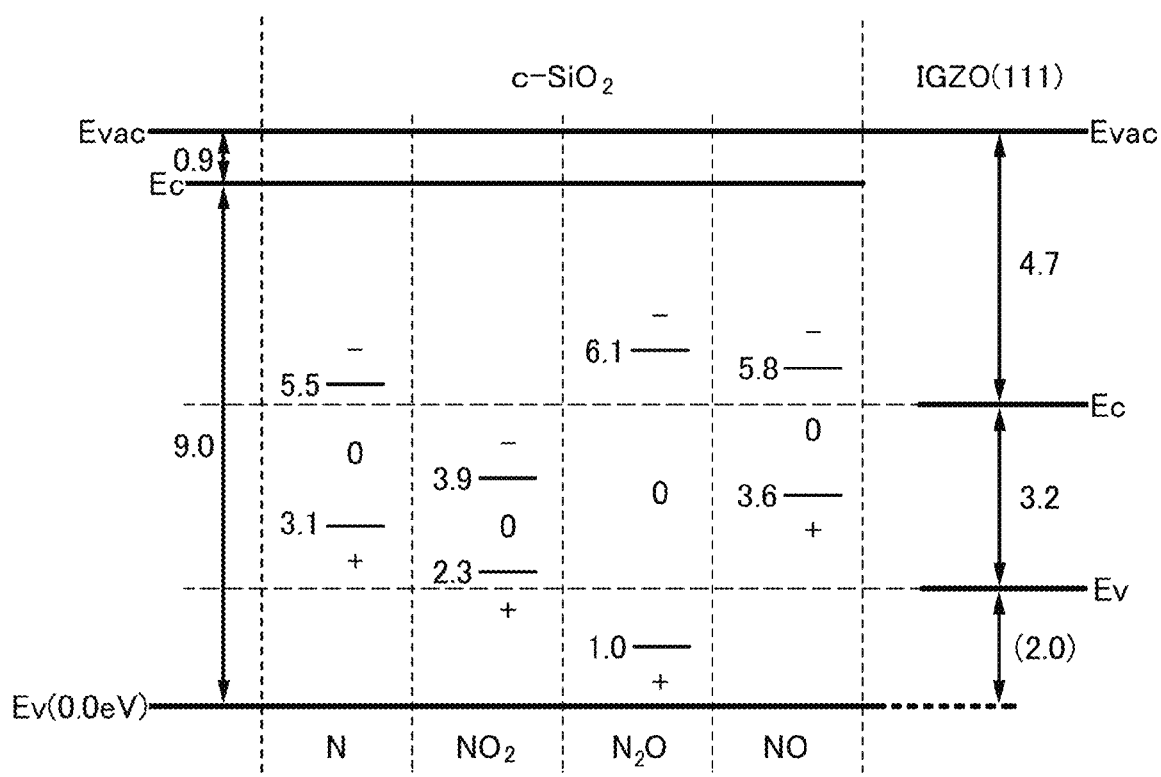
FIG. 23 is a band diagram.

FIG. 23 is a band diagram showing the transition levels obtained from the above formula. As the oxide semiconductor film, an In—Ga—Zn oxide film (hereinafter referred to as IGZO(111)) formed using metal oxide having an atomic ratio of In:Ga:Zn=1:1:1 is used. In FIG. 23, a band diagram of the IGZO(111) is shown in addition to the band diagrams of the above four models. The unit of the values in FIG. 23 is "eV".

In FIG. 23, the value of each transition level indicates a value obtained when the valence band maximum of SiO$_2$ is considered as a base (0.0 eV). Although a reference value was used as an electron affinity of SiO$_2$ here, the practical positional relation of the bands in the case where SiO$_2$ is bonded to the IGZO(111) is affected by the electron affinity of SiO$_2$ in some cases.

Hereinafter, the transition level that transits between a state where the charge of the model is +1 and a state where the charge of the model is 0 is referred to as (+/0), and the transition level that transits between a state where the charge of the model is 0 and a state where the charge of model is −1 is referred to as (0/−).

According to FIG. 23, in the model in which an $NO_2$ molecule was introduced into $SiO_2$, two transition levels of (+/0) and (0/−) exist at the positions within the band gap of the IGZO(111), which suggests that the $NO_2$ molecule may relate to trap and detrap of electrons. In both a model in which an NO molecule was introduced into $SiO_2$ and a model in which an N atom was introduced into $SiO_2$, the transition level of (+/0) exists at a position within the band gap of the IGZO(111). In contrast, the transition level of the model in which an $N_2O$ molecule was introduced into $SiO_2$ exists outside of the band gap of the IGZO(111), and the $N_2O$ molecules probably exist stably as neutral molecules regardless of the position on the Fermi level.

The above results strongly suggest that interstitial molecules containing nitrogen, which relate to trap and detrap of electrons and is a factor causing a shift of the threshold voltage of a transistor in the positive direction, have the transition level at a position closer to the conduction band within the band gap of the IGZO(111). Here, a molecule having a transition level at a position closer to the conduction band in the band gap of the IGZO(111) is probably an $NO_2$ molecule or an NO molecule, or both.

1-2. Examination of ESR Signal

Following the calculation results of the transition level, ESR signals of $NO_2$ molecules were calculated. In addition, a model in which an N atom substituted for an O atom in $SiO_2$ was examined in a manner similar to that of the above case.

In this case, an N atom has seven electrons, and an O atom has eight electrons; in other words, an electron structure of the $NO_2$ molecule has an open shell. Thus, the neutral $NO_2$ molecule has a lone electron, and can be measured by ESR. In the case where an N atom substitutes for an O atom in $SiO_2$, only two Si atoms exist around an N atom and the N atom includes a dangling bond. Thus, the case can also be measured by ESR. Furthermore, $^{14}N$ has only one nuclear spin, and a peak of ESR signal relating to $^{14}N$ is split into three. At this time, the split width of ESR signal is a hyperfine coupling constant.

Figure 24A:
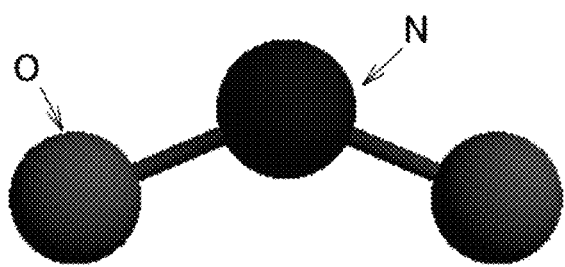
FIGS. 24A and 24B each show a model of a cluster structure.
Figure 24B:
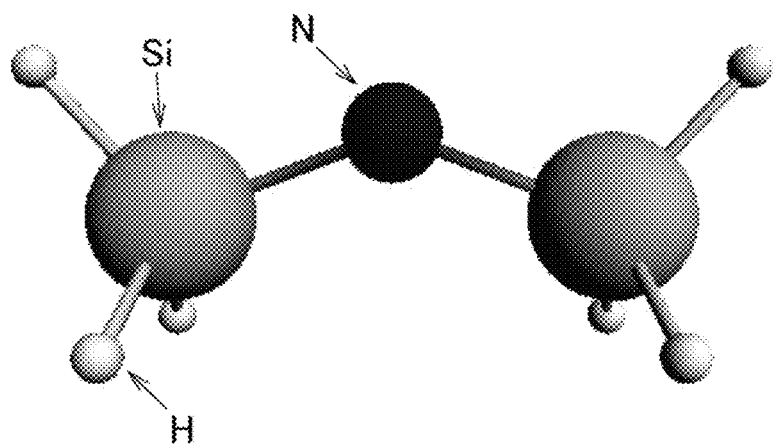

Thus, calculation was performed to examine whether split of an ESR signal of the oxide insulating film into three is caused by the $NO_2$ molecule or the N atom that replaces an O atom in $SiO_2$. When an $SiO_2$ crystal structure is used as a model, the amount of calculation is enormous. Thus, in this case, two kinds of models of cluster structures as shown in FIGS. 24A and 24B were used, the structure optimization was performed on these models, and then, g-factors and hyperfine coupling constants were calculated. FIG. 24A shows a model of an $NO_2$ molecule in a neutral state, and FIG. 24B shows a cluster model including an Si—N—Si bond. Note that the model shown in FIG. 24B is a cluster model in which a dangling bond of an Si atom is terminated with an H atom.

Amsterdam density functional (ADF) software was used for structure optimization of the models and calculation of the g-factors and hyperfine coupling constants of the models whose structures were optimized. In the structure optimization of the models and the calculation of the g-factors and hyperfine coupling constants of the models whose structures were optimized, "GGA:BP" was used as a functional, and "QZ4P" was used as a basic function, and "None" was used as Core Type. In addition, in the calculation of the g-factors and hyperfine coupling constants, "Spin-Orbit" was considered as a relativistic effect, and as a calculation method of ESR/EPR, "g & A-Tensor (full SO)" was employed. The calculation conditions are as follows.

TABLE 2

| Software | ADF |
|---|---|
| Basis function | QZ4P |
| Functional | GGA-BP |
| Core Type | None |
| Relativistic Effect | Spin-Orbit |
| Calculation method of ESR/EPR | g & A-Tensor (full SO) |

As a result of structure optimization, in the case of the $NO_2$ molecule shown in FIG. 24A, the bonding distance of the N—O bond was 0.1205 nm, and the angle of the O—N—O bond was 134.1°, which were close to experimental values of the $NO_2$ molecule (the bonding distance: 0.1197 nm, and the bonding angle 134.3°). In the case of the Si—N—Si cluster model shown in FIG. 24B, the bonding distance of Si—N was 0.172 nm and the angle of the Si—N—Si bond was 138.3°, which were almost the same as the bonding distance of Si—N (0.170 nm) and the angle of the Si—N—Si bond) (139.0° in the structure that had been subjected to structure optimization by first principles calculation in a state where an N atom substitutes for an O atom in the $SiO_2$ crystal.

The calculated g-factors and hyperfine coupling constants are shown below.

TABLE 3

| | g-factor | | | | Hyperfine coupling constant [mT] | | | |
|---|---|---|---|---|---|---|---|---|
| | g_x | g_y | g_z | g (average) | A_x | A_y | A_z | A (average) |
| $NO_2$ | 2.0066 | 1.9884 | 2.0014 | 1.9988 | 4.54 | 4.49 | 6.53 | 5.19 |
| Si—N—Si | 2.0021 | 2.0174 | 2.0056 | 2.0084 | 3.14 | −0.61 | −0.62 | 0.64 |

Figure 45A:
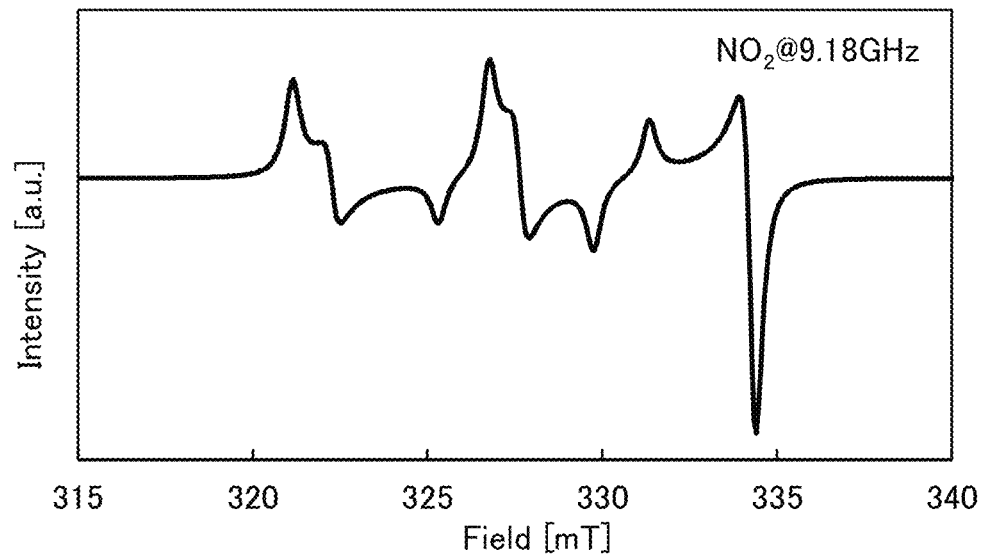
FIGS. 45A and 45B show ESR spectra of NO$_2$ and Si—N—Si.
Figure 45B:
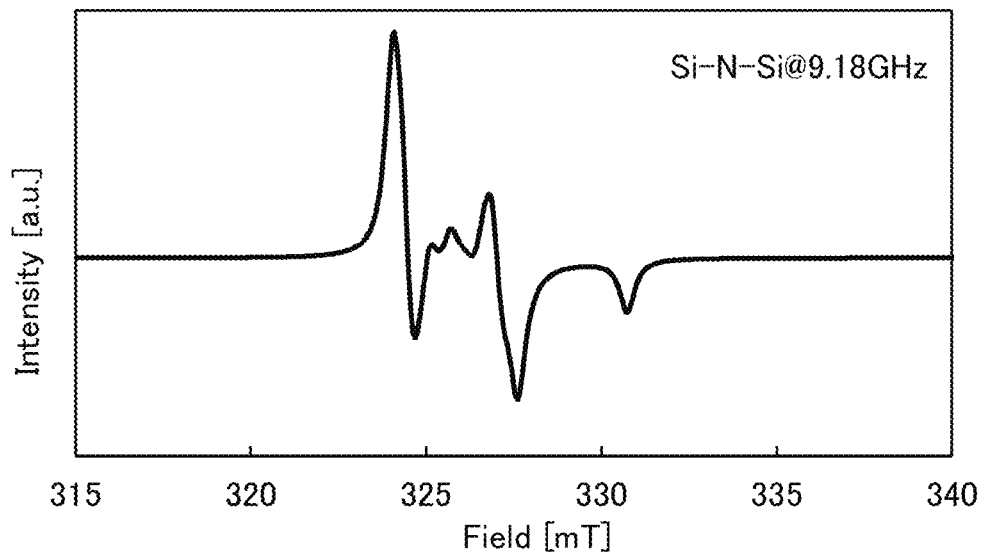

As described above, the hyperfine coupling constant A corresponds the distance between the ESR signals (or the split width of a peak). According to Table 3, the average value of the hyperfine coupling constant A of the $NO_2$ molecule is approximately 5 mT. In the case of the Si—N—Si cluster model, only A_x in the hyperfine coupling constants A is a positive value, which is approximately 3 mT. FIG. 45A and FIG. 45B show the ESR spectra of $NO_2$ and Si—N—Si, respectively, which are calculated from the g-factor and the hyperfine coupling constant A.

According to this result, the ESR spectrum that has three signals, a hyperfine structure constant of approximately 5 mT, and a g-factor of approximately 2, which are obtained by ESR measurement using an X-band, is obtained probably because of an $NO_2$ molecule in an $SiO_2$ crystal. Among three signals, the g-factor of the medium signal is approximately 2.

<1-3. Consideration of Deterioration Mechanism of Transistor>

A mechanism of a phenomenon in which the threshold voltage of a transistor is shifted in the positive direction when a positive gate BT stress test (+GBT) is performed is considered below based on the above results.

Figure 25:
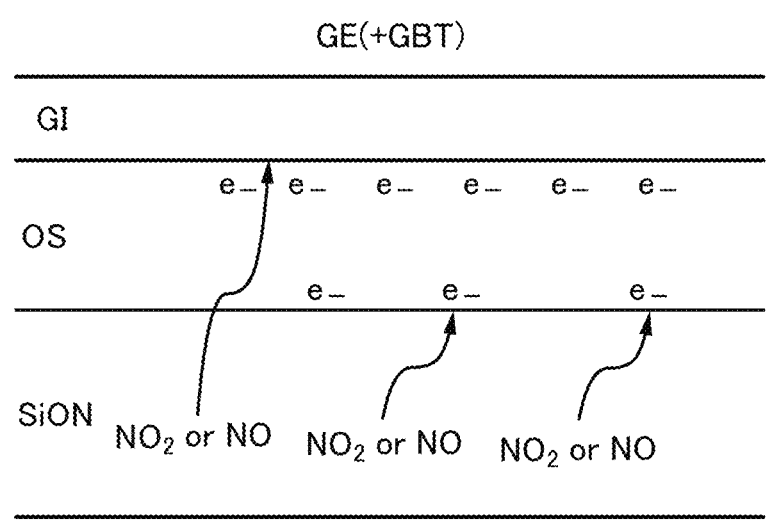
FIG. 25 shows a mechanism of a phenomenon in which the threshold voltage of a transistor is shifted in the positive direction.

The mechanism is considered with reference to FIG. 25. FIG. 25 illustrates a structure in which a silicon oxynitride film (SiON film), an oxide semiconductor film (OS), a gate insulating film (GI), and a gate (GE) are stacked in this order. Here, a case where the silicon oxynitride film SiON that is positioned on the back channel side of the oxide semiconductor film (OS) contains nitrogen oxide is described.

First, when the positive gate BT stress test (+GBT) is performed on the transistor, the electron densities of the gate insulating film GI side and the silicon oxynitride film SiON side of the oxide semiconductor film OS become higher. In the oxide semiconductor film OS, the silicon oxynitride film SiON side has a lower electron density than the gate insulating film GI side. When an $NO_2$ molecule or an NO molecule contained in the silicon oxynitride film SiON is diffused into the interface between the gate insulating film GI and the oxide semiconductor film OS and the interface between the oxide semiconductor film OS and the silicon oxynitride film SiON, electrons on the gate insulating film GI side and the back channel side that are induced by the positive gate BT stress test (+GBT) are trapped. As a result, the trapped electrons remain in the vicinity of the interface between the gate insulating film GI and the oxide semiconductor film OS and the interface between the oxide semiconductor film OS and the silicon oxynitride film SiON; thus, the threshold voltage of the transistor is shifted in the positive direction.

That is, a lower concentration of nitrogen oxide contained in the silicon oxynitride film in contact with the oxide semiconductor film can suppress a change in the threshold voltage of the transistor. Here, as specific examples of the silicon oxynitride film in contact with the oxide semiconductor film, the protective film in contact with the back channel side, the gate insulating film, and the like can be given. By providing the silicon oxynitride film containing an extremely small amount of nitrogen oxide in contact with the oxide semiconductor film, the transistor can have excellent reliability.

Embodiment 5

<Structure of Oxide Semiconductor>

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 47A:
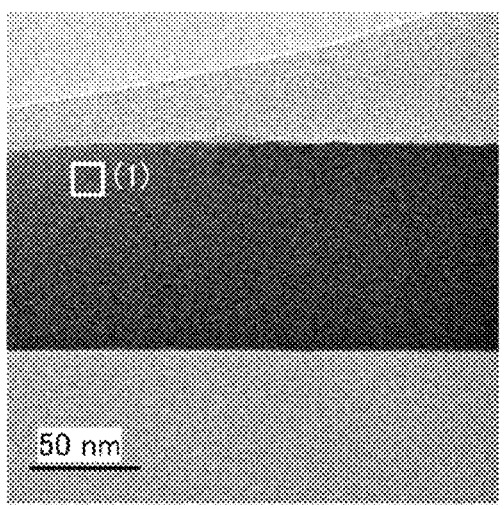
FIGS. 47A to 47D are Cs-corrected high-resolution TEM images of a cross section of a CAAC-OS and a cross-sectional schematic view of the CAAC-OS.

A CAAC-OS observed with TEM will be described below FIG. 47A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 47B:
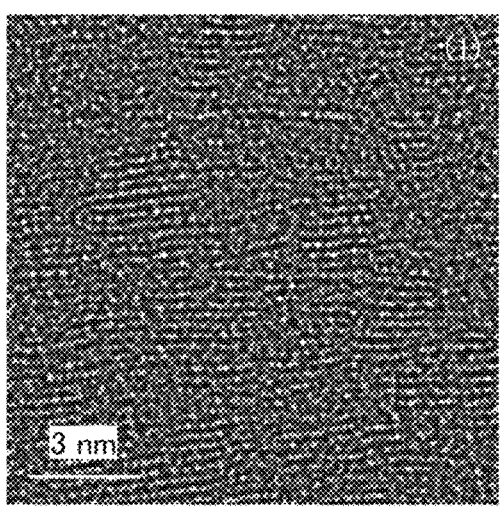

FIG. 47B is an enlarged Cs-corrected high-resolution TEM image of a region (1) in FIG. 47A. FIG. 47B shows that metal atoms are arranged in a layered manner in a pellet. Each metal atom layer has a configuration reflecting unevenness of a surface over which a CAAC-OS film is formed (hereinafter, the surface is referred to as a formation surface a top surface of the CAAC-OS film, and is arranged parallel to the formation surface or the top surface of the CAAC-OS film.

Figure 47C:
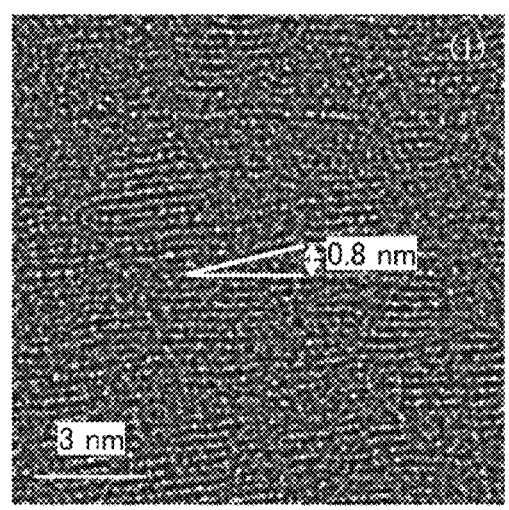

As shown in FIG. 47B, the CAAC-OS has a characteristic atomic arrangement. The characteristic atomic arrangement is denoted by an auxiliary line in FIG. 47C. FIGS. 47B and 47C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 47D:
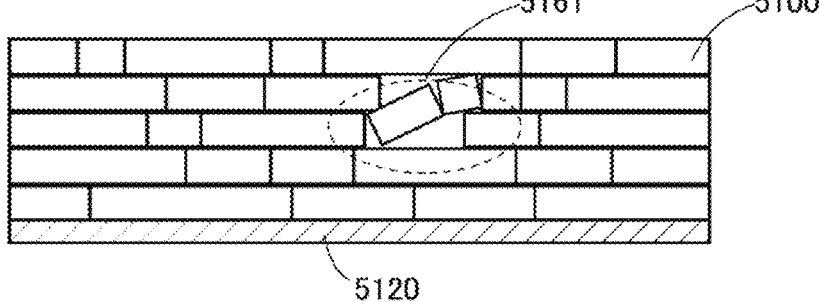

Here, according to the Cs-corrected high-resolution TEM images, the schematic arrangement of pellets 5100 of a CAAC-OS over a substrate 5120 is illustrated by such a structure in which bricks or blocks are stacked (see FIG. 47D). The part in which the pellets are tilted as observed in FIG. 47C corresponds to a region 5161 shown in FIG. 47D.

FIG. 48A shows a Cs-corrected high-resolution TEM image of a plane of the CAAC-OS observed from a direction substantially perpendicular to the sample surface. FIGS.

48B, 48C, and 48D are enlarged Cs-corrected high-resolution TEM images of regions (1), (2), and (3) in FIG. 48A, respectively. FIGS. 48B, 48C, and 48D indicate that metal atoms are arranged in a triangular, quadrangular, or hexagonal configuration in a pellet. However, there is no regularity of arrangement of metal atoms between different pellets.

Figure 49A:
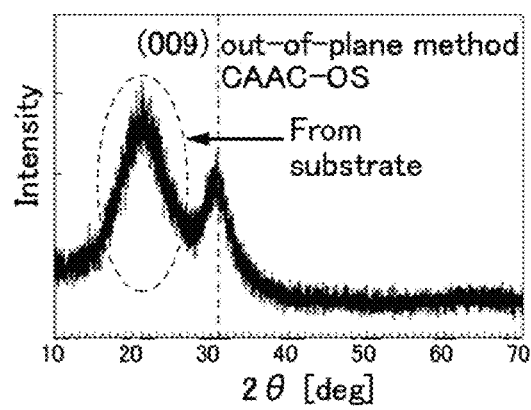
FIGS. 49A to 49C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 49A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by au out-of-plane method, a peak appear when 2θ is around 31° and that a peak not appear when 2θ is around 36°.

Figure 49B:
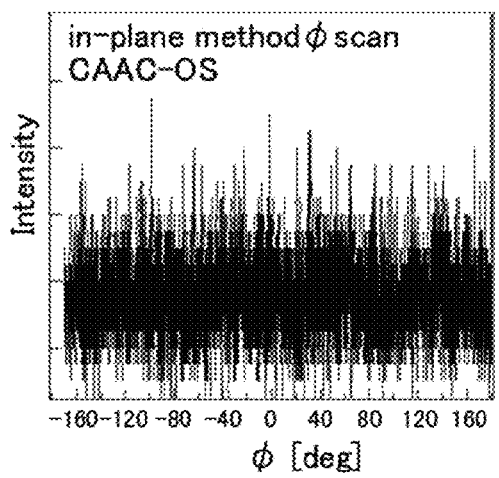
Figure 49C:
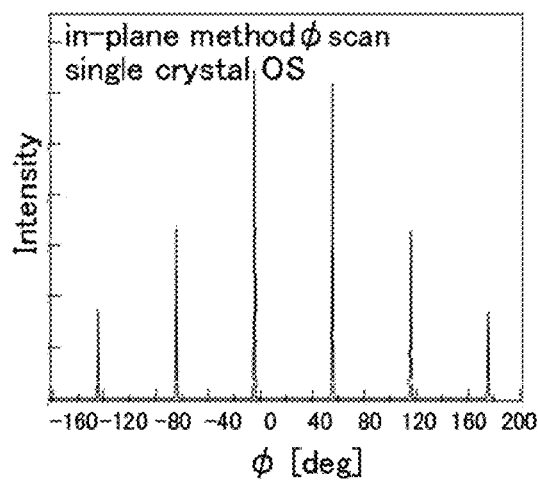

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 49B, a peak is not clearly observed. In contrast, in the case of a single crystal oxide semiconductor of $InGaZnO_4$, when φ scan is performed with 2θ fixed at around 56°, as shown in FIG. 49C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 50A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 50B shows a diffraction pattern obtained in such a manner that an electron beam with a probe diameter of 300 nm is incident on the same sample in a direction perpendicular to the sample surface. As shown in FIG. 50B, a ring-like diffraction pattern is observed. Thus, the electron diffraction also indicates that the a-axes and b-axes of the pellets included in the CAAC-OS do not have regular alignment. The first ring in FIG. 50B is considered to be derived from the (010) plane, the (100) plane, and the like of the $InGaZnO_4$ crystal. The second ring in FIG. 50B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with a low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM Image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has aperiodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 51:
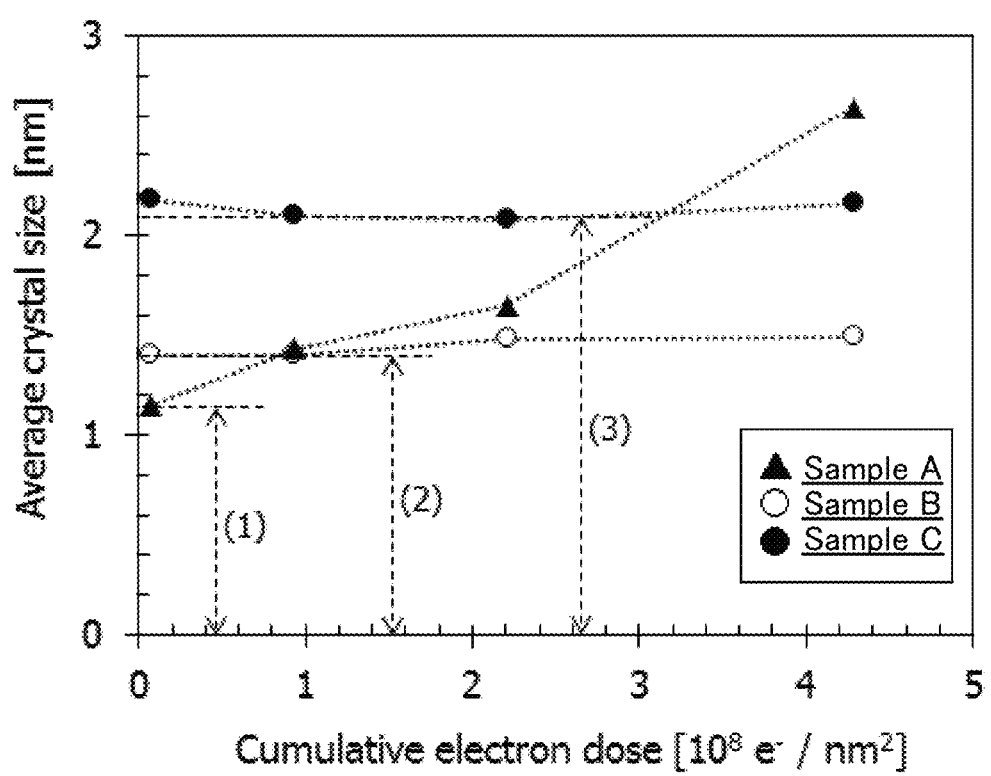
FIG. 51 shows a change in crystal part of an In—Ga—Zn oxide induced by electron irradiation.

FIG. 51 shows change in the average size of crystal parts (at 22 points to 45 points) in each sample. Note that the crystal part size corresponds to the length of a lattice fringe. FIG. 51 indicates that the crystal part size in the a-like OS increases with an increase in the cumulative electron dose. Specifically, as shown by (1) in FIG. 51, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 51, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures, methods, and the like described in this embodiment can be used in appropriate combination with any of the structures, methods, and the like described in the other embodiments and examples.

Embodiment 6

In this embodiment, an example of a semiconductor device (memory device) that includes a transistor of one embodiment of the present invention, which can hold stored data even when not powered, and which has an unlimited number of write cycles, will be described with reference to drawings.

Figure 26A:
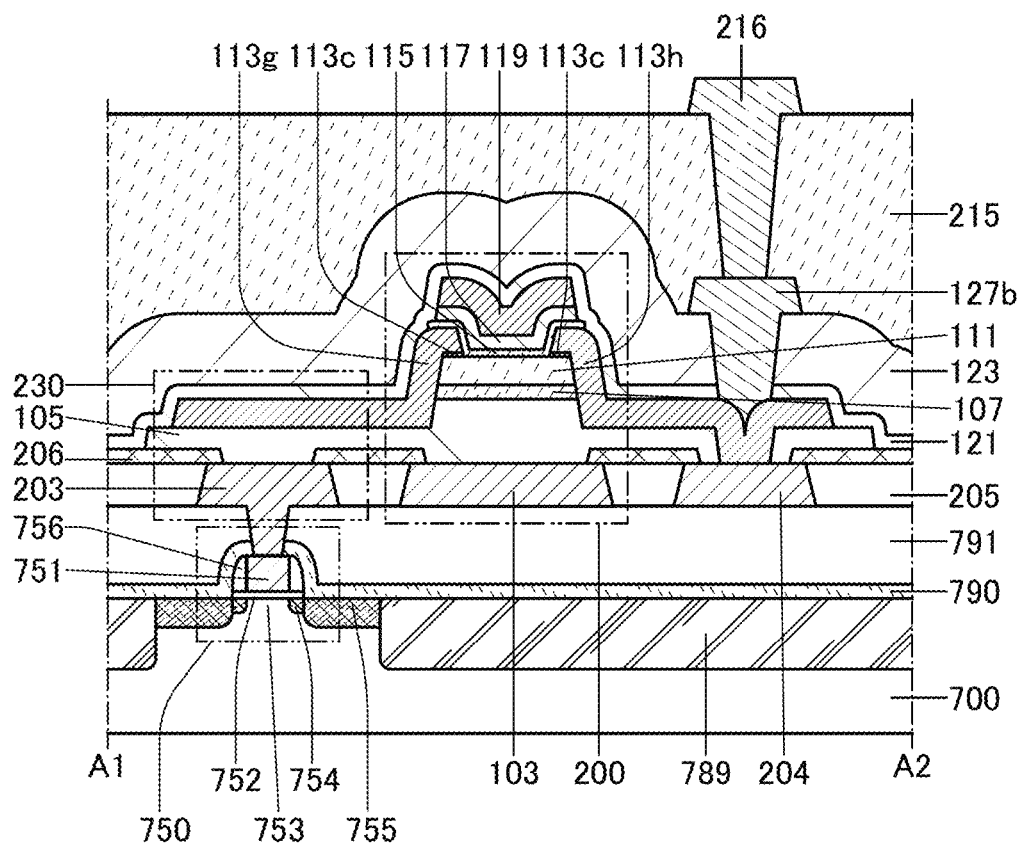
FIGS. 26A and 26B are a cross-sectional view and a circuit diagram illustrating one embodiment of a semiconductor device.
Figure 26B:
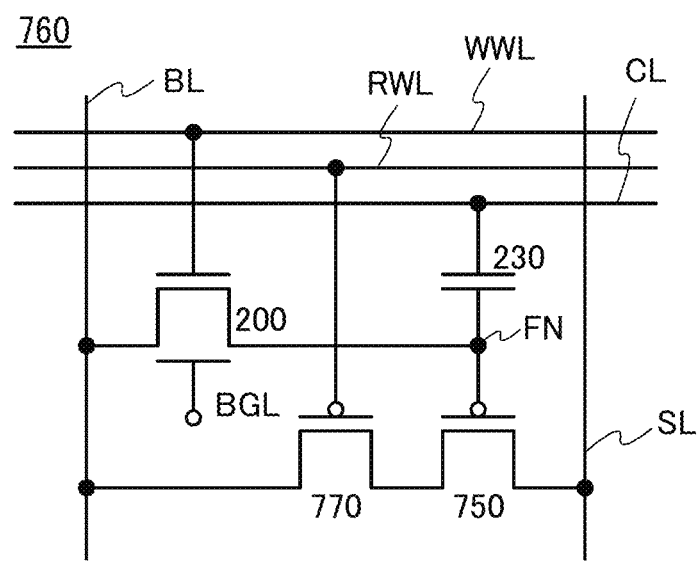

FIG. 26A is a cross-sectional view of a semiconductor device, and FIG. 26B is a circuit diagram of a memory cell 760 included in the semiconductor device.

The semiconductor device illustrated in FIGS. 26A and 26B includes a transistor 750 including a substrate 700 in a lower portion, and a transistor 200 including an oxide semiconductor and a capacitor 230 in an upper portion.

As the substrate 700, a single crystal semiconductor substrate or a polycrystalline semiconductor substrate of silicon or silicon carbide, a compound semiconductor substrate of silicon germanium, a silicon-on-insulator (SOI) substrate, or the like may be used. A transistor manufactured using a semiconductor substrate can operate at high speed easily.

In this embodiment, an example in which an n-type single crystal silicon substrate is used as the substrate 700 is described. The transistor 750 is a transistor whose channel is formed in the substrate 700. The transistor 750 includes a channel formation region 753, p-type impurity regions 754 functioning as lightly doped drain (LDD) regions or extension regions, p-type impurity regions 755 functioning as a source region and a drain region, a gate insulating film 752, and a gate electrode 751. The p-type impurity regions 755 have a higher impurity concentration than the p-type impurity regions 754. A side surface of the gate electrode 751 is provided with a sidewall insulating film 756. With the use of the gate electrode 751 and the sidewall insulating film 756 as masks, the p-type impurity regions 754 and the p-type impurity regions 755 can be formed in a self-aligned manner.

The transistor 750 is separated from other transistors 750 formed on the substrate 700 by an element separation region 789. Furthermore, an insulating film 790 and an insulating film 791 are formed over and around the gate electrode 751 and the sidewall insulating film 756.

The gate electrode 103, a conductive film 203, and a conductive film 204 are formed over the insulating film 791. Note that the conductive film 203 is connected to the gate electrode 751 of the transistor 750.

An insulating film 205 is formed between the gate electrode 103, the conductive film 203, and the conductive film 204. The insulating film 205 can be formed using a material similar to that of the gate insulating film 105 described in Embodiment 1 as appropriate.

An insulating film 206 that exposes part of the gate electrode 103, part of the conductive film 203, and part of the conductive film 204 is formed over the insulating film 205.

When an insulating film that has an effect of blocking water and hydrogen is used as the insulating film 206, water and hydrogen contained between the substrate 700 and the insulating film 206 can be prevented from diffusing into the oxide semiconductor film included in the transistor 200. As the insulating film 206, a single layer or a stacked layer including a material selected from aluminum oxide, aluminum oxynitride, silicon nitride, silicon nitride oxide, gallium oxide, germanium oxide, yttrium oxide, zirconium oxide, hafnium oxide, or tantalum oxide can be formed.

The gate insulating film 105 is formed over the gate electrode 103, the conductive film 203, the conductive film 204, and the insulating film 206. The electrode 113h, which is one of a pair of electrodes included in the transistor 200, is electrically connected to the conductive film 204 through an opening formed in the gate insulating film 105.

The transistor 200 that includes the gate electrode 103, the gate insulating film 105, the pair of electrodes 113g and 113h, and the gate electrode 119 is formed over the insulating film 791. Any of the transistors described in Embodiments 1 to 5 can be used as the transistor 200. Here, the transistor illustrated in FIG. 9 is employed as the transistor 200.

The insulating film 121 is formed over the transistor 200 and the insulating film 206. As the insulating film 121, the insulating film 121 described in Embodiment 1 can be used as appropriate.

The insulating film 123 is formed over the insulating film 121. The insulating film 123 can be formed using a material and a method similar to those of the insulating film 123 described in Embodiment 1. The plug 127b is formed in an opening formed in the insulating film 123 and the insulating film 121. The plug 127b is electrically connected to the electrode 113h.

An insulating film 215 serving as a planarization insulating film is formed over the insulating film 123 and the plug 127b. The insulating film 215 can be formed of a heat-resistant organic material, such as polyimide, acrylic, a benzocyclobutene-based resin, polyamide, or epoxy. Other than such organic materials, it is possible to use a low-dielectric constant material (a low-k material), a siloxane-based resin, PSG (phosphosilicate glass), BPSG (borophosphosilicate glass), or the like. Note that the insulating film 215 may be formed by stacking a plurality of insulating films including these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the insulating film 215, and any of the following methods can be used depending on the material: a sputtering method; an SOG method; spin coating; dipping; spray coating; a droplet discharging method (e.g., an ink-jet method); a printing method (e.g., screen printing or offset printing); or the like. When the baking step of the insulating film 215 also serves as heat treatment for another layer, a semiconductor device can be manufactured efficiently.

The insulating film 215 may be formed using a material and a method similar to those of the insulating film 123 described in Embodiment 1 and then may be subjected to CMP treatment.

A plug 216 is formed over the insulating film 215 and electrically connected to the plug 127b through an opening formed in the insulating film 215.

The gate electrode 751 is electrically connected to the conductive film 203. One of the p-type impurity regions 755 in the transistor 750 is electrically connected to a transistor 770 (see FIG. 26B), and the other thereof is electrically connected to a wiring SL (see FIG. 26B). Furthermore, the electrode 113h is electrically connected to a wiring BL (see FIG. 26B), the electrode 113g is electrically connected to a node FN (see FIG. 26B), the gate electrode 119 is electrically connected to a wiring WWL (see FIG. 26B), and the gate electrode 103 is electrically connected to a wiring BGL (see FIG. 26B).

Here, a semiconductor material of region in which a channel region of the transistor 750 is formed and a semiconductor material of a region in which a channel region of the transistor 200 is formed preferably have different band gaps. For example, in the case where an oxide semiconductor is used as the semiconductor material of the region in which the channel region of the transistor 200 is formed, it is preferable that a semiconductor material other than an oxide semiconductor be used as the semiconductor material of the region in which the channel region of the transistor 750 is formed. A transistor including a semiconductor material other than an oxide semiconductor, such as crystalline silicon, can operate at high speed more easily than a transistor including an oxide semiconductor. A transistor including an oxide semiconductor enables charges to be held for a long time owing to its electrical characteristics, that is, the low off-state current.

A transistor including crystalline silicon as a semiconductor material of a region in which a channel region of the transistor is formed can operate at higher speed than a transistor including an oxide semiconductor as a semiconductor material of a region in which a channel region is formed. By using this transistor as a reading transistor, data can be read at high speed.

Although both of the above transistors are p-channel transistors in the following description, it is needless to say that n-channel transistors can be used. Note that unless otherwise specified, the specific structure of the semiconductor device, such as a material used for the semiconductor device and the structure of the semiconductor device, need not be limited to that described here.

The transistor 200 is a transistor that includes an oxide semiconductor as a semiconductor material in a region in which a channel region is formed. Since the off-state current of the transistor 200 is low, stored data can be retained for a long period. In other words, power consumption can be sufficiently reduced because a semiconductor memory device in which refresh operation is unnecessary or the frequency of refresh operation is extremely low can be provided.

The transistor 200 and the capacitor 230 can be formed over the substrate on which the transistor 750 is formed as illustrated in FIG. 26A, which enables a higher degree of integration of the semiconductor device.

FIG. 26B is a circuit diagram of the memory cell 760. The memory cell 760 includes the transistor 200, the transistor 750, the capacitor 230, and the transistor 770.

The transistor 200 includes an oxide semiconductor film in its channel formation region. Thus, the transistor 200 has an extremely low off-state current (extremely high off-state resistance). The transistor 200 is turned on when data is written, and accordingly is also referred to as a writing transistor. The transistor 200 may be an n-channel or p-channel transistor. The following description is made on the case where the transistor 200 is an n-channel transistor.

The transistor 200 has a dual-gate structure, and one of the gates is electrically connected to the wiring WWL. The wiring WWL can function as a write word line. The other gate is connected to the wiring BGL. Note that the other gate may be always kept at a constant potential.

One of a source and a drain of the transistor 200 is electrically connected to the wiring BL. The wiring BL can function as a bit line.

The other of the source and the drain of the transistor 200 is electrically connected to one electrode of the capacitor 230. The other electrode of the capacitor 230 is electrically connected to a wiring CL. The other of the source and the drain of the transistor 200 is electrically connected to a gate of the transistor 750.

By changing the potential of the wiring CL, the potential of the gate of the transistor 750 (the node FN) is changed. The wiring CL is also referred to as a capacitor line.

The transistor 750 is a p-channel transistor. Various materials such as an oxide semiconductor and silicon can be used for a channel formation region of the transistor 750. One of a source and a drain of the transistor 750 is electrically connected to one of a source and a drain of the transistor 770. The other of the source and the drain of the transistor 750 is electrically connected to the wiring SL.

The other of the source and the drain of the transistor 770 is electrically connected to the wiring BL. A gate of the transistor 770 is electrically connected to a wiring RWL. The transistor 770 is a transistor for electrically connecting the transistor 750 and the wiring BL when data is read, and is also referred to as a selection transistor.

The wiring SL can function as a source line or a power supply line. Although the wiring SL is preferably retained at a constant potential, the potential may be changed when power is stopped or supplied.

In the memory cell 760 in FIG. 26B, data is retained as the potential of the node FN. If the transistor 200 has a sufficiently high off-state resistance, data can be retained for a very long period. Theoretically, a data retention period is determined by all capacitance between the node FN and each of the other nodes (including the capacitance of the capacitor 230) and all resistance between the node FN and each of the other nodes (including the off-state resistance of the transistor 200).

For example, when the capacitance is 30 fF and the resistance is $1 \times 10^{22} \Omega$, the time constant is 9.5 years. Accordingly, after ten years, the difference between the potential of the node FN and a reference potential is lowered to approximately 35% of the difference between the initial potential and the reference potential. Data needs to be read correctly even in such a case where the potential is lowered.

Figure 27:
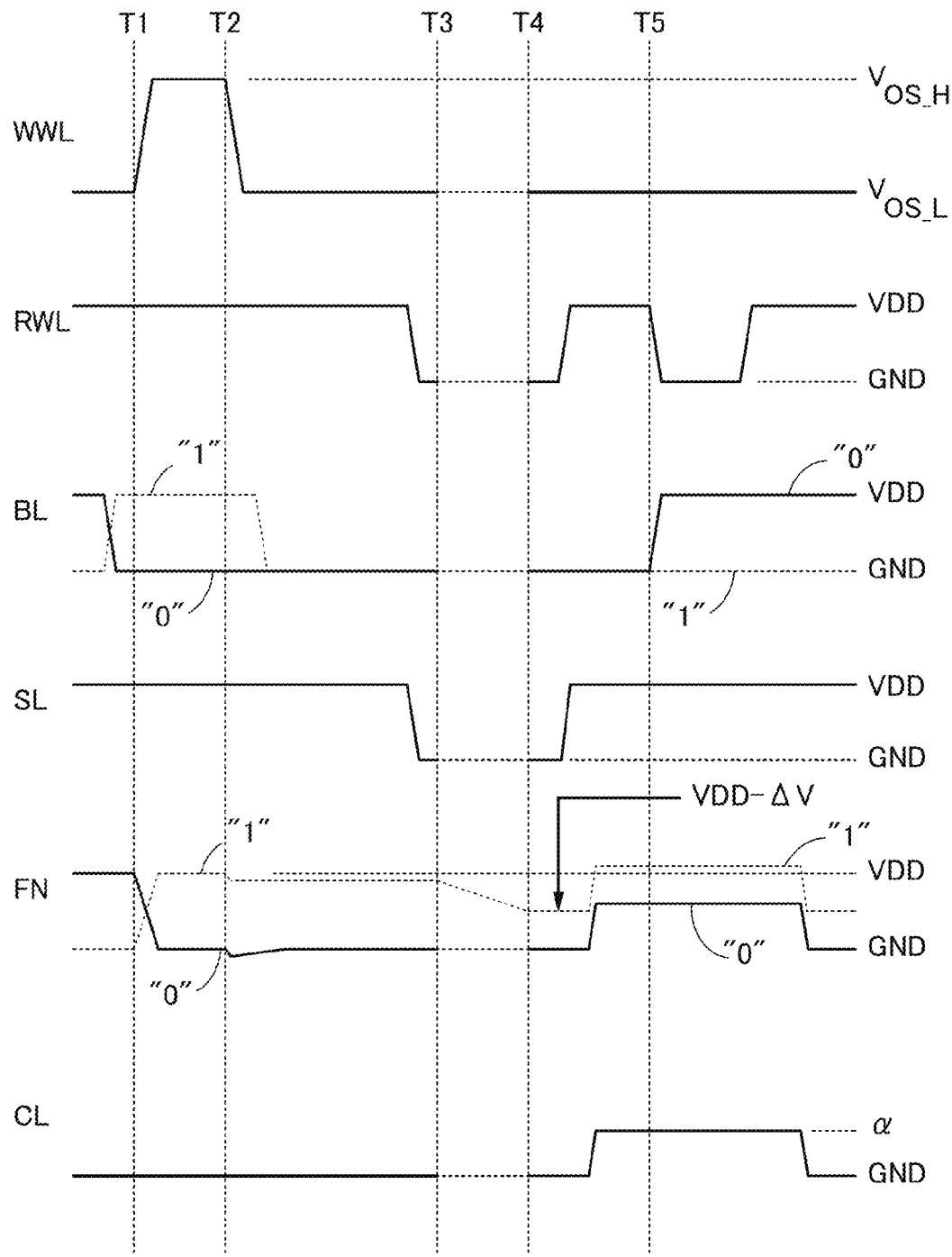
FIG. 27 illustrates a data writing operation and a data reading operation of a memory cell.

Operation for writing data to the memory cell 760 and operation for reading data from the memory cell 760 are described below with reference to FIG. 27. The threshold values of the transistors 750 and 770 are each lower than 0 and higher than −VDD.

<Writing Operation>

To write data, the potential of the wiring BL, a bit line, is set to the potential corresponding to the data when the transistor 200 is on. This method is basically the same as the method for data writing to a DRAM. The transistor 200 is different from the transistors 750 and 770 in the threshold value or the like; thus, here, when the transistor 200 is turned on, the potential of its gate (the potential of the wiring WWL) is set to $V_{OS\_H}$, and when the transistor 200 is turned off, the potential of its gate is set to $V_{OS\_L}$. Note that $V_{OS\_L}$ may be equal to GND (<VDD).

Here, when data "0" (one of two levels) is written, the potential of the wiring BL is set to GND, and when data "1" (the other of the two levels) is written, the potential of the wiring BL is set to VDD. At Time T1 in FIG. 27, the potential of the wiring WWL starts to increase, so that the transistor 200 is turned on. As a result, the node FN has a potential corresponding to data. For example, when data "0" is written, the potential of the node FN becomes GND, and when data "1" is written, the potential of the node FN becomes VDD. At Time T2, the potential of the wiring WWL starts to decrease, so that the transistor 200 is turned off, and writing is finished. When the transistor 200 is turned off, the potential of the node FN is slightly lowered by capacitive coupling between the gate of the transistor 200 (and the wiring WWL) and the node FN.

In writing, it is preferable that no current flow between the wirings BL and SL. For example, the wirings BL and SL may have no potential difference. That is, as in the case of the wiring BL, the potential of the wiring SL may be changed in accordance with data.

In a more effective method, the potential of the wiring RWL is set to a potential at which the transistor 770 is turned off. The potentials of the wirings BL and SL are each higher than or equal to GND and lower than or equal to VDD. Accordingly, when the potential of the wiring RWL is set to VDD, the transistor 770 is turned off. The potential of the wiring SL remains VDD except in the standby period in this embodiment, but may be another potential.

<Retention Operation>

When data is retained, the transistor 200 is turned off. In FIG. 27, in a period from Time T3 to Time T4, data is retained with power supply stopped (standby period). In the standby period, all the wirings have the same potential (here, GND). In the case where the potential of the node FN is higher than GND at this time, the potential of the node FN is gradually lowered.

In the case where data "0" has been written, the potential of the node FN is close to GND; thus, its change does not become a significant problem. In contrast, in the case where data "1" has been written, the potential of the node FN is close to VDD at first, but is lowered over time. The potential decrease is $\Delta V$. That is, the potential of the node FN (the potential of the gate of the transistor 750) is (VDD−$\Delta V$) after the data retention period. Under the above conditions, the potential is lowered by approximately 10% in the case where the retention period is about one year, but is lowered to 35% of the initial potential in ten years as described above. In other words, $\Delta V=0.65 \times VDD$. Here, when the potential decrease of the node FN is the largest in the period in which data retention is ensured, the potential of the node FN becomes (VDD−$\Delta V_{MAX}$).

<Reading Operation>

To read data, the potentials of the wiring BL and the wiring SL are set to different potentials, the transistor 770 is turned on, and it is determined whether current flows between the source and the drain of the transistor 750. The conduction state of the transistor 750 varies with the potential of the node FN, whereby the data that has been written can be determined.

Specifically, the potential of the wiring RWL is set to an appropriate value (here, VDD), the transistor 770 is turned off, and the potential of the wiring SL is set to VDD. After the wiring BL is precharged to an appropriate potential (here, GND), the wiring BL is brought into a floating state. Then, the potential of the wiring CL is set to an appropriate value (here, $\alpha$; note that GND<$\alpha$<VDD).

In the case where data "0" has been written, the potential of the node FN is close to GND right before this time. However, owing to the increase of the potential of the wiring CL from GND to $\alpha$, the potential of the node FN becomes almost $\alpha$ because of capacitive coupling through the capacitor 230. In the case where data "1" has been written, the potential of the node FN becomes almost (VDD−$\Delta V$+$\alpha$−GND). After that, the potential of the wiring RWL is set to an appropriate value (here, GND) at T5 to turn on the transistor 770.

In order that data is read correctly, in the case where data "0" has been written, it is required that the transistor 750 is on and the potential of the wiring BL increases from GND to VDD; in the case where data "1" has been written, it is required that the transistor 750 is off and the potential of the wiring BL remains GND.

To fulfill the requirements, the following two inequalities need to be satisfied when the threshold value of the transistor 750 is Vth: $\alpha$<VDD+Vth and VDD−$\Delta V$+$\alpha$−GND≥VDD+Vth. That is, GND+$\Delta V$+Vth≤GND+$\Delta V_{MAX}$+Vth≤$\alpha$<VDD+Vth.

For example, 0.7 [V]≤$\alpha$<1.3 [V] is satisfied when VDD=+1.8 [V], GND=0 [V], Vth=−0.5 [V], and $\Delta V_{MAX}$=1.2 [V]. Alternatively, 0.2 [V]≤$\alpha$<0.5 [V] is satisfied when VDD=+0.9 [V], GND=0 [V], Vth=−0.4 [V], and $\Delta V_{MAX}$=0.6 [V].

Note that $\alpha$ can be a given value in the required range, and a may be the average of VDD and GND (also referred to as VDD/2) or the sum of GND and the difference between VDD and GND that is divided by N (also referred to as VDD/N; note that N=3, 4, 5, . . . ). In the former case, VDD/2 is 0.9 [V]. In the latter case, VDD/3 is 0.3 [V]. Both values are in the required range.

As described above, in the case where the potential of the node FN is lowered from the initial potential by greater than or equal to 60% (in the case where the potential of the node FN is lowered to less than or equal to 40% of the initial potential) in the standby period, the potential of the node FN is preferably increased by increasing the potential of the wiring CL as appropriate in reading.

Note that although the written potential is initially VDD in the case of data "1", the potential output to the wiring CL is GND. It needs to be noted that inverted data is output like this.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, the semiconductor device described in this embodiment does not need a high voltage for writing data and has no problem of deterioration of elements. Unlike in a conventional nonvolatile memory, for example, it is not necessary to inject and extract electrons into and from a floating gate; thus, a problem such as deterioration of a gate insulating film does not occur. That is, the semiconductor device of the disclosed invention does not have a limit on the number of times data can be rewritten, which is a problem of a conventional nonvolatile memory, and the reliability thereof is drastically improved. Furthermore, data writing depends on the state of the transistor (on or off), whereby high-speed operation can be easily achieved.

As described above, a miniaturized and highly integrated semiconductor device having high electrical characteristics can be provided.

The structures, methods, and the like described in this embodiment can be used in appropriate combination with any of the structures, methods, and the like described in the other embodiments and examples.

Embodiment 7

In this embodiment, a structure example of a display device of one embodiment of the present invention will be described.

Structure Example

Figure 28A:
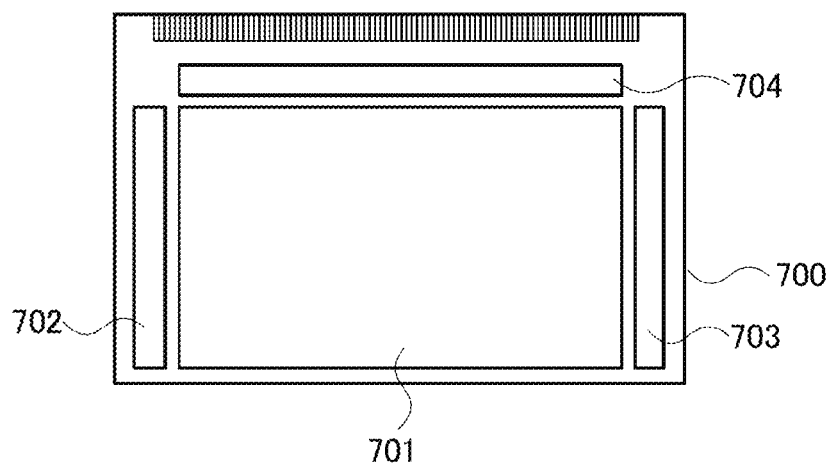
FIGS. 28A to 28C are a block diagram and circuit diagrams illustrating a display device.
Figure 28B:
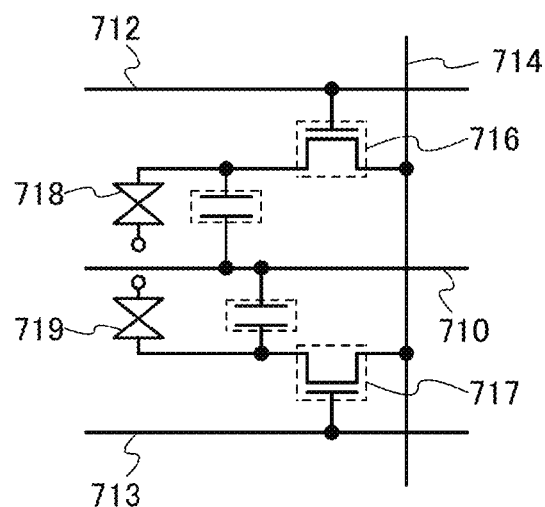
Figure 28C:
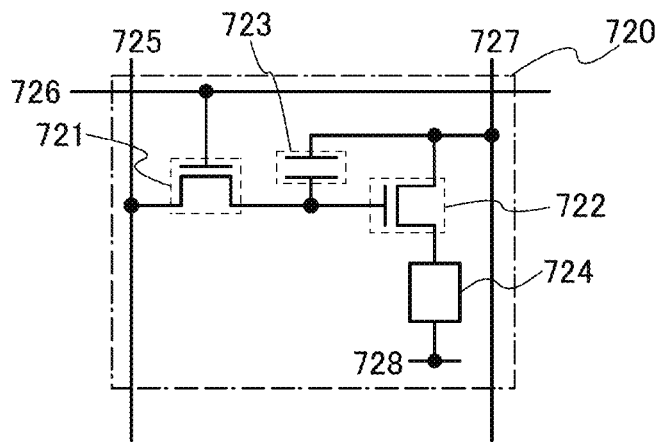

FIG. 28A is a top view of the display device of one embodiment of the present invention. FIG. 28B is a circuit diagram illustrating a pixel circuit that can be used in the case where a liquid crystal element is used in a pixel in the display device of one embodiment of the present invention. FIG. 28C is a circuit diagram illustrating a pixel circuit that can be used in the case where an organic EL element is used in a pixel in the display device of one embodiment of the present invention.

Transistors in a pixel portion can be formed in accordance with any of the above embodiments. The transistors can be easily formed as n-channel transistors, and thus part of a driver circuit that can be formed using an n-channel transistor can be formed over the same substrate as the transistors in the pixel portion. By thus using the transistors described in the above embodiments for the pixel portion or the driver circuit, a highly reliable display device can be provided.

FIG. 28A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extending from the signal line driver circuit 704 are arranged and a plurality of scan lines extending from the first scan line driver circuit 702 and the second scan line driver circuit 703 are arranged. Note that pixels which include display elements are provided in a matrix in the respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 28A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to extend to increase the number of wiring connections. When the driver circuit is provided over the substrate 700, the number of wiring connections can be reduced, resulting in improved reliability or yield.

<Liquid Crystal Display Device>

FIG. 28B illustrates an example of a circuit configuration of the pixel. Here, a pixel circuit that can be used in a pixel of a VA liquid crystal display device is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in any of the above embodiments can be used as appropriate as the transistors 716 and 717. Thus, a highly reliable liquid crystal display device can be provided.

The shapes of a first pixel electrode electrically connected to the transistor 716 and a second pixel electrode electrically connected to the transistor 717 are described. The first pixel electrode and the second pixel electrode are separated. There is no particular limitation on the shapes of the first pixel electrode and the second pixel electrode. For example, the first pixel electrode may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode or the second pixel electrode.

The multi-domain pixel includes a first liquid crystal element 718 and a second liquid crystal element 719. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that shown in FIG. 28B. For example, a switch, a resistor, a capacitor, a transistor, a sensor, a logic circuit, or the like may be added to the pixel illustrated in FIG. 28B.

<Organic EL Display Device>

FIG. 28C illustrates another example of a circuit configuration of the pixel. Here, a pixel structure of a display device including an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 28C illustrates an applicable example of a pixel circuit. Here, one pixel includes two n-channel transistors. Note that an oxide semiconductor film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727, and can be, for example, GND or 0 V. The high power supply potential and the low power supply potential are set to be higher than or equal to the forward threshold voltage of the light-emitting element 724, and the difference between the potentials is applied to the light-emitting element 724, whereby current is supplied to the light-emitting element 724 so that light is emitted. The forward voltage of the light-emitting element 724 refers to a voltage at which a desired luminance is obtained, and includes at least a forward threshold voltage.

Note that the gate capacitance of the driver transistor 722 may be used as a substitute for the capacitor 723, in which case the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for surely turning on or off the driver transistor 722 is input to the driver transistor 722. In order for the driver transistor 722 to operate in a linear region, a voltage higher than the voltage of the power supply line 727 is applied to the gate electrode of the driver transistor 722. Note that a voltage higher than or equal to the sum of power supply line voltage and the threshold voltage Vth of the driver transistor 722 is applied to the signal line 725.

In the case of performing analog grayscale driving, a voltage higher than or equal to the sum of the forward voltage of the light-emitting element 724 and the threshold voltage Vth of the driver transistor 722 is applied to the gate electrode of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 28C. For example, a switch, a resistor, a capacitor, a sensor, a transistor, a logic circuit, or the like may be added to the pixel circuit illustrated in FIG. 28C.

In the case where the transistor shown in any of the above embodiments is used for the circuits shown in FIGS. 28A to 28C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Examples of the display device including an EL element include an EL display. Examples of the display device including an electron emitter include a field emission display (FED) and an SED-type flat panel display (SED: surface-conduction electron-emitter display). Examples of the display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of the display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes. This results in a further reduction in power consumption.

At least part of this embodiment can be implemented in appropriate combination with any of the other embodiments described in this specification.

Embodiment 8

In this embodiment, a display module including a semiconductor device of one embodiment of the present invention will be described with reference to FIG. 29.

Figure 29:
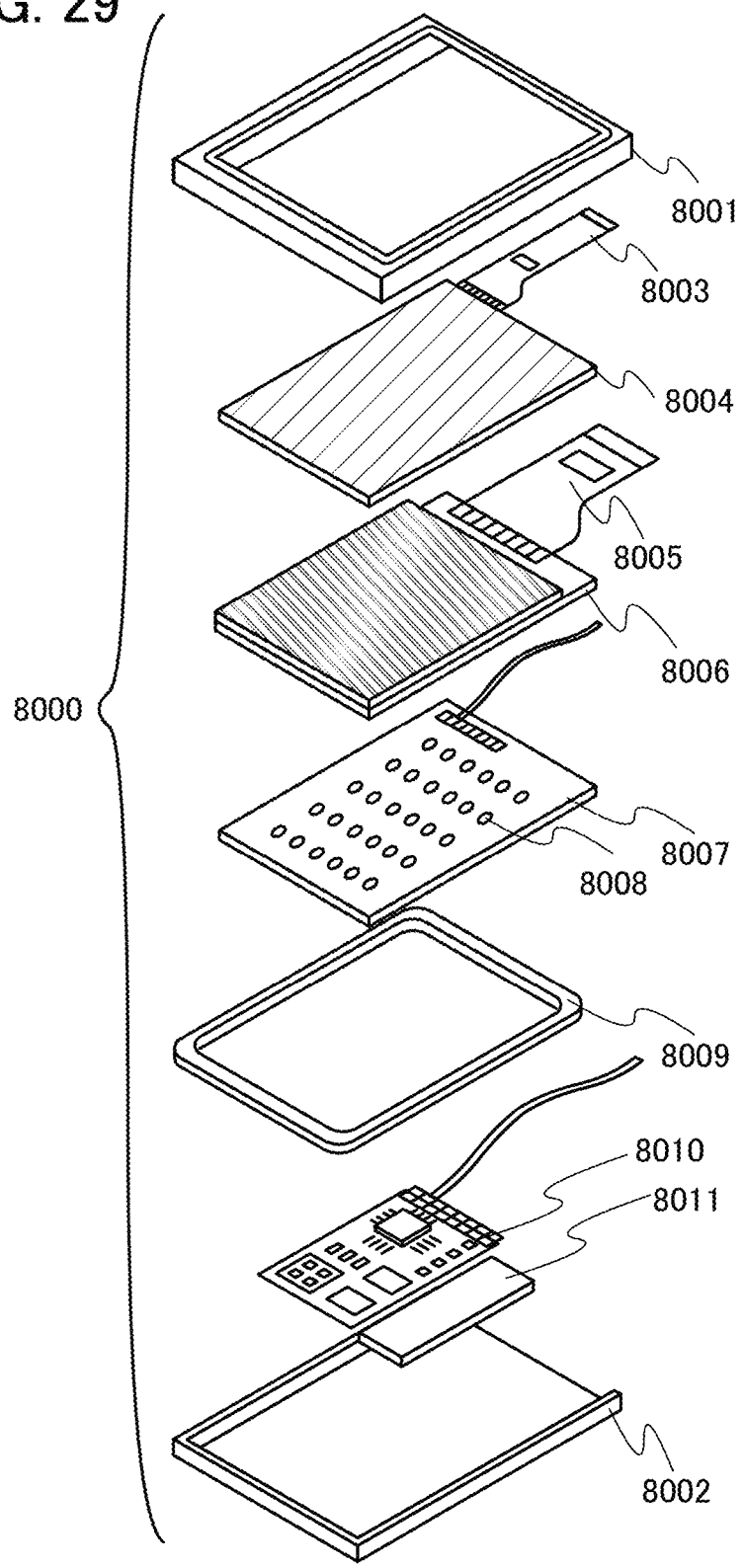
FIG. 29 illustrates a display module.

In a display module 8000 illustrated in FIG. 29, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

The structure shown in this embodiment can be used in appropriate combination with the structure shown in any of the other embodiments.

Embodiment 9

In this embodiment, examples of an electronic device that uses a semiconductor device of one embodiment of the present invention will be described.

Specific examples of the electronic device that uses the semiconductor device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by fuel engines or electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 30A:
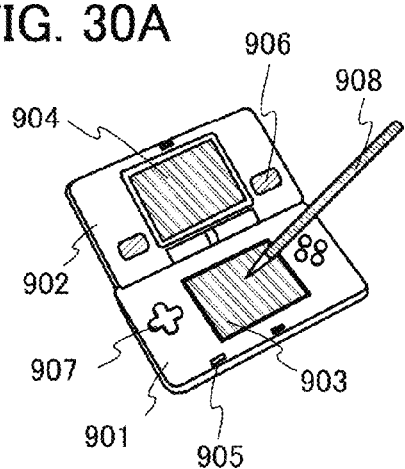
FIGS. 30A to 30F illustrate electronic devices of one embodiment of the present invention.

FIG. 30A illustrates an example of a portable game console including a housing 901, a housing 902, a display portion 903, a display portion 904, a microphone 905, a speaker 906, an operation key 907, a stylus 908, and the like. Although the portable game console in FIG. 30A has the two display portions 903 and 904, the number of display portions included in a portable game console is not limited to this. Any of the transistors described in Embodiments 1 to 4 can be used as transistors included in the display portions 903 and 904 and the like. Furthermore, any of the transistors described in Embodiments 1 to 4 can be used in a CPU, a memory device, or the like which is not illustrated in FIG. 30A.

Figure 30B:
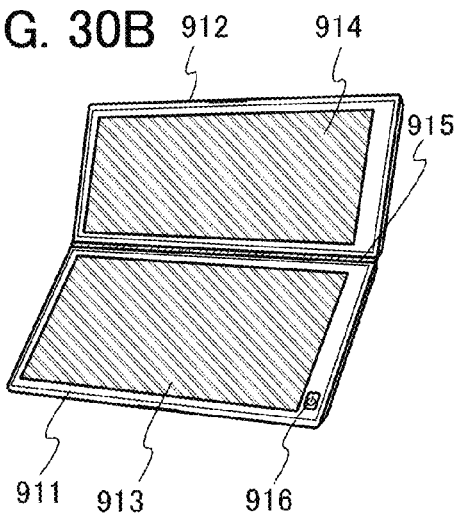

FIG. 30B illustrates an example of a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device. Any of the transistors described in Embodiments 1 to 4 can be used as transistors included in the first display portion 913, the second display portion 914, and the like. Furthermore, any of the transistors described in Embodiments 1 to 4 can be used in a CPU, a memory device, or the like which is not illustrated in FIG. 30B.

Figure 30C:
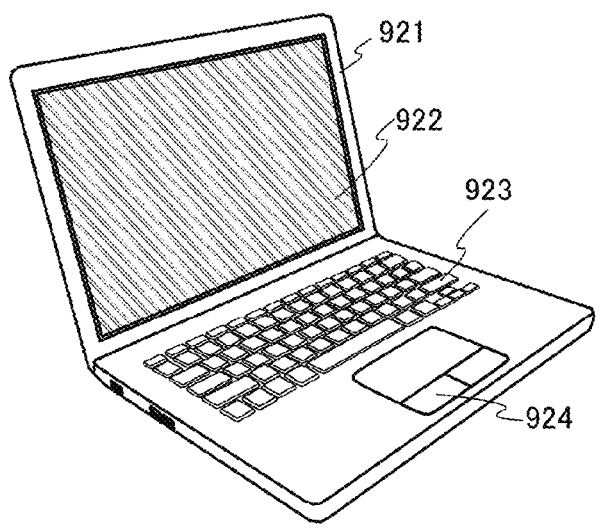

FIG. 30C illustrates an example of a laptop personal computer, which includes a housing 921, a display portion 922, a keyboard 923, a pointing device 924, and the like. Any of the transistors described in Embodiments 1 to 4 can be used as transistors included in the display portion 922 and the like. Furthermore, any of the transistors described in Embodiments 1 to 4 can be used in a CPU, a memory device, or the like which is not illustrated in FIG. 30C.

Figure 30D:
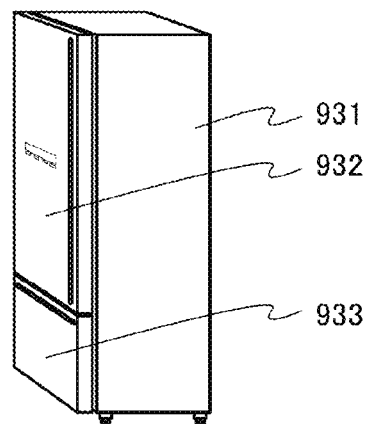

FIG. 30D illustrates an example of an electric refrigerator-freezer including a housing 931, a door for a refrigerator 932, a door for a freezer 933, and the like. Any of the transistors described in Embodiments 1 to 4 can be used in a CPU, a memory device, or the like which is not illustrated in FIG. 30D.

Figure 30E:
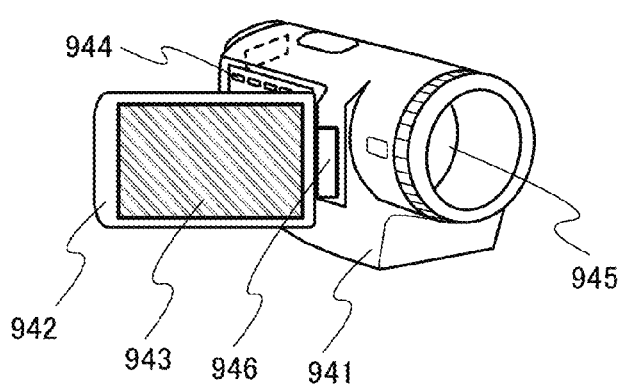

FIG. 30E illustrates an example of a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. Any of the transistors described in Embodiments 1 to 4 can be used as transistors included in the display portion 943 and the like. Furthermore, any of the transistors described in Embodiments 1 to 4 can be used in a CPU, a memory device, or the like which is not illustrated in FIG. 30E.

Figure 30F:
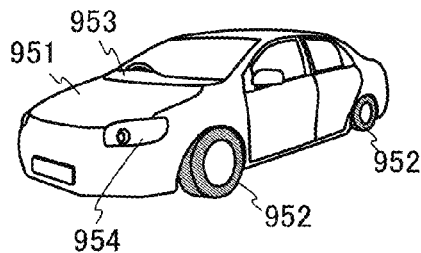

FIG. 30F illustrates an example of an automobile including a car body 951, wheels 952, a dashboard 953, lights 954, and the like. Any of the transistors described in Embodiments 1 to 4 can be used in a CPU, a memory device, or the like which is not illustrated in FIG. 30F.

This embodiment can be combined with any of the other embodiments described in this specification as appropriate.

Example 1

This example shows the results of calculating the concentration of injected oxygen in the depth direction of an oxide semiconductor film into which oxygen ions are injected. In this example, as the oxide semiconductor film to which oxygen ions are injected, the oxide semiconductor film 107 in contact with the gate insulating film 105 illustrated in FIGS. 1A to 1C is assumed.

For the calculation, transport of ions in matter (TRIM) was used.

A sample used in this calculation has a structure in which a silicon oxide film and an oxide semiconductor film are sequentially stacked over a silicon wafer.

The silicon oxide film has an element atomic ratio of Si:O=1:2, a thickness of 100 nm, and a density of 2.2 g/cm$^3$. The oxide semiconductor film is an IGZO film with an element atomic ratio of In:Ga:Zn:O=1:3:4:10, a thickness of 20 nm, and a density of 5.91 g/cm$^3$. As the ion species, oxygen atomic ions with molecular weight of 16 were used. The dose was $1 \times 10^{16}$ ions/cm$^2$.

Figure 31:
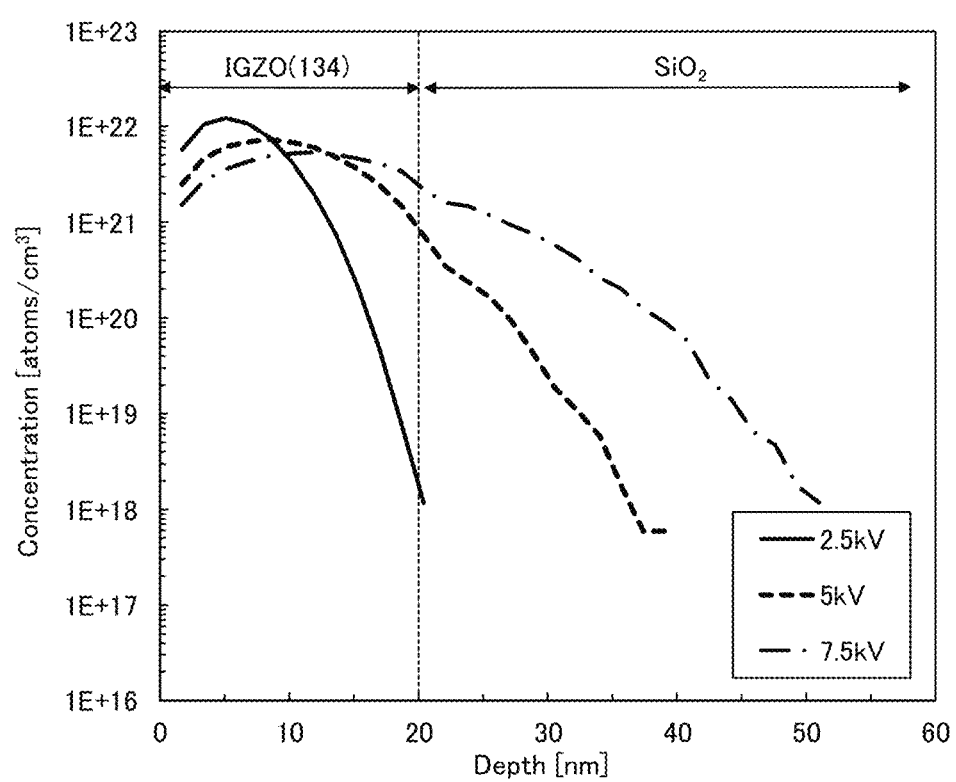
FIG. 31 shows the calculation results of oxygen concentration.

FIG. 31 shows the calculation results under the conditions where the acceleration voltage in injecting the ion species was 2.5 kV, 5 kV, and 7.5 kV. In FIG. 31, SiO$_2$ represents the silicon oxide film, and IGZO(134) represents the oxide semiconductor film.

In FIG. 31, the horizontal axis and the vertical axis indicate the depth direction and the oxygen concentration, respectively. The solid line represents the calculation results at an acceleration voltage of 2.5 kV, the broken line represents the calculation results at an acceleration voltage of 5 kV, and the dashed-dotted line represents the calculation results at an acceleration voltage of 7.5 kV.

These results show that adjusting the acceleration voltage of the ion species and the thickness of the oxide semiconductor film allows the control of the concentration of injected oxygen at the interface between the silicon oxide film and the oxide semiconductor film. In addition, the amount of oxygen injected into the silicon oxide film can be controlled.

Example 2

This example shows the results of calculating the concentration of injected oxygen in the depth direction of an oxide semiconductor film into which oxygen ions are injected. In this example, as the oxide semiconductor film to which oxygen ions are injected, the oxide semiconductor film 115 in contact with the gate insulating film 117 illustrated in FIGS. 1A to 1C is assumed.

For the calculation, TRIM was used.

A sample used in this calculation has a structure in which a silicon oxide film, a first oxide semiconductor film, a second oxide semiconductor film, and a third oxide semiconductor film are sequentially stacked over a silicon wafer.

The silicon oxide film has an element atomic ratio of Si:O=1:2, a thickness of 100 nm, and a density of 2.2 g/cm$^3$. The first oxide semiconductor film is an IGZO film with an element atomic ratio of In:Ga:Zn:O=1:3:4:10, a thickness of 20 nm, and a density of 5.91 g/cm$^3$. The second oxide semiconductor film is an IGZO film with an element atomic ratio of In:Ga:Zn:O=1:1:1:4, a thickness of 15 nm, and a density of 6.24 g/cm$^3$. The third oxide semiconductor film is an IGZO film with an element atomic ratio of In:Ga:Zn:O=1:3:2:8, a thickness of 5 nm, and a density of 5.71 g/cm$^3$. As the ion species, oxygen atomic ions with molecular weight of 16 were used. The dose was $1 \times 10^{16}$ ions/cm$^2$.

Figure 32:
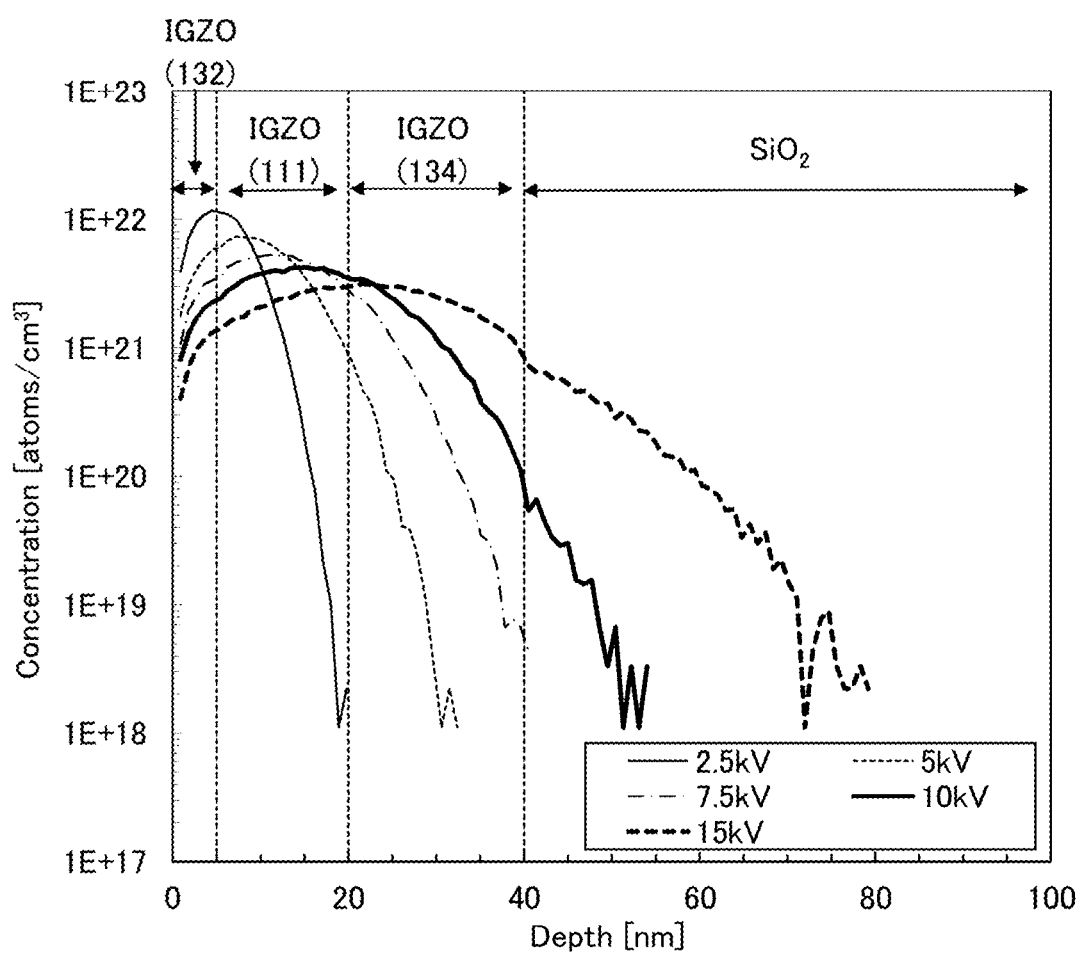
FIG. 32 shows the calculation results of oxygen concentration.

FIG. 32 shows the calculation results under the conditions where the acceleration voltage in injecting the ion species was 2.5 kV, 5 kV, 7.5 kV, 10 kV, and 15 kV. In FIG. 32, SiO$_2$ represents the silicon oxide film, IGZO(134) represents the first oxide semiconductor film, IGZO(111) represents the second oxide semiconductor film, and IGZO(132) represents the third oxide semiconductor film.

In FIG. 32, the horizontal axis and the vertical axis indicate the depth direction and the oxygen concentration, respectively. The thin solid line represents the calculation results at an acceleration voltage of 2.5 kV, the thin broken line represents the calculation results at an acceleration voltage of 5 kV, and the thin dashed-dotted line represents the calculation results at an acceleration voltage of 7.5 kV. The thick solid line represents the calculation results at an acceleration voltage of 10 kV, and the thick broken line represents the calculation results at an acceleration voltage of 15 kV.

These results show that adjusting the acceleration voltage of the ion species and the thickness of the oxide semiconductor film allows the control of the concentration of injected oxygen at the interface between the silicon oxide film and the oxide semiconductor film. In addition, the amount of oxygen injected into the silicon oxide film can be controlled.

Example 3

This example shows the results of measuring the number of defects in an oxide insulating film in contact with an oxide semiconductor film.

<Fabrication Method of Samples>

In this example, Sample A1 and Sample A2 were fabricated.

<Sample A1>

A fabrication method of Sample A1 is described with reference to FIGS. 33A to 33D.

Figure 33A:
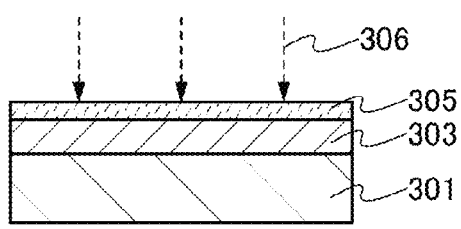
FIGS. 33A to 33I illustrate fabrication methods of samples.

As illustrated in FIG. 33A, a 100-nm-thick silicon oxide film 303 was formed over a quartz substrate 301, and a 40-nm-thick first IGZO film 305 was formed over the silicon oxide film 303. Then, oxygen atomic ions 306 were injected into the first IGZO film 305. As a result, a first IGZO film 305a to which the oxygen atomic ions had been added was obtained as illustrated in FIG. 33B.

The silicon oxide film 303 was formed by a plasma CVD method under the conditions where 1 sccm of silane and 800 sccm of dinitrogen monoxide were used as source gases; the pressure in a reaction chamber was 40 Pa; the substrate temperature was 500° C.; and a power of 150 W was supplied.

The first IGZO film 305 was formed by a sputtering method under the conditions where an In—Ga—Zn oxide target with an atomic ratio of In:Ga:Zn=1:3:4 was used as a sputtering target; a gas containing 11% of oxygen (diluted with argon) was used as a sputtering gas; the pressure in a reaction chamber was 0.7 Pa; the substrate temperature was 200° C.; and a DC power of 0.5 kW was supplied.

The oxygen atomic ions 306 were added to the first IGZO film 305 by an ion implantation method at an acceleration voltage of 5 kV to a dose of $1 \times 10^{16}$ ions/cm$^2$.

Figure 33E:
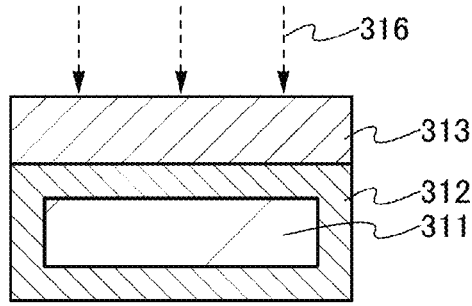
Figure 33B:
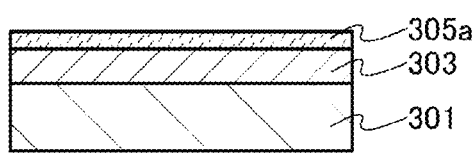
Figure 33F:
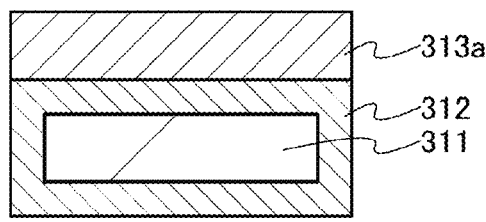
Figure 33C:
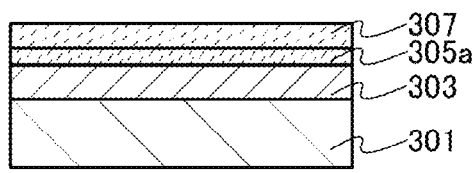

Then, as illustrated in FIG. 33C, a 50-nm-thick second IGZO film 307 was formed over the first IGZO film 305a to which the oxygen atomic ions had been added.

The second IGZO film 307 was formed by a sputtering method under the conditions where an In—Ga—Zn oxide target with an atomic ratio of In:Ga:Zn=1:1:1 was used as a sputtering target; a gas containing 11% of oxygen (diluted with argon) was used as a sputtering gas; the pressure in a reaction chamber was 0.7 Pa; the substrate temperature was 300° C.; and a DC power of 0.5 kW was supplied.

Figure 33G:
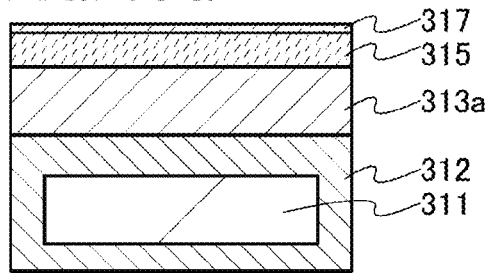
Figure 33D:
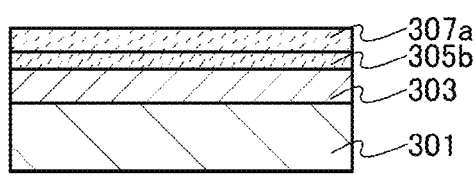

Next, heat treatment was performed as illustrated in FIG. 33D. As a result, part of oxygen contained in the first IGZO film 305a was diffused into the second IGZO film 307. In FIG. 33D, the first IGZO film and the second IGZO film after the heat treatment are denoted by a first IGZO film 305b and a second IGZO film 307a, respectively.

Here, heat treatment was performed at 450° C. in a nitrogen atmosphere for 1 hour, and after that, another heat treatment was performed at 450° C. in an oxygen atmosphere for 1 hour.

Through the above steps, Sample A1 was fabricated.
<Sample A2>

A fabrication method of Sample A2 is described with reference to FIGS. 33E to 33I. Note that Sample A2 is different from Sample A1 in the material for the substrate and the formation temperature of the silicon oxide film, and in that oxygen atomic ions are added to the silicon oxide film.

As illustrated in FIG. 33E, a 100-nm-thick silicon oxide film 312 was formed on the surface of a silicon wafer 311 by heating the silicon wafer 311. Then, a 300-nm-thick silicon oxide film 313 was formed over the silicon oxide film 312. After that, oxygen atomic ions 316 were injected into the silicon oxide film 313. As a result, a silicon oxide film 313a to which the oxygen atomic ions had been added was obtained as illustrated in FIG. 33F.

The silicon oxide film 312 was formed on the surface of the silicon wafer 311 by heating the silicon wafer 311 at 950° C. in a water vapor atmosphere.

The silicon oxide film 313 was formed by a plasma CVD method under the conditions where 2.3 sccm of silane and 800 sccm of dinitrogen monoxide were used as source gases; the pressure in a reaction chamber was 40 Pa; the substrate temperature was 400° C.; and a power of 50 W was supplied.

The oxygen atomic ions 316 were added to the silicon oxide film 313 by an ion implantation method at an acceleration voltage of 60 kV to a dose of $2\times10^{16}$ ions/cm$^2$.

Then, as illustrated in FIG. 33G, an 80-nm-thick first IGZO film 315 was formed over the silicon oxide film 313a. After that, a 15-nm-thick second IGZO film 317 was formed over the first IGZO film 315.

The first IGZO film 315 was formed by a sputtering method under the conditions where an In—Ga—Zn oxide target with an atomic ratio of In:Ga:Zn=1:3:2 was used as a sputtering target; a gas containing 11% of oxygen (diluted with argon) was used as a sputtering gas; the pressure in a reaction chamber was 0.7 Pa; the substrate temperature was 200° C.; and a DC power of 0.5 kW was supplied.

The second IGZO film 317 was formed by a sputtering method under the conditions where an In—Ga—Zn oxide target with an atomic ratio of In:Ga:Zn=1:1:1 was used as a sputtering target; a gas containing 33% of oxygen (diluted with argon) was used as a sputtering gas; the pressure in a reaction chamber was 0.7 Pa; the substrate temperature was 300° C.; and a DC power of 0.5 kW was supplied.

Figure 33H:
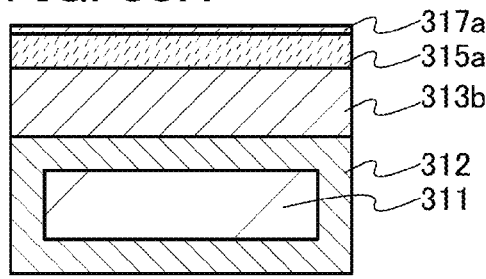

Next, heat treatment was performed. As a result, part of oxygen contained in the silicon oxide film 313a was diffused into the first IGZO film 315 and the second IGZO film 317. In FIG. 33H, the silicon oxide film, the first IGZO film, and the second IGZO film after the heat treatment are denoted by a silicon oxide film 313b, a first IGZO film 315a, and a second IGZO film 317a, respectively.

Here, heat treatment was performed at 450° C. in a nitrogen atmosphere for 1 hour, and after that, another heat treatment was performed at 450° C. in an oxygen atmosphere for 1 hour.

Figure 33I:
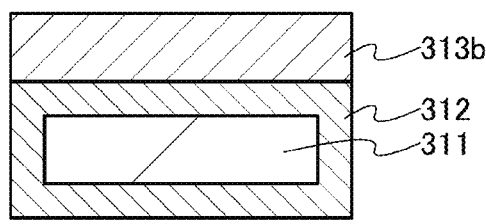

Then, as illustrated in FIG. 33I, the first IGZO film 315a and the second IGZO film 317a were removed.

Through the above steps, Sample A2 was fabricated.
<ESR Measurement>

Samples A1 and A2 were subjected to ESR measurement. Here, the ESR measurement was performed under the following conditions: for Sample A1, the measurement temperature was 10 K, the high-frequency power of 9.45 GHz was 0.05 mW, and the direction of a magnetic field was parallel to a surface of the sample; for Sample A2, the measurement temperature was 100 K, the high-frequency power of 9.15 GHz was 4 mW, and the direction of a magnetic field was parallel to a surface of the sample. The lower detection limit of the spin density of a signal attributed to NO$_x$ is $1.0\times10^{17}$ spins/cm$^3$ at a measurement temperature of 100 K. A smaller number of spins means a smaller number of defects in the film.

Figure 34A:
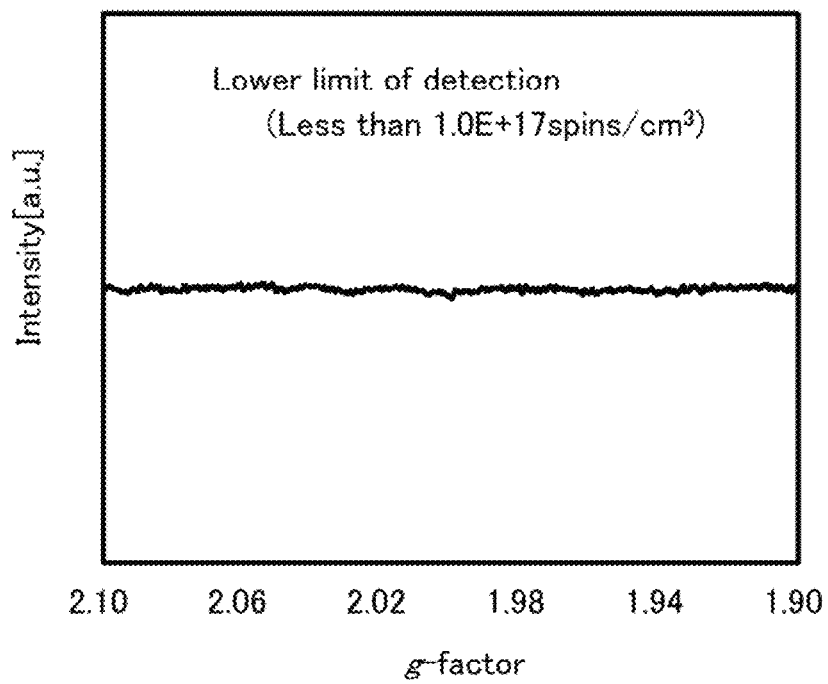
FIGS. 34A and 34B show the results of ESR measurement.
Figure 34B:
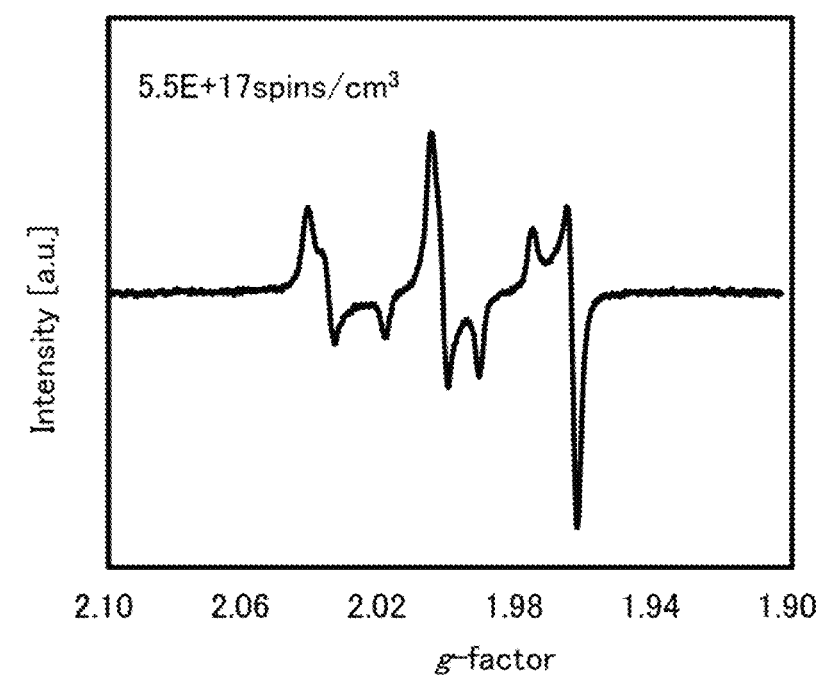

FIGS. 34A and 34B show the measurement results of Sample A1 and Sample A2, respectively. The spin density of Sample A1 was lower than the detection limit. In Sample A2, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 were observed. These three signals are due to NO$_x$ and represent splits of a hyperfine structure arising from the nuclear spin of an N atom. The signals attributed to NO$_x$ have anisotropic spin species and thus the waveform is asymmetrical. The spin density of Sample A2 was $5.5\times10^{17}$ spins/cm$^3$.

FIGS. 34A and 34B indicate that the number of defects in the silicon oxide film serving as a base film of the oxide semiconductor film increases when oxygen atomic ions are added to the silicon oxide film and the heat treatment is performed. In contrast, when oxygen atomic ions are added to the oxide semiconductor film, the number of defects in the silicon oxide film serving as a base film of the oxide semiconductor film decreases.

Described next is the relationship between the formation temperature of the silicon oxide film serving as a base film of the oxide semiconductor film and the number of defects in the silicon oxide film. Description is also made on the number of defects in the silicon oxide film in relation to the addition of oxygen atomic ions to the oxide semiconductor film.
<Sample A3>

A fabrication method of Sample A3 is described with reference to FIGS. 35A and 35B.

Figure 35A:
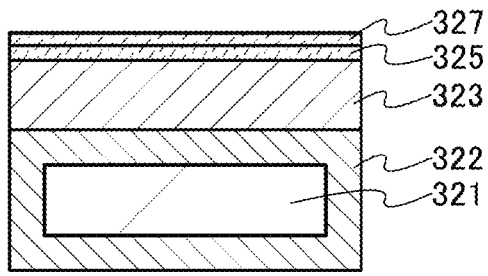
FIGS. 35A to 35F illustrate fabrication methods of samples.

As illustrated in FIG. 35A, a 400-nm-thick silicon oxide film 322 was formed on the surface of a silicon wafer 321 by heating the silicon wafer 321. Then, a 100-nm-thick silicon oxide film 323 was formed over the silicon oxide film 322. After that, a 20-nm-thick first IGZO film 325 was formed over the silicon oxide film 323. Then, a 20-nm-thick second IGZO film 327 was formed over the first IGZO film 325.

The silicon oxide film 322 was formed on the surface of the silicon wafer 321 by heating the silicon wafer 321 at 950° C. in a water vapor atmosphere.

The silicon oxide film 323 was formed by a plasma CVD method under the conditions where 1 sccm of silane and 800 sccm of dinitrogen monoxide were used as source gases; the pressure in a reaction chamber was 40 Pa; the substrate temperature was 500° C.; and a power of 150 W was supplied.

The first IGZO film 325 was formed by a sputtering method under the conditions where an In—Ga—Zn oxide target with an atomic ratio of In:Ga:Zn=1:3:4 was used as a sputtering target; a gas containing 11% of oxygen (diluted with argon) was used as a sputtering gas; the pressure in a reaction chamber was 0.7 Pa; the substrate temperature was 200° C.; and a DC power of 0.5 kW was supplied.

The second IGZO film 327 was formed by a sputtering method under the conditions where an In—Ga—Zn oxide target with an atomic ratio of In:Ga:Zn=1:1:1 was used as a sputtering target; a gas containing 33% of oxygen (diluted with argon) was used as a sputtering gas; the pressure in a reaction chamber was 0.7 Pa; the substrate temperature was 300° C.; and a DC power of 0.5 kW was supplied.

Next, heat treatment was performed. In FIG. 35B, the first IGZO film and the second IGZO film after the heat treatment are denoted by a first IGZO film 325a and a second IGZO film 327a, respectively.

Here, heat treatment was performed at 450° C. in a nitrogen atmosphere for 1 hour, and after that, another heat treatment was performed at 450° C. in an oxygen atmosphere for 1 hour.

Through the above steps, Sample A3 was fabricated.
<Sample A4>

The fabrication conditions of Sample A4 are different from those of Sample A3 in the formation temperature of the silicon oxide film 323.

The silicon oxide film 323 was formed by a plasma CVD method under the conditions where 1 sccm of silane and 800 sccm of dinitrogen monoxide were used as source gases; the pressure in a reaction chamber was 40 Pa; the substrate temperature was 400° C.; and a power of 150 W was supplied.
<Sample A5>

A fabrication method of Sample A5 is described with reference to FIGS. 35C to 35F. Sample A5 is different from sample A3 in that oxygen atomic ions are added to the first IGZO film.

Figure 35C:
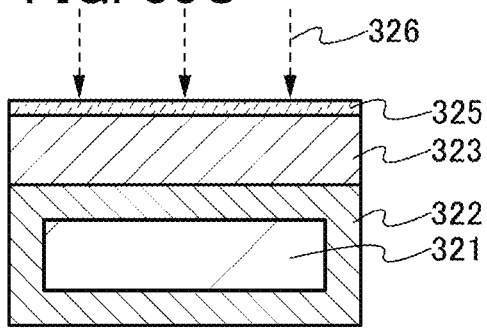
Figure 35B:
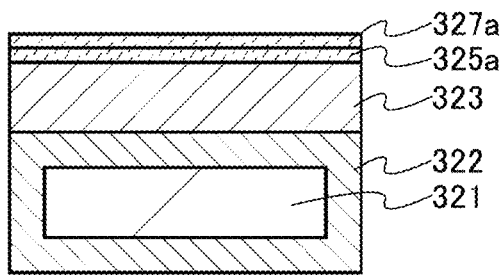
Figure 35D:
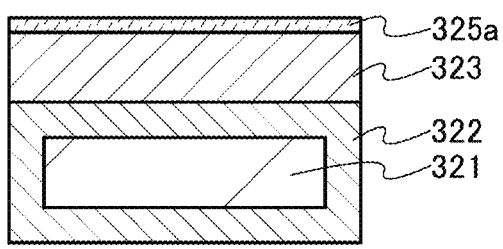

As illustrated in FIG. 35C, the 400-nm-thick silicon oxide film 322 was formed on the surface of the silicon wafer 321 by heating the silicon wafer 321. Then, the 100-nm-thick silicon oxide film 323 was formed over the silicon oxide film 322. After that, the 20-nm-thick first IGZO film 325 was formed over the silicon oxide film 323. Then, oxygen atomic ions 326 were added to the first IGZO film 325. As a result, a first IGZO film 325a to which the oxygen atomic ions had been added was obtained as illustrated in FIG. 35D.

The silicon oxide film 322, the silicon oxide film 323, and the first IGZO film 325 were formed under the same conditions as Sample A3. That is, the silicon oxide film 323 in Sample A5 was formed at a substrate temperature of 500° C.

The oxygen atomic ions 326 were added to the first IGZO film 325 by an ion implantation method at an acceleration voltage of 5 kV to a dose of $1 \times 10^{16}$ ions/cm².

Figure 35E:
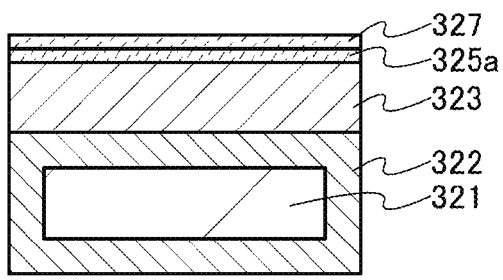

Then, as illustrated in FIG. 35E, the 20-nm-thick second IGZO film 327 was formed over the first IGZO film 325a.

The second IGZO film 327 was formed by a sputtering method under the conditions where an In—Ga—Zn oxide target with an atomic ratio of In:Ga:Zn=1:1:1 was used as a sputtering target; a gas containing 33% of oxygen (diluted with argon) was used as a sputtering gas; the pressure in a reaction chamber was 0.7 Pa; the substrate temperature was 300° C.; and a DC power of 0.5 kW was supplied.

Figure 35F:
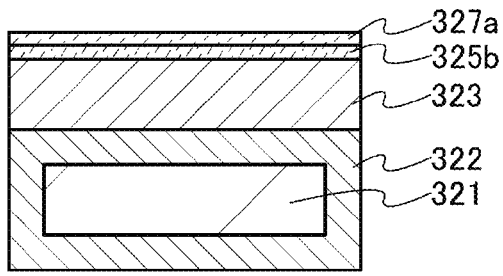

Next, heat treatment was performed. As a result, part of oxygen contained in the first IGZO film 325a was diffused into the second IGZO film 327. In FIG. 35F, the first IGZO film and the second IGZO film after the heat treatment are denoted by a first IGZO film 325b and a second IGZO film 327a, respectively.

Here, heat treatment was performed at 450° C. in a nitrogen atmosphere for 1 hour, and after that, another heat treatment was performed at 450° C. in an oxygen atmosphere for 1 hour.

Through the above steps, Sample A5 was fabricated.
<Sample A6>

The fabrication conditions of Sample A6 are different from those of Sample A5 in the formation temperature of the silicon oxide film 323.

The silicon oxide film 323 was formed by a plasma CVD method under the conditions where 1 sccm of silane and 800 sccm of dinitrogen monoxide were used as source gases; the pressure in a reaction chamber was 40 Pa; the substrate temperature was 400° C.; and a power of 150 W was supplied.
<ESR Measurement>

Next, Samples A3 to A6 were subjected to ESR measurement. Here, the ESR measurement was performed under the following conditions: the measurement temperature was 10 K, the high-frequency power of 9.55 GHz was 0.1 mW, and the direction of a magnetic field was parallel to a surface of the sample. The lower detection limit of the spin density of a signal attributed to $NO_x$ is $8.7 \times 10^{15}$ spins/cm³ at a measurement temperature of 10 K.

FIG. 36A shows the measurement results of Samples A3 and A4, and FIG. 36B shows the measurement results of Samples A5 and A6. FIGS. 36A and 36B also show the spin densities of the three signals attributed to $NO_x$ in Samples A3 to A6. The spin density in Sample A3 was lower than the detection limit as shown in FIG. 36A. The spin density in Sample A4 was $8.7 \times 10^{15}$ spins/cm³. The spin density in Sample A5 was $7.2 \times 10^{16}$ spins/cm³. The spin density in Sample A6 was $1.6 \times 10^{17}$ spins/cm³. As shown in FIG. 36B, the three signals attributed to $NO_x$ were observed in each of Samples A5 and A6.

Figure 37:
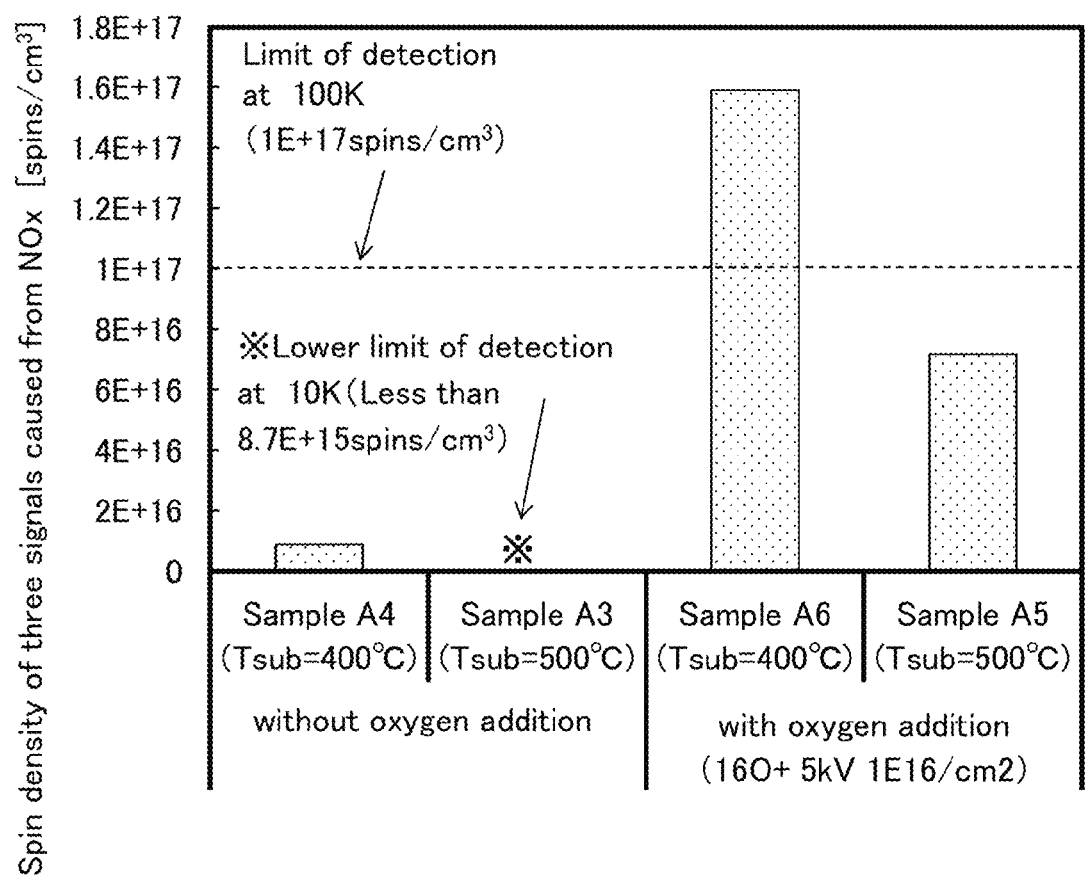
FIG. 37 shows the results of ESR measurement.

FIG. 37 shows the spin densities of the three signals attributed to $NO_x$ in Samples A3 to A6.

FIGS. 36A and 36B and FIG. 37 indicate that when the silicon oxide film serving as a base film of the first IGZO film is formed at a higher temperature, the number of defects in the silicon oxide film can be reduced.

FIGS. 36A and 36B and FIG. 37 also indicate that defects are generated in the silicon oxide film serving as a base film when oxygen atomic ions are added to the oxide semiconductor film.

Example 4

Described in this example are the relationship between the formation temperature of an oxide insulating film and the amount of water released from the film by heat treatment, and the relationship between the formation temperature of the oxide insulating film and the nitrogen concentration of the film.

<Fabrication Method of Samples>

In this example, Sample B1 to Sample B5 were fabricated.

<Sample B1>

A 100-nm-thick silicon oxide film was formed on the surface of a silicon wafer by heating the silicon wafer. Then, a 100-nm-thick silicon oxide film was formed over the silicon oxide film.

The silicon oxide film was formed on the surface of the silicon wafer by heating the silicon wafer at 950° C. in an oxygen atmosphere to which HCl had been added.

The silicon oxide film was formed by a plasma CVD method under the conditions where 1 sccm of silane and 800 sccm of dinitrogen monoxide were used as source gases; the pressure in a reaction chamber was 40 Pa; the substrate temperature was 350° C.; and a power of 150 W was supplied.

Through the above steps, Sample B1 was fabricated.

<Sample B2>

Sample B2 was fabricated in a manner similar to that of Sample B1 except that the silicon oxide film was formed at 400° C.

<Sample B3>

Sample B3 was fabricated in a manner similar to that of Sample B1 except that the silicon oxide film was formed at 450° C.

<Sample B4>

Sample B4 was fabricated in a manner similar to that of Sample B1 except that the silicon oxide film was formed at 500° C.

<Sample B5>

Sample B5 was fabricated in a manner similar to that of Sample B1 except that the silicon oxide film was formed at 550° C.

<TDS Measurement>

Next, Samples B1 to B5 were subjected to TDS analysis.

The peaks of the curves shown in the results obtained from TDS analysis appear due to release of atoms or molecules contained in the analyzed samples (in this example, Samples B1 to B5) to the outside. The total amount of the atoms or molecules released to the outside corresponds to the integral value of the peak. Thus, with the degree of the peak intensity, the total amount of the atoms or molecules contained in the silicon oxynitride film can be measured.

Figure 38:
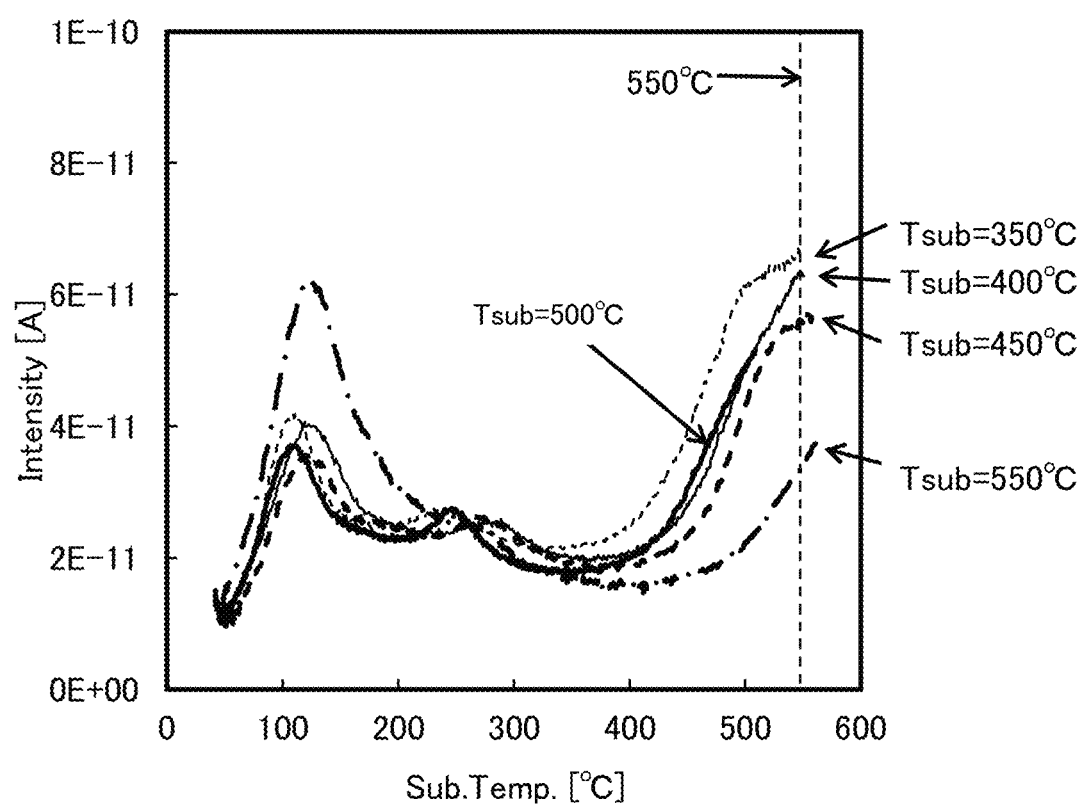
FIG. 38 shows the results of TDS analysis.

FIG. 38 shows the results of the TDS analysis on Samples B1 to B5. FIG. 38 is a graph showing the amount of released water with respect to the substrate temperature.

FIG. 38 shows that the amount of released water increases as the heat treatment temperature rises even when the silicon oxide film is formed at a high temperature. In particular, the amount of released water is likely to increase when the heat treatment is performed at a temperature higher than the formation temperature of the silicon oxide film.

<SIMS Analysis>

Figure 39:
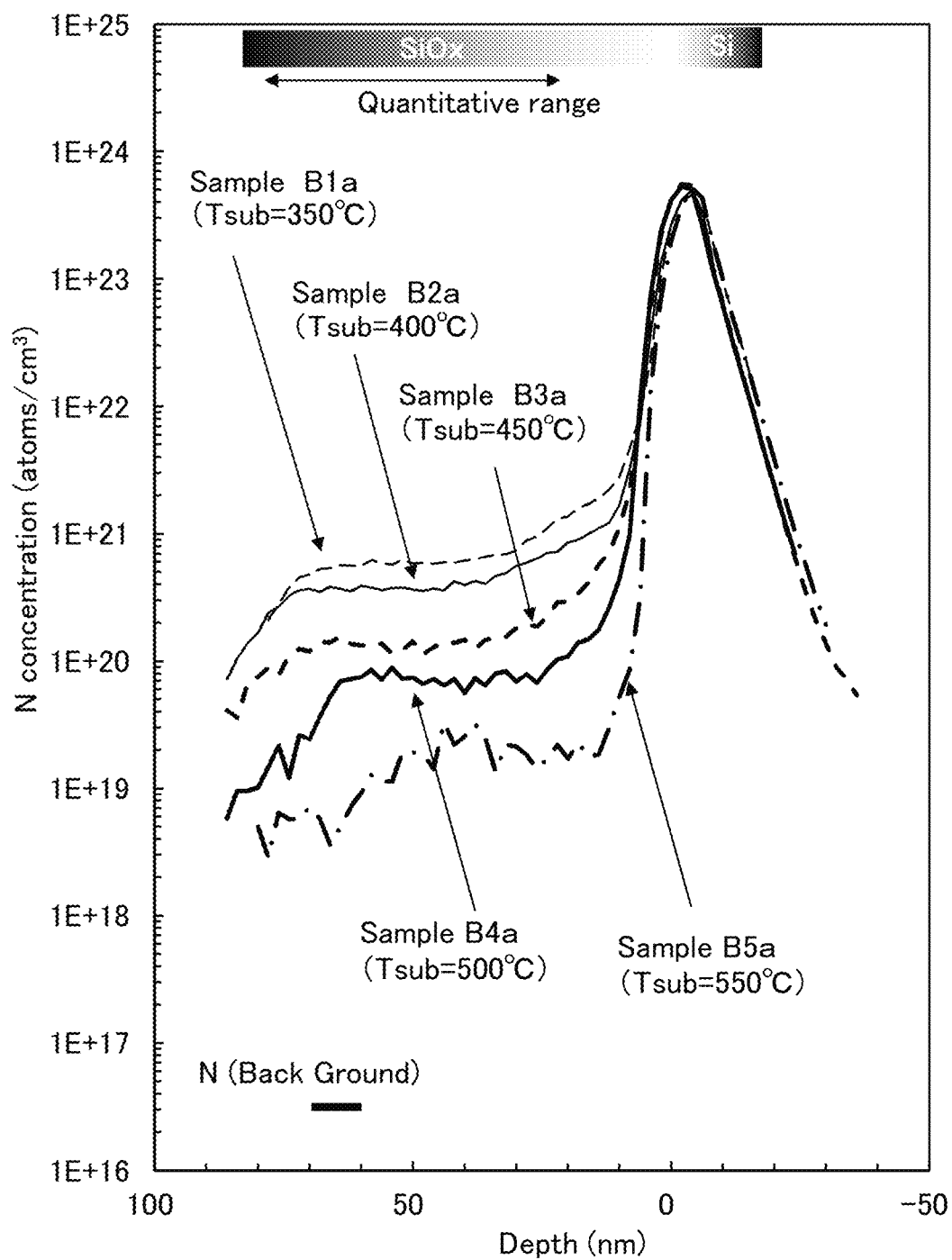
FIG. 39 shows the results of SIMS analysis.

Next, the silicon oxide films included in Samples B1 to B5 were subjected to SIMS analysis. Note that here, the silicon oxide film was not formed by heating the silicon wafer, but a 100-nm-thick silicon oxide film was formed on a silicon wafer under the conditions of Sample B1 to B5. Samples including the silicon oxide films formed under the respective conditions of Samples B1 to B5 are referred to as Samples B1a to B5a. In each of the samples, the concentration of nitrogen was measured from the silicon wafer (Si) to the silicon oxide film (SiON). FIG. 39 shows the measurement results of Samples B1a to B5a.

In FIG. 39, the horizontal axis represents the distance in the depth direction and the vertical axis represents the nitrogen concentration.

The nitrogen concentration of Sample B1a was $6 \times 10^{20}$ atoms/cm$^3$; Sample B2a, $4 \times 10^{20}$ atoms/cm$^3$; Sample B3a, $2 \times 10^{20}$ atoms/cm$^3$; Sample B4a, $7 \times 10^{19}$ atoms/cm$^3$; and Sample B5a, $2 \times 10^{19}$ atoms/cm$^3$.

Figure 46:
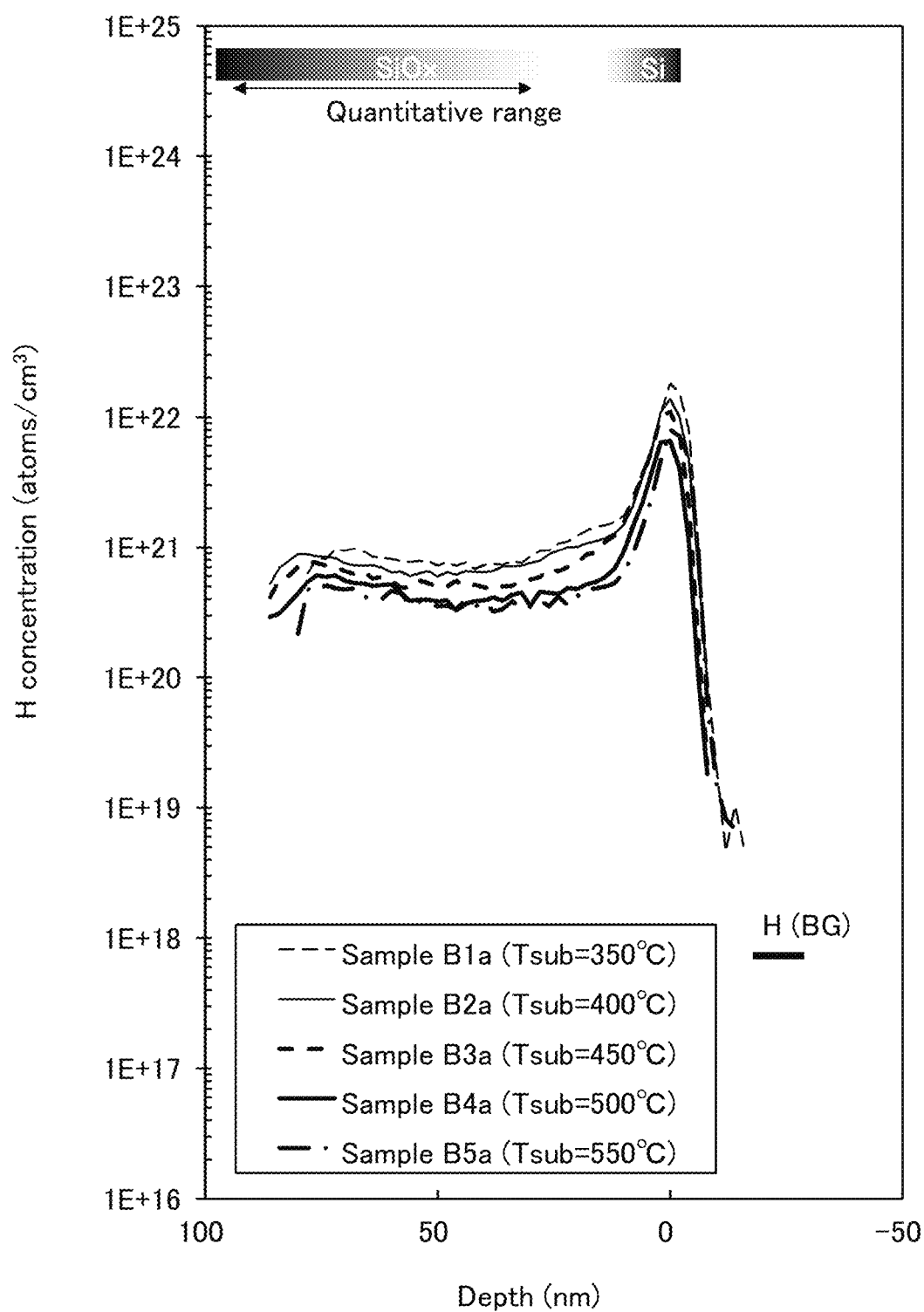
FIG. 46 shows the results of SIMS analysis.

The hydrogen concentrations of Samples B1a to B5a were also measured. In each of the samples, the concentration of hydrogen was measured from the silicon wafer (Si) to the silicon oxide film (SiON). FIG. 46 shows the measurement results of Samples B1a to B5a.

In FIG. 46, the horizontal axis represents the distance in the depth direction and the vertical axis represents the hydrogen concentration.

The hydrogen concentration of Sample B1a was $7 \times 10^{20}$ atoms/cm$^3$, the hydrogen concentration of Sample B2a was $6 \times 10^{20}$ atoms/cm$^3$, the hydrogen concentration of Sample B3a was $5 \times 10^{20}$ atoms/cm$^3$, the hydrogen concentration of Sample B4a was $4 \times 10^{19}$ atoms/cm$^3$, and the hydrogen concentration of Sample B5a was $3 \times 10^{19}$ atoms/cm$^3$.

It is known that it is difficult to obtain accurate data in the proximity of a surface of a sample or in the proximity of an interface between stacked films formed using different materials by the SIMS analysis in measurement principle. Thus, in the case where distributions of the concentrations of nitrogen in the film in the thickness direction are analyzed by SIMS, an average value in a region where the film is provided, the value is not greatly changed, and an almost constant level of strength can be obtained is employed as the concentrations of nitrogen.

FIG. 39 shows that the nitrogen concentration of the silicon oxide film decreases as the formation temperature thereof rises. FIG. 46 shows that the hydrogen concentration of the silicon oxide film decreases as the formation temperature thereof rises. The comparison between FIG. 39 and FIG. 46 suggests that as the formation temperature rises, the nitrogen concentration decreases more significantly than the hydrogen concentration.

Example 5

This example shows the fabrication of transistors and the measurement results of the electrical characteristics of the transistors.

<Fabrication Method of Sample C1>

First, a fabrication process of Sample C1 including a transistor will be described. In this example, a method for fabricating the transistor is described with reference to FIGS. 3A to 3D, FIGS. 6A to 6C, and FIGS. 7A to 7D.

As illustrated in FIG. 3A, an insulating film (not illustrated) was formed over the substrate 101, and the gate electrode 103 was formed over the insulating film. Next, the insulating film 104 was formed over the insulating film and the gate electrode 103, and the oxide semiconductor film 106 was formed over the insulating film 104. Next, the oxygen 108 was added to the oxide semiconductor film 106, so that the oxide semiconductor film 106a to which oxygen was added was formed as illustrated in FIG. 3B.

A silicon wafer was used as the substrate 101.

The substrate 101 was heated at 950° C. in a water vapor atmosphere, so that a 400-nm-thick silicon oxide film was formed as the insulating film on the surface of the substrate 101.

Furthermore, a 50-nm-thick tungsten film was formed by a sputtering method over the insulating film, a mask was formed over the tungsten film by a photolithography process, and the tungsten film was selectively etched, so that the gate electrode 103 was formed. Then, the mask was removed.

As the insulating film 104, a 100-nm-thick silicon oxide film was formed by a plasma CVD method.

The silicon oxide film was formed under the conditions where 1 sccm of silane and 800 sccm of dinitrogen monoxide were used as source gases; the pressure in a reaction chamber was 40 Pa; the substrate temperature was 500° C.; and a power of 150 W was supplied.

As the oxide semiconductor film 106, a 40-nm-thick In—Ga—Zn oxide film was formed by a sputtering method. The sputtering conditions at this time were as follows: a target with a ratio of In:Ga:Zn=1:3:4 was used, 11% of oxygen was introduced as a sputtering gas into a chamber having a pressure of 0.7 Pa, the substrate temperature was 200° C., and a power of 0.5 kW was supplied.

Oxygen molecular ions were added as the oxygen 108 by an ion implantation method at an acceleration voltage of 5 kV to a dose of $1\times10^{16}$ ions/cm$^2$.

Next, as illustrated in FIG. 3B, the oxide semiconductor film 109 was formed over the oxide semiconductor film 106a to which oxygen was added.

As the oxide semiconductor film 109, a 20-nm-thick In—Ga—Zn oxide film was formed by a sputtering method. The sputtering conditions at this time were as follows: a target with a ratio of In:Ga:Zn=1:1:1 was used, 33% of oxygen was introduced as a sputtering gas into a chamber having a pressure of 0.7 Pa, the substrate temperature was 300° C., and a power of 0.5 kW was supplied.

Then, heat treatment was performed so that part of oxygen contained in the oxide semiconductor film 106a was transferred to the oxide semiconductor film 109, so that the oxide semiconductor film 106b and the oxide semiconductor film 109a in which oxygen vacancies were reduced were formed as illustrated in FIG. 3C. For Sample C1, the heat treatment was performed at a temperature lower than the formation temperature of the insulating film 104.

Here, heat treatment was performed at 450° C. in a nitrogen atmosphere for 1 hour, and after that, another heat treatment was performed at 450° C. in an oxygen atmosphere for 1 hour.

Figure 8A:
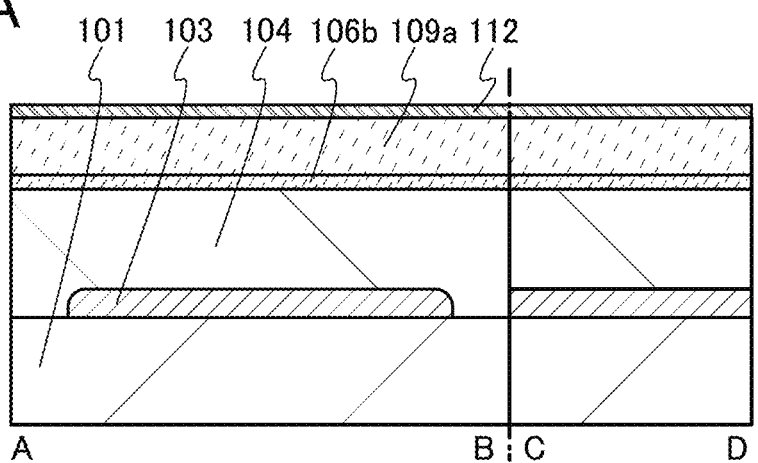
FIGS. 8A to 8C are cross-sectional views illustrating one embodiment of a method for manufacturing the semiconductor device.

Next, as illustrated in FIG. 8A, the conductive film 112 was formed over the oxide semiconductor film 109a.

Here, as the conductive film 112, a 100-nm-thick tungsten film was formed by a sputtering method.

Figure 8B:
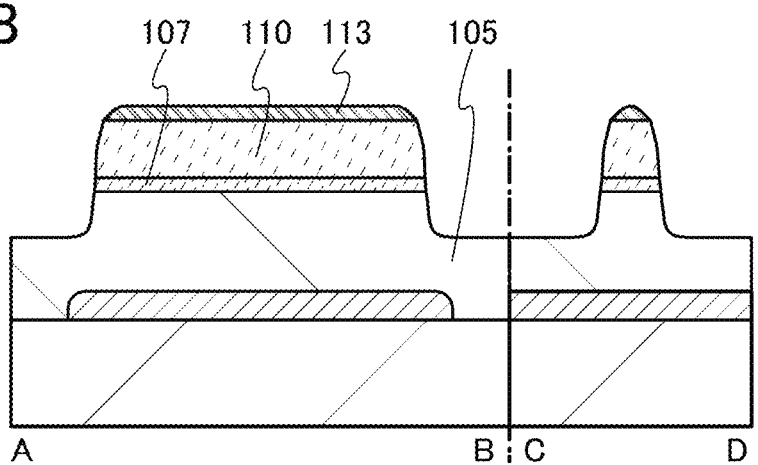
Figure 8C:
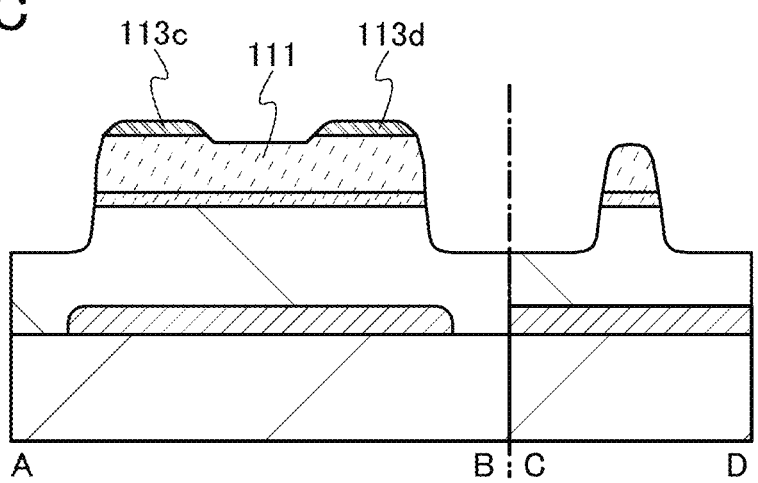

Next, a mask was formed over the conductive film 112 by a photolithography process, and then the insulating film 104, the oxide semiconductor film 106a, the oxide semiconductor film 109a, and the conductive film 112 were etched; thus, the gate insulating film 105, the oxide semiconductor film 107, the oxide semiconductor film 110, and the conductive film 113 were formed as illustrated in FIG. 8B.

Next, an oxide semiconductor film, an insulating film, and a conductive film were stacked over the pair of electrodes 113a and 113b and the oxide semiconductor film 111. Then, a mask was formed over the conductive film by a photolithography process, and the oxide semiconductor film, the insulating film, and the conductive film were etched to form the oxide semiconductor film 115, the gate insulating film 117, and the gate electrode 119 as illustrated in FIGS. 7A to 7D.

As the oxide semiconductor film to be the oxide semiconductor film 115, a 5-nm-thick In—Ga—Zn oxide film was formed by a sputtering method. The sputtering conditions at this time were as follows: a target with a ratio of In:Ga:Zn=1:3:2 was used, 33% of oxygen was introduced as a sputtering gas into a chamber having a pressure of 0.4 Pa, the substrate temperature was 200° C., and a power of 0.5 kW was supplied.

As the insulating film to be the gate insulating film 117, a 20-nm-thick silicon oxynitride film was formed by a plasma CVD method.

As the conductive film to be the gate electrode 119, a 30-nm-thick titanium nitride film and a 135-nm-thick tungsten film were stacked by a sputtering method.

Next, the insulating film 121 was formed, and heat treatment was performed to form the insulating film 123.

As the insulating film 121, a 140-nm-thick aluminum oxide film was formed by a sputtering method.

The heat treatment was performed at 400° C. in an oxygen atmosphere for 1 hour.

As the insulating film 123, a 300-nm-thick silicon oxide film was formed by a plasma CVD method.

Next, a mask was formed over the insulating film 121 and the insulating film 123 by a photolithography process, part of the insulating film 121 and part of the insulating film 123 were etched to expose part of the pair of electrodes 113a and 113b, and the plugs 127a and 127b illustrated in FIGS. 7A to 7D were formed.

Here, as the plugs 127a and 127b, a 50-nm-thick titanium film, a 300-nm-thick aluminum film, and a 5-nm-thick titanium film were stacked by a sputtering method.

Through the above steps, the transistor was fabricated. Note that the transistor was designed to have a channel length of 0.8 μm and a channel width of 0.8 μm.

<Fabrication Method of Sample C2>

A transistor in Sample C2 was fabricated in a manner similar to that of the transistor in Sample C1 except that heat treatment after the formation of the oxide semiconductor film 109 was performed at 550° C. In other words, for Sample C2, the heat treatment was performed at a temperature higher than the formation temperature of the insulating film 104.

<Measurement Results of Electrical Characteristics>

Next, the electrical characteristics of the transistors were measured. First, the electrical characteristics before a stress test (hereinafter referred to as initial characteristics) were measured. The characteristics measured here were the $V_g$-$I_d$ characteristics, namely, a source-drain current (hereinafter referred to as a drain current) that changed when a source-gate voltage (hereinafter referred to as a gate voltage) changed from −3 V to +3 V at a source-drain voltage (hereinafter referred to as a drain voltage) of 0.1 V or 1.8 V.

Next, a stress test, a BT stress test here, was performed on the transistor.

The +GBT stress test was carried out under the conditions where the voltage ($V_g$) of the gate electrode 119 was +3.3 V; the voltage ($V_d$) of the electrode 113c was 0 V; the voltage (Vs) of the electrode 113d was 0 V; the voltage ($V_{bg}$) of the gate electrode 103 was 0 V; the substrate temperature was 150° C.; and the stress time was 1 hour. Then, the $V_g$-$I_d$ characteristics of the transistors were measured.

The −GBT stress test was carried out under the conditions where the voltage ($V_g$) of the gate electrode 119 was −1.8 V; the voltage ($V_d$) of the electrode 113c was 0 V; the voltage (Vs) of the electrode 113d was 0 V; the voltage ($V_{bg}$) of the gate electrode 103 was 0 V; the substrate temperature was 85° C.; and the stress time was 1 hour. Then, the $V_g$-$I_d$ characteristics of the transistors were measured.

The threshold voltage and the shift value in this specification will be described. The threshold voltage ($V_{th}$) is defined as, in the $V_g$-$I_d$ curve where the horizontal axis represents gate voltage ($V_g$ [V]) and the vertical axis represents the square root of drain current ($I_d^{1/2}$ [$A^{1/2}$]), a gate voltage at the intersection point of the line of $I_d^{1/2}=0$ ($V_g$ axis) and the tangent to the curve at a point where the slope of the curve is the steepest. Note that here, the threshold voltage is calculated with a drain voltage $V_d$ of 1.8 V.

Furthermore, the shift value (Shift) in this specification is defined as, in the $V_g$-$I_d$ curve where the horizontal axis represents the gate voltage ($V_g$ [V]) and the vertical axis represents the logarithm of the drain current ($I_d$ [A]), a gate voltage at the intersection point of the line of/d=1.0×10$^{-12}$ [A] and the tangent to the curve at a point where the slope of the curve is the steepest. Note that here, the shift value is calculated with a drain voltage $V_d$ of 1.8 V.

FIG. 40 shows the measurement results of the $V_g$-$I_d$ characteristics of the transistor in Sample C1 between before and after the +GBT stress test and between before and after the −GBT stress test. FIG. 41 shows the results of the +GBT stress test and the −GBT stress test on Sample C2.

In FIG. 40 and FIG. 41, the horizontal axis represents the voltage of the gate electrode 119 and the vertical axis represents the drain current. The initial characteristics are denoted by the dashed lines and the $V_g$-$I_d$ characteristics after the stress tests are denoted by the solid lines.

FIG. 40 indicates that the transistor in Sample C1 has normally-off characteristics. FIG. 40 also shows a small amount of change in the threshold voltage and the shift value between before and after the +GBT stress test and the −GBT stress test.

In contrast, FIG. 41 shows that the transistor in Sample C2 has a large amount of change in the threshold voltage between before and after the +GBT stress test, though it has normally-off characteristics.

Figure 42A:
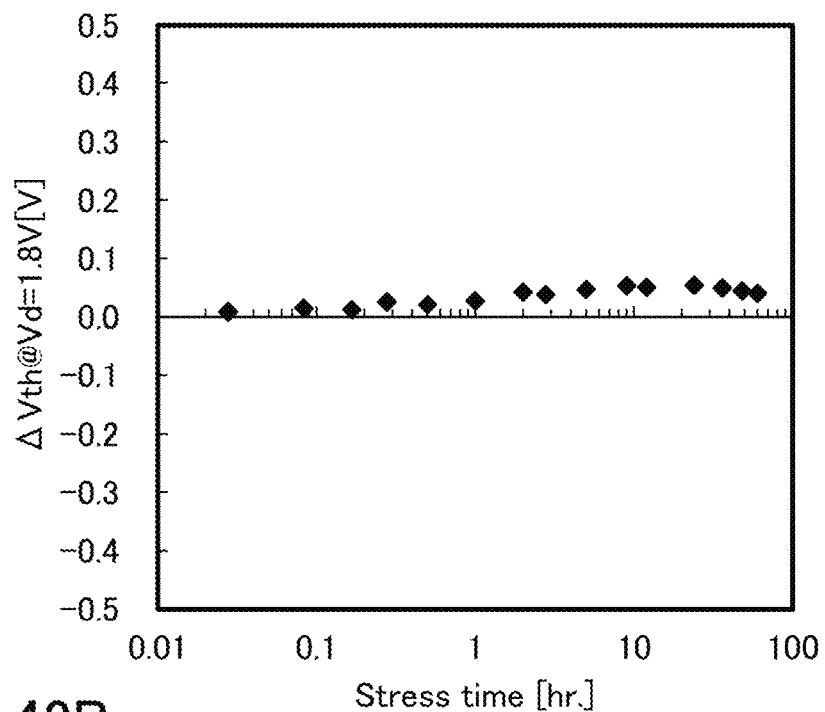
FIGS. 42A and 42B show the relationship between stress time and each of the amount of change in threshold voltage and the amount of change in shift value.
Figure 42B:
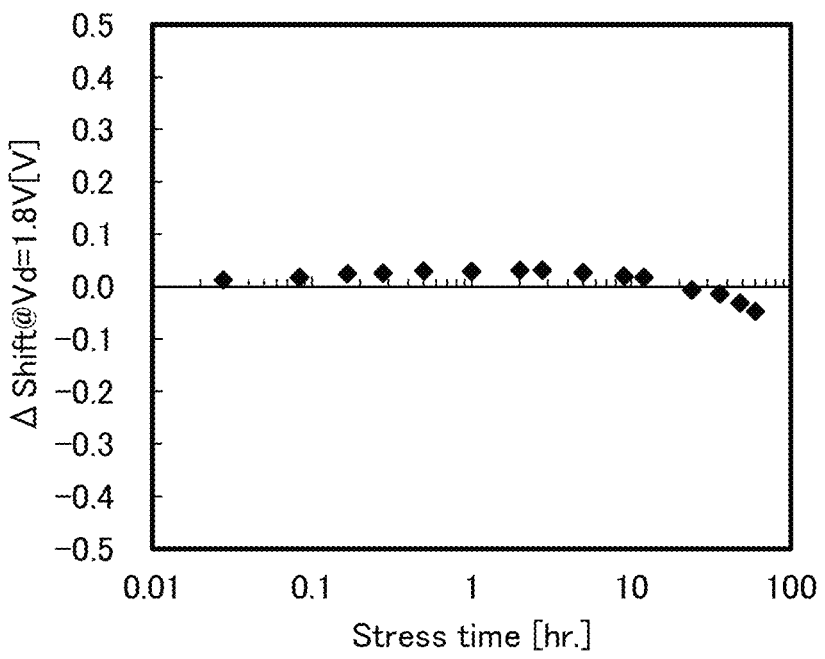

Next, the time stress was applied to Sample C1 was extended to 60 hours. FIGS. 42A and 42B show the amount of change in the threshold voltage (ΔVth) and the shift value (ΔShift) between before and after the +GBT stress test.

The transistor included in Sample C1 has a small change in the threshold voltage and the shift value even after the long hours of +GBT stress test; typically, greater than or equal to −0.1 V and less than or equal to 0.1 V. This suggests that high-temperature deposition of the silicon oxide film, which serves as a base film of the oxide semiconductor film, and addition of oxygen to the oxide semiconductor film lead to a small variation in the electrical characteristics of the transistor.

The variation in the electrical characteristics of the transistor can also be reduced when the silicon oxide film serving as a base film of the oxide semiconductor film is formed at a temperature higher than that of heat treatment performed on the oxide semiconductor film and oxygen is added to the oxide semiconductor film.

Example 3 shows that high-temperature formation of the silicon oxide film, which serves as a base film of the oxide semiconductor film, allows reducing the nitrogen concentration of the silicon oxide film. Furthermore, even when heat treatment is performed after oxygen is added to the oxide semiconductor film over the silicon oxide film serving as a base film, generation of NO and an increase in defects in the silicon oxide film can be suppressed.

The silicon oxide film formed at a high temperature has a decreased nitrogen concentration. Hence, even when oxygen is added to the silicon oxide film serving as a base film of the oxide semiconductor film by addition of oxygen to the oxide semiconductor film, a nitrogen-oxygen bond is unlikely to occur in the silicon oxide film. Accordingly, electron traps due to $NO_x$ are not easily generated in a back channel of the transistor, reducing the amount of change in the threshold voltage of the transistor due to the GBT stress test.

Example 4 shows that a large amount of water is released from the silicon oxide film serving as a base film of the oxide semiconductor film when heat treatment is performed at 550° C. as compared with the case where heat treatment is performed at 450° C. The amount of released water also tends to increase when heat treatment is performed at a temperature higher than the formation temperature of the silicon oxide film. These results suggest that when the oxide semiconductor film is heated at 550° C., water might be diffused from the silicon oxide film into the oxide semiconductor film or might be generated in the silicon oxide film. It is also suggested that when the oxide semiconductor film is heated at a temperature higher than the formation temperature of the silicon oxide film, water might be diffused from the silicon oxide film into the oxide semiconductor film or might be generated in the silicon oxide film.

In Sample C1 of this example, heat treatment is performed at a temperature lower than the formation temperature of the silicon oxide film serving as a base film of the oxide semiconductor film. Furthermore, the transistor in Sample C1 has a small amount of change in the threshold voltage due to the GBT stress test. These results indicate that when the oxide semiconductor film is heated at a temperature lower than the formation temperature of the silicon oxide film serving as a base film of the oxide semiconductor film, electron traps caused by water are not generated easily and the amount of change in the threshold voltage of the transistor due to the GBT stress test can be reduced.

EXPLANATION OF REFERENCE

11: oxide semiconductor film, 17: oxide semiconductor film, 100: transistor, 100a: transistor, 100b: transistor, 100c: transistor, 100d: transistor, 100e: transistor, 100f: transistor, 100g: transistor, 100h: transistor, 100j: transistor, 101: substrate, 103: gate electrode, 104: insulating film, 105: gate insulating film, 106: oxide semiconductor film, 106a: oxide semiconductor film, 106b: oxide semiconductor film, 107: oxide semiconductor film, 108: oxygen, 109: oxide semiconductor film, 109a: oxide semiconductor film, 110: oxide semiconductor film, 110a: oxide semiconductor film, 111: oxide semiconductor film, 111a: oxide semiconductor film, 111b: oxide semiconductor film, 111c: oxide semiconductor film, 111e: impurity region, 111f: impurity region, 112: conductive film, 113: conductive film, 113a: electrode, 113b: electrode, 113c: electrode, 113d: electrode, 113g: electrode, 113h: electrode, 114: oxide semiconductor film, 114a: oxide semiconductor film, 114b: oxide semiconductor film, 115: oxide semiconductor film, 115a: oxide semiconductor film, 115b: oxide semiconductor film, 115c: oxide semiconductor film, 115d: oxide semiconductor film, 115e: oxide semiconductor film, 116: insulating film, 116a: insulating film, 116b: insulating film, 117: gate insulating film, 117a: gate insulating film, 117b: gate insulating film, 119: gate electrode, 119a: gate electrode, 121: insulating film, 123: insulating film, 125a: opening, 125b: opening, 127a: plug, 127b: plug, 133a: low-resistance region, 133b: low-resistance region, 134: Cu—X alloy film, 135: covering film, 136: conductive film, 137: Cu—X alloy film, 138: covering film, 200: transistor, 203: conductive film, 204: conductive film, 205: insulating film, 206: insulating film, 215: insulating film, 216: plug, 230: capacitor, 301: quartz substrate, 303: silicon oxide film, 305: IGZO film, 305a: IGZO film, 305b: IGZO film, 306: oxygen atomic ions, 307: IGZO film, 307a: IGZO film, 311: silicon wafer, 312: silicon oxide film, 313: silicon oxide film, 313a: silicon oxide film, 313b: silicon oxide film, 315: IGZO film, 315a: IGZO film, 316: oxygen atomic ions, 317: IGZO film, 317a: IGZO film, 321: silicon wafer, 322: silicon oxide film, 323: silicon oxide film, 324: IGZO film, 325: IGZO film, 325a: IGZO film, 325b: IGZO film, 326: oxygen atomic ions, 327: IGZO film, 327a: IGZO film, 700: substrate, 701: pixel portion, 702: scan line driver circuit, 703: scan line driver circuit, 704: signal line driver circuit, 710: capacitor wiring, 712: gate wiring, 713: gate wiring, 714: drain electrode, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 750: transistor, 751: gate electrode, 752: gate insulating film, 753: channel formation region, 754: p-type impurity region, 755: p-type impurity region, 756: sidewall insulating film, 760: memory cell, 770: transistor, 789: element separation region, 790: insulating film, 791: insulating film, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for a refrigerator, 933: door for a freezer, 941: housing, 942: housing, 943: display portion, 944: operation key, 945: lens, 946: joint, 951: car body, 952: wheels, 953: dashboard, 954: light, 5100: pellet, 5120: substrate, 5161: region, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, 8011: battery.

This application is based on Japanese Patent Application serial No. 2014-107570 filed with Japan Patent Office on May 23, 2014, the entire contents of which are hereby incorporated by reference.

The invention claimed is:

1. A method for manufacturing a semiconductor device comprising the steps of:
    forming a gate electrode over a substrate;
    forming a first insulating film over the gate electrode while heating the substrate;
    forming a first oxide semiconductor film over the first insulating film;
    forming a second oxide semiconductor film over the first oxide semiconductor film;
    performing a first heat treatment after forming the second oxide semiconductor film;
    etching part of the first insulating film, part of the first oxide semiconductor film, and part of the second oxide semiconductor film, whereby forming a first gate insulating film having a projection, an etched first oxide semiconductor film, and an etched second oxide semiconductor film; and
    forming a pair of electrodes over the etched second oxide semiconductor film,
    wherein a temperature of the first heat treatment is lower than a temperature at which the first insulating film is formed.

2. The method according to claim 1, further comprising the step of adding oxygen to the first oxide semiconductor film after forming the first oxide semiconductor film,
    wherein the oxygen is added to the first oxide semiconductor film by an ion implantation method, an ion doping method, or a plasma treatment.

3. The method according to claim 1, further comprising the step of forming a third oxide semiconductor film over the pair of electrodes,
    wherein after the formation of the third oxide semiconductor film, oxygen is added to the third oxide semiconductor film, and then a second heat treatment is performed.

4. The method according to claim 1, wherein a temperature of the first heat treatment is higher than or equal to 250° C. and lower than the strain point of the substrate.

5. The method according to claim 1, wherein a temperature at which the first insulating film is formed is higher than or equal to 450° C. and lower than the strain point of the substrate.

6. The method according to claim 1, wherein each of the first oxide semiconductor film and the second oxide semiconductor film contains In.

7. A method for manufacturing a semiconductor device comprising the steps of:
    forming a gate electrode over a substrate;
    forming a first insulating film over the gate electrode while heating the substrate;
    forming a first oxide semiconductor film over the first insulating film;
    forming a second oxide semiconductor film over the first oxide semiconductor film;
    performing a first heat treatment after forming the second oxide semiconductor film;
    forming a conductive film over the second oxide semiconductor film after performing the first heat treatment;
    etching part of the first insulating film, part of the first oxide semiconductor film, part of the second oxide semiconductor film, and part of the conductive film, whereby forming a first gate insulating film having a projection, an etched first oxide semiconductor film, an etched second oxide semiconductor film, and an etched conductive film; and
    forming a pair of electrodes over the etched conductive film,
    wherein a temperature of the first heat treatment is lower than a temperature at which the first insulating film is formed.

8. The method according to claim 7, further comprising the step of adding oxygen to the first oxide semiconductor film after forming the first oxide semiconductor film,
    wherein the oxygen is added to the first oxide semiconductor film by an ion implantation method, an ion doping method, or a plasma treatment.

9. The method according to claim 7, further comprising the step of forming a third oxide semiconductor film over the pair of electrodes,
    wherein after the formation of the third oxide semiconductor film, oxygen is added to the third oxide semiconductor film, and then a second heat treatment is performed.

10. The method according to claim 7, wherein a temperature of the first heat treatment is higher than or equal to 250° C. and lower than the strain point of the substrate.

11. The method according to claim 7, wherein a temperature at which the first insulating film is formed is higher than or equal to 450° C. and lower than the strain point of the substrate.

12. The method according to claim 7, wherein each of the first oxide semiconductor film and the second oxide semiconductor film contains In.

13. A method for manufacturing a semiconductor device comprising the steps of:
   forming a first gate electrode over a substrate;
   forming a first insulating film in contact with the first gate electrode while heating the substrate;
   forming a first oxide semiconductor film in contact with the first insulating film;
   adding oxygen to the first oxide semiconductor film;
   forming a second oxide semiconductor film in contact with the first oxide semiconductor film after adding the oxygen to the first oxide semiconductor film;
   performing a first heat treatment after forming the second oxide semiconductor film;
   etching part of the first insulating film, part of the first oxide semiconductor film, and part of the second oxide semiconductor film, whereby forming a first gate insulating film having a projection, an etched first oxide semiconductor film, and an etched second oxide semiconductor film;
   forming a pair of electrodes in contact with the etched second oxide semiconductor film; and
   forming a third oxide semiconductor film in contact with the etched second oxide semiconductor film and the pair of electrodes.

14. The method for manufacturing the semiconductor device according to claim 13, wherein the oxygen is added to the first oxide semiconductor film by an ion implantation method, an ion doping method, or a plasma treatment.

15. The method for manufacturing the semiconductor device according to claim 13, wherein after the formation of the third oxide semiconductor film, oxygen is added to the third oxide semiconductor film, and then a second heat treatment is performed.

16. The method for manufacturing the semiconductor device according to claim 15, wherein a temperature of the second heat treatment is lower than a temperature at which the first insulating film is formed.

17. The method for manufacturing the semiconductor device according to claim 13, wherein a temperature of the first heat treatment is lower than a temperature at which the first insulating film is formed.

18. The method for manufacturing the semiconductor device according to claim 13, wherein each of the first oxide semiconductor film, the second oxide semiconductor film, and the third oxide semiconductor film contains In or Ga.

19. The method for manufacturing the semiconductor device according to claim 13, wherein an energy level at a conduction band minimum of each of the first and third oxide semiconductor films is closer to a vacuum level than that of the second oxide semiconductor film is.

* * * * *